United States Patent
Ono

(10) Patent No.: US 9,079,424 B2
(45) Date of Patent: Jul. 14, 2015

(54) LIGHT EMITTING PART, PRINT HEAD, AND IMAGE FORMING APPARATUS

(71) Applicant: FUJI XEROX CO., LTD., Tokyo (JP)

(72) Inventor: Seiji Ono, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/280,210

(22) Filed: May 16, 2014

(65) Prior Publication Data

US 2015/0097911 A1  Apr. 9, 2015

(30) Foreign Application Priority Data

Oct. 9, 2013  (JP) .................................. 2013-212289

(51) Int. Cl.
 B41J 2/385 (2006.01)
 B41J 2/45 (2006.01)
 H01L 27/15 (2006.01)

(52) U.S. Cl.
 CPC *B41J 2/45* (2013.01); *H01L 27/153* (2013.01)

(58) Field of Classification Search
 USPC .................. 347/118, 128, 130, 141, 237, 238
 See application file for complete search history.

(56) References Cited

U.S. PATENT DOCUMENTS

| 6,180,960 | B1 * | 1/2001 | Kusuda et al. | 257/99 |
| 6,717,182 | B1 * | 4/2004 | Tagami et al. | 257/83 |
| 8,134,178 | B2 * | 3/2012 | Ohno | 257/157 |
| 2007/0210328 | A1 * | 9/2007 | Sheu | 257/107 |
| 2010/0118100 | A1 * | 5/2010 | Ohno | 347/130 |
| 2011/0193924 | A1 * | 8/2011 | Nagumo | 347/118 |
| 2014/0320577 | A1 * | 10/2014 | Ohno | 347/130 |
| 2014/0320579 | A1 * | 10/2014 | Ohno | 347/141 |

FOREIGN PATENT DOCUMENTS

JP  B2-4196586  12/2008

* cited by examiner

*Primary Examiner* — Kristal Feggins
(74) *Attorney, Agent, or Firm* — Oliff PLC

(57) ABSTRACT

A light emitting part includes plural light emitting thyristors that each have an anode and a cathode and that are lit in the on state; a light-on signal line that is connected with the cathodes or the anodes of the plural light emitting thyristors and that supplies current, the current which causes the plural light emitting thyristors to be lit; and a diversion thyristor that has an anode and a cathode, the anode or the cathode which is connected with the light-on signal line, and that diverts current, the current which flows to a light emitting thyristor to be lit among the plural light emitting thyristors in the on state. A potential of the light-on signal line may be set so that the diversion thyristor and at least one light emitting thyristor among the plural light emitting thyristors become the on state in parallel.

10 Claims, 15 Drawing Sheets

FIG. 5

LIGHT EMITTING PART, PRINT HEAD, AND IMAGE FORMING APPARATUS

CROSS-REFERENCE TO RELATED APPLICATIONS

This application is based on and claims priority under 35 USC 119 from Japanese Patent Application No. 2013-212289 filed Oct. 9, 2013.

BACKGROUND

Technical Field

The present invention relates to a light emitting part, a print head, and an image forming apparatus.

SUMMARY

A light emitting part according to an aspect of the invention includes plural light emitting thyristors that each have an anode and a cathode and that are lit in the on state; a light-on signal line that is connected with the cathodes or the anodes of the plural light emitting thyristors and that supplies current, the current which causes the plural light emitting thyristors to be lit; and a diversion thyristor that has an anode and a cathode, the anode or the cathode which is connected with the light-on signal line, and that diverts current, the current which flows to a light emitting thyristor to be lit among the plural light emitting thyristors in the on state. A potential of the light-on signal line may be set so that the diversion thyristor and at least one light emitting thyristor among the plural light emitting thyristors become the on state in parallel.

BRIEF DESCRIPTION OF THE DRAWINGS

Exemplary embodiments of the present invention will be described in detail based on the following figures, wherein:

FIG. 5 is an equivalent circuit diagram explaining a circuit configuration of a light emitting chip with a self-scanning light emitting device (SLED) array mounted to which the first exemplary embodiment is applied;

DETAILED DESCRIPTION

An image forming apparatus such as a printer, a copier, or a facsimile, employing an electrophotographic system, executes image formation by irradiating an electrically charged photoconductor member with light with a predetermined wavelength by an optical recording unit in accordance with image information to obtain an electrostatic latent image, then adding a toner to the electrostatic latent image to make the electrostatic latent image visible as a toner image, and transferring and fixing the toner image on and to a recording sheet. As the optical recording unit, in recent years, in addition to an optical scanning system that uses a laser, provides scanning with laser light in a main-scanning direction, and provides exposure to the laser light, there is employed a recording device using a LED print head (LPH), in which plural light emitting diodes (LEDs) are arranged in the main-scanning direction as light emitting elements and serve as a light emitting element array, to meet the demand on reduction in size of the apparatus.

Also, in a light emitting chip, on which a self-scanning light emitting device (SLED) array is mounted, the SLED having plural light emitting elements provided in a row form on a substrate, light-on control being successively executed on the light emitting elements, light emitting thyristors are used as the light emitting elements.

Exemplary embodiments of the invention are described in detail below with reference to the attached drawings.

First Exemplary Embodiment

Image Forming Apparatus 1

Figure 1:
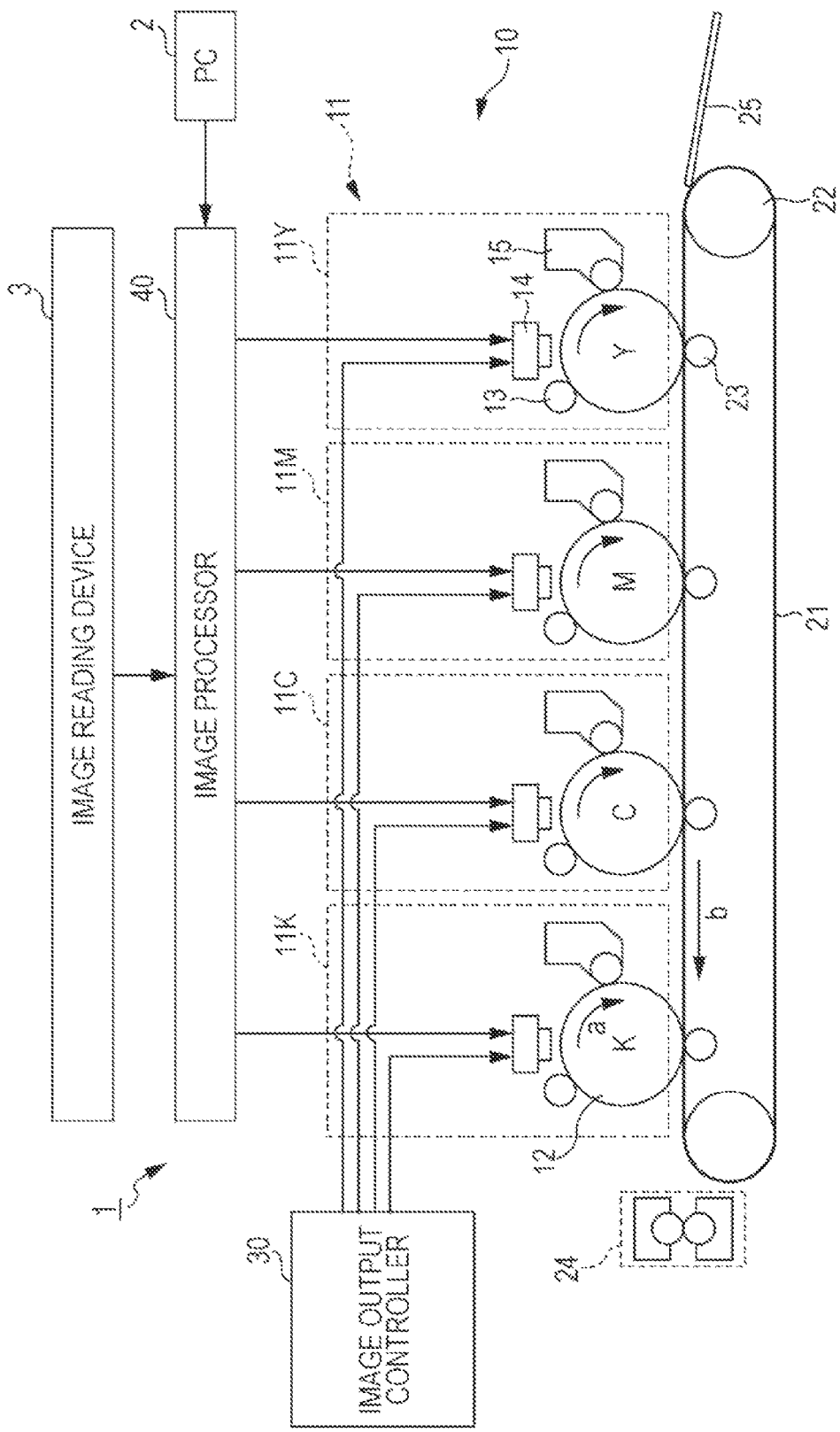
FIG. 1 is an illustration showing an example of a general configuration of an image forming apparatus to which a first exemplary embodiment is applied.

FIG. 1 is an illustration showing an example of a general configuration of an image forming apparatus 1 to which a first exemplary embodiment is applied. The image forming apparatus 1 shown in FIG. 1 is an image forming apparatus typically called tandem type. The image forming apparatus 1 includes an image forming process unit 10 that executes image formation in accordance with image data of each color, an image output controller 30 that controls the image forming process unit 10, and an image processor 40 that is connected with, for example, a personal computer (PC) 2 or an image reading device 3 and provides predetermined image processing on image data received from the PC 2 or the image reading device 3.

The image forming process unit 10 includes an image forming unit 11 having plural engines arranged in parallel at predetermined intervals. The image forming unit 11 includes four image forming units 11Y, 11M, 11C, and 11K. Each of the image forming units 11Y, 11M, 11C, and 11K includes a photoconductor drum 12 as an example of an image holding member that forms an electrostatic latent image and holds a toner image, a charging section 13 as an example of a charging unit that charges the surface of the photoconductor drum 12 with a predetermined potential, a print head 14 as an example of an exposure unit that exposes the photoconductor drum 12 electrically charged by the charging section 13, to light, and a developing section 15 as an example of a developing unit that develops the electrostatic latent image obtained by the print head 14. The image forming units 11Y, 11M, 11C, and 11K form toner images of yellow (Y), magenta (M), cyan (C), and black (K), respectively.

Also, to transfer the toner images of the respective colors formed by the photoconductor drums 12 of the image forming units 11Y, 11M, 11C, and 11K on a recording sheet 25 as an example of a transfer-target material in a superposed manner, the image forming process unit 10 includes a sheet transport belt 21 that transports the recording sheet 25, a driving roller 22 being a roller that drives the sheet transport belt 21, transfer rollers 23 that serve as an example of a transfer unit and transfer the toner images of the photoconductor drums 12 on the recording sheet 25, and a fixing unit 24 that fixes the toner images to the recording sheet 25.

In the image forming apparatus 1, the image forming process unit 10 executes an image forming operation in accordance with various control signals supplied from the image output controller 30. The image processor 40 provides image processing on the image data received from the PC 2 or the image reading device 3 under control by the image output controller 30. The processed image data is supplied to the image forming unit 11. For example, in the image forming unit 11K of black (K) color, the photoconductor drum 12 is charged with the predetermined potential by the charging section 13 while rotating in an arrow a direction. The photoconductor drum 12 is exposed to light by the print head 14 that emits light based on the image data supplied from the image processor 40. Accordingly, an electrostatic latent image relating to the black (K) color image is formed on the photoconductor drum 12. Then, the electrostatic latent image formed on the photoconductor drum 12 is developed by the developing section 15. A toner image of black (K) color is formed on the photoconductor drum 12. Toner images of the respective colors of yellow (Y), magenta (M), and cyan (C) are similarly formed in the image forming units 11Y, 11M, and 11C.

The toner images of the respective colors on the photoconductor drums 12 formed by the image forming units 11 are successively electrostatically transferred on the recording sheet 25 supplied by movement of the sheet transport belt 21, which moves in an arrow b direction, because of a transfer electric field applied to the transfer rollers 23. A composite toner image, in which the respective color toners are superposed, is formed on the recording sheet 25.

Then, the recording sheet 25 having the composite toner image electrostatically transferred thereon is transported to the fixing unit 24. The composite toner image on the recording sheet 25 is transported to the fixing unit 24, receives fixing processing with heat and pressure by the fixing unit 24, and is fixed to the recording sheet 25. The recording sheet 25 after fixing is output from the image forming apparatus 1.

Print Head 14

Figure 2:
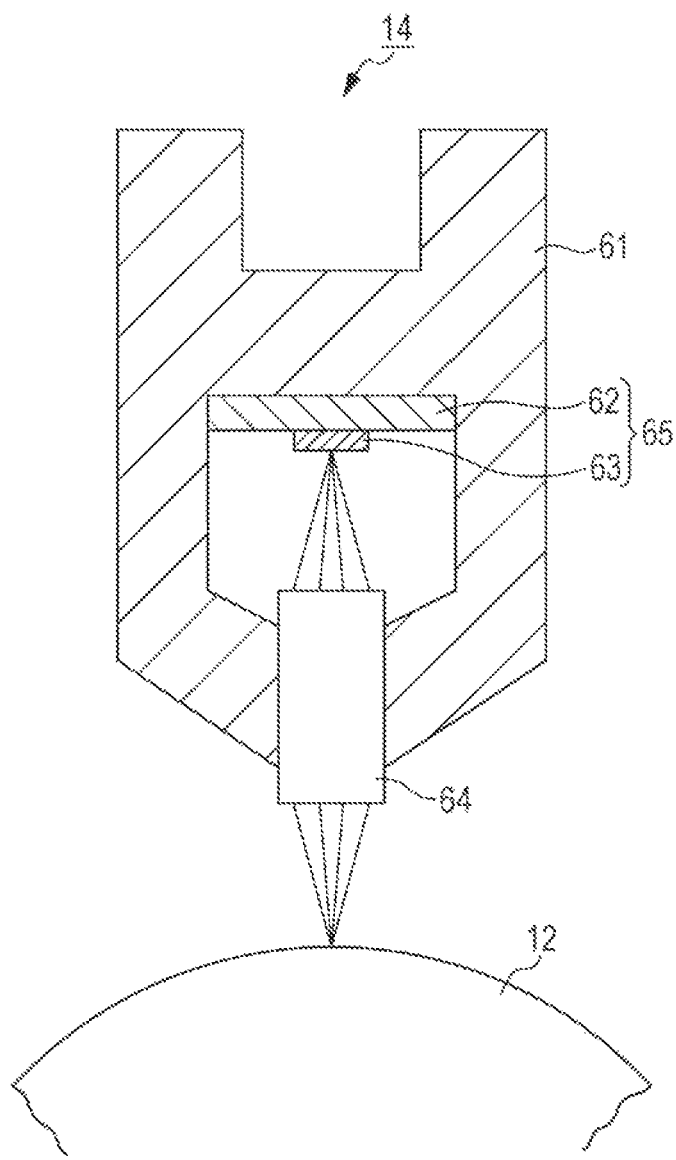
FIG. 2 is a cross-sectional view showing a configuration of a print head.

FIG. 2 is a cross-sectional view showing a configuration of the print head 14. The print head 14 includes a housing 61, a light emitting device 65 as an example of a light emitting unit, and a rod-lens array 64 as an example of an optical unit. The light emitting device 65 includes a light source unit 63 having plural light emitting elements that expose the corresponding photoconductor drum 12 to light (in the first exemplary embodiment, light emitting thyristors). The rod-lens array 64 forms an image of light emitted from the light source unit 63 on the surface of the photoconductor drum 12.

The light emitting device 65 includes the above-described light source unit 63, and a circuit board 62 having a signal generating circuit 110 as a signal generating section (see FIG. 3, described later) etc. mounted thereon. The signal generating circuit 110 drives the light source unit 63.

The housing 61 is made of, for example, metal. The housing 61 supports the circuit board 62 and the rod-lens array 64, and is set so that light emitting surfaces of the light emitting elements of the light source unit 63 serve as a focal plane of the rod-lens array 64. Also, the rod-lens array 64 is arranged along the axial direction of the photoconductor drum 12 (i.e., main-scanning direction, or X direction in FIGS. 3 and 4B, described later).

Light Emitting Device 65

Figure 3:
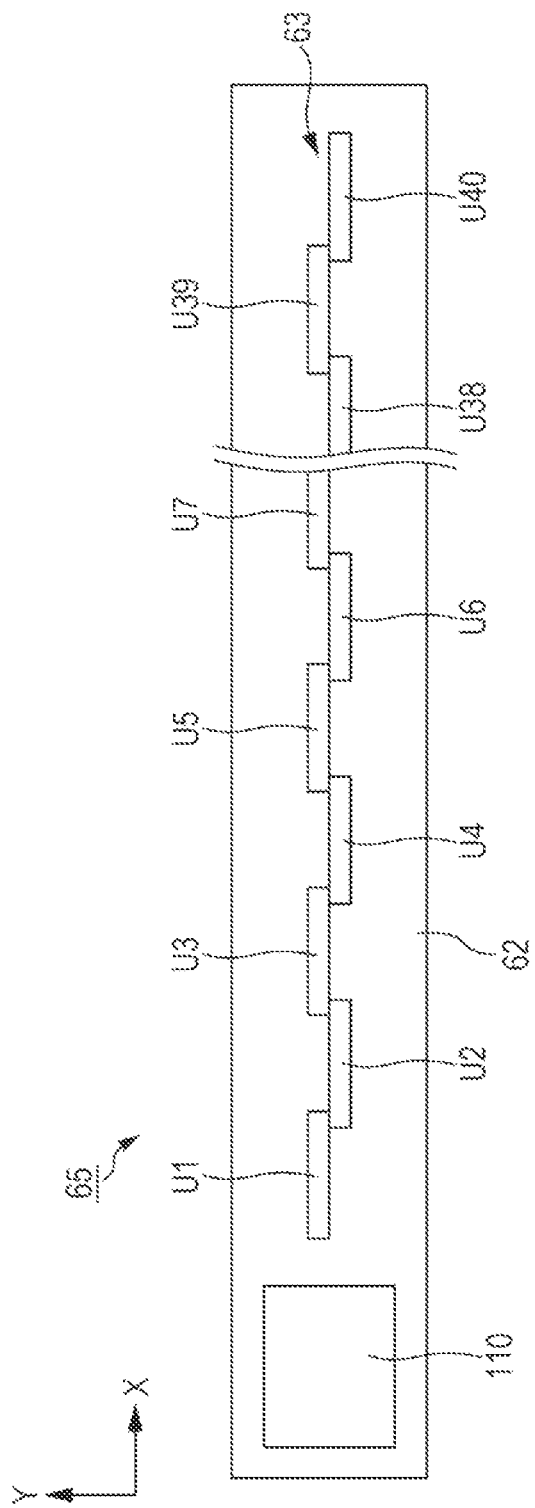
FIG. 3 is a top view of a light emitting device to which the first exemplary embodiment is applied.

FIG. 3 is a top view of the light emitting device 65 to which the first exemplary embodiment is applied.

In the light emitting device 65 shown as an example in FIG. 3, the light source unit 63 includes 40 light emitting chips U1-U40, as an example of a light emitting part, arranged on the circuit board 62 in a staggered manner of two rows in the X direction, which is the main-scanning direction.

In this specification, hyphen "-" represents plural components distinguished from each other by reference signs, and components with reference signs written before and after "-" and components with reference signs between the written reference signs are included. For example, the light emitting chips U1-U40 include light emitting chips from a light emitting chip U1 to a light emitting chip U40 in the order of the numbers.

The light emitting chips U1-U40 may have the same configuration. Therefore, the light emitting chips U1-U40 are called light emitting chip(s) U unless otherwise distinguished from each other.

In the first exemplary embodiment, the number of light emitting chips U is 40 in total; however, the number is not limited to 40.

Also, the light emitting device 65 includes the signal generating circuit 110 that drives the light source unit 63. The signal generating circuit 110 is formed of, for example, an integrated circuit (IC) and other part. Alternatively, the light emitting device 65 may not include the signal generating circuit 110. In this case, the signal generating circuit 110 is provided outside the light emitting device 65, and supplies a control signal for controlling the light emitting chips U1-U40 and other signal to the light emitting device 65 through a cable or other member. Herein, description is given on the assumption that the light emitting device 65 includes the signal generating circuit 110.

The array of the light emitting chips U1-U40 is described later in detail.

Figure 4A:
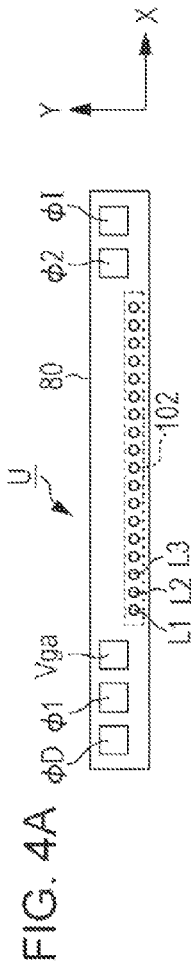
FIGS. 4A and 4B illustrate a configuration of light emitting chips, a configuration of a signal generating circuit of the light emitting device, and a configuration of wiring (lines) on a circuit board to which the first exemplary embodiment is applied.
Figure 4B:
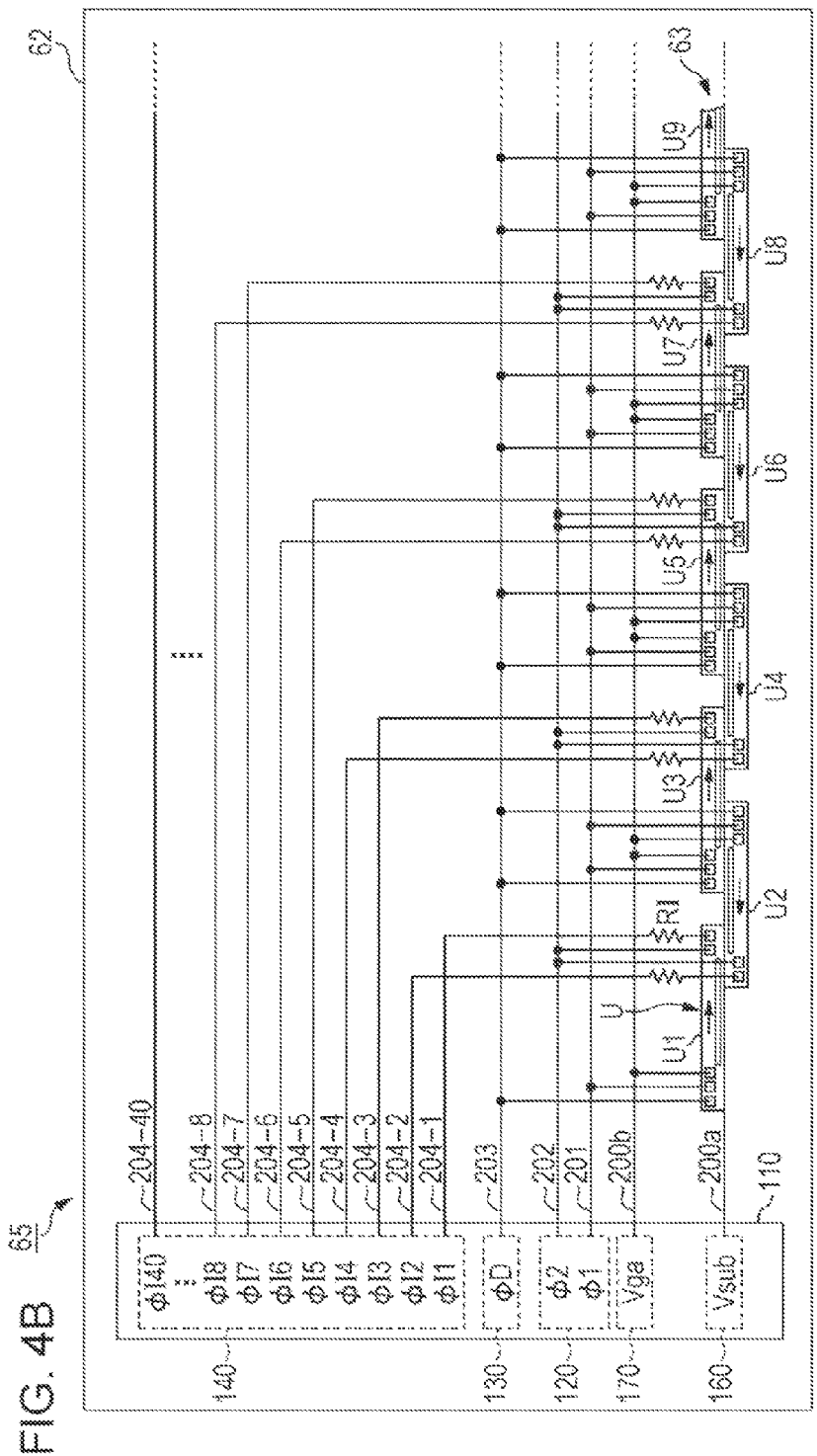

FIGS. 4A and 4B illustrate a configuration of a light emitting chip U, a configuration of the signal generating circuit 110 of the light emitting device 65, and a configuration of wiring (lines) on the circuit board 62 to which the first exemplary embodiment is applied. FIG. 4A shows the configuration of the light emitting chip U. FIG. 4B shows the configuration of the signal generating circuit 110 of the light emitting device 65, and the configuration of wiring (lines) on the circuit board 62.

First, the configuration of the light emitting chip U shown in FIG. 4A is described.

The light emitting chip U includes a light emitting section 102 having plural light emitting elements (in the first exemplary embodiment, light emitting thyristors L1, L2, L3, . . . ) provided in a row form along the long side in one long-side portion on the front surface of a substrate 80, which has a rectangular front-surface shape. Further, the light emitting chip U includes terminals (φ1 terminal, φ2 terminal, Vga terminal, φI terminal, φD terminal) serving as plural bonding pads that acquire various control signals and other signals, at both end portions in the long-side direction of the front surface of the substrate 80. The terminals are provided in the order of the φD terminal, φ1 terminal, and Vga terminal from one end of the substrate 80, and in the order of the φI terminal and φ2 terminal from the other end of the substrate 80. The light emitting section 102 is provided between the Vga terminal and the φ2 terminal. Further, a back-surface electrode as a Vsub terminal is provided on the back surface of the substrate 80.

The "row form" is not limited to a form in which plural light emitting elements are arranged in a straight line as shown in FIG. 4A, and also includes a form in which plural light emitting elements are arranged with different displacement amounts in a direction orthogonal to the row direction. For example, if light emitting surfaces of light emitting elements serve as pixels, the light emitting elements may be arranged with displacement amounts by several pixels or several tens of pixels in the direction orthogonal to the row direction. Alternatively, individual adjacent light emitting elements may be alternately arranged, or plural light emitting elements may be arranged in a zigzag form by the unit of certain number of light emitting elements.

Next, the configuration of the signal generating circuit 110 of the light emitting device 65 and the configuration of wiring (lines) on the circuit board 62 are described with reference to FIG. 4B.

As described above, the signal generating circuit 110 and the light emitting chips U1-U40 are mounted on the circuit board 62 of the light emitting device 65, and wiring (lines) for connection between the signal generating circuit 110 and the light emitting chips U1-U40 is provided.

First, the configuration of the signal generating circuit 110 is described.

The signal generating circuit 110 receives image data after image processing and various control signals from the image output controller 30 and the image processor 40 (see FIG. 1). The signal generating circuit 110, for example, sorts the image data and corrects the light quantity, based on the image data and the various control signals.

The signal generating circuit 110 includes a transfer signal generating unit 120 that transmits a first transfer signal φ1 and a second transfer signal φ2 to the light emitting chips U1-U40 based on the various control signals. The signal generating circuit 110 also includes a diversion signal generating unit 130 that transmits a diversion signal φD which controls a diversion thyristor DT (described later).

The signal generating circuit 110 also includes a light-on signal generating unit 140 that transmits light-on signals φI1-φI40 to the light emitting chips U1-U40, respectively, based on the various control signals. The light-on signals φI1-φI40 are expressed as light-on signal(s) φI unless otherwise distinguished from each other.

The signal generating circuit 110 further includes a reference potential supply unit 160 that supplies a reference potential Vsub serving as a reference of a potential to the light emitting chips U1-U40, and a power potential supply unit 170 that supplies a driving power to the light emitting chips U1-U40 by giving a power potential Vga to the light emitting chips U1-U40.

Next, the array of the light emitting chips U1-U40 is described.

The odd-numbered light emitting chips U1, U3, U5, . . . are arranged in a row at intervals in the long-side direction of the substrate 80. The even-numbered light emitting chips U2, U4, U6, . . . are also arranged in a row at intervals in the long-side direction of the substrate 80. The odd-numbered light emitting chips U1, U3, U5, . . . and the even-numbered light emitting chips U2, U4, U6, . . . are arranged in a staggered manner and in a manner rotated by 180° so that the long sides near the light emitting units 102 on the light emitting chips U of the odd-numbered light emitting chips U1, U3, U5, . . . face those of the even-numbered light emitting chips U2, U4, U6, . . . . Also, the light emitting elements are arranged at predetermined intervals in the main-scanning direction (X direction) even in an area between the light emitting chips U. In each of the light emitting chips U1, U2, U3, . . . in FIG. 4B, the direction of arrangement of the light emitting elements in the light emitting section 102 (in the first exemplary embodiment, in the order of the numbers of the light emitting thyristors L1, L2, L3, . . . ) shown in FIG. 4A is indicated by an arrow.

The wiring (lines) for connection between the signal generating circuit 110 and the light emitting chips U1-U40 is described.

The circuit board 62 has a power line 200a that is connected with the back-surface electrodes as the Vsub terminals provided on the back surfaces of the substrates 80 of the light emitting chips U, and supplies the reference potential Vsub to the Vsub terminals.

The circuit board 62 also has a power line 200b that is connected with the Vga terminals provided on the light emitting chips U and supplies the power potential Vga for driving to the Vga terminals.

The circuit board 62 further has a first transfer signal line 201 that transmits the first transfer signal φ1 to the φ1 terminals of the light emitting chips U1-U40, and a second transfer signal line 202 that transmits the second transfer signal φ2 to the φ2 terminals of the light emitting chips U1-U40, from the transfer signal generating unit 120 of the signal generating circuit 110.

The circuit board 62 further has a diversion signal line 203 that transmits the diversion signal φD to φD terminals of the light emitting chips U1-U40 from the diversion signal generating unit 130 of the signal generating circuit 110.

The circuit board 62 further has light-on signal lines 204-1 to 204-40 that transmit the light-on signals φI1-φI40 to the φI terminals of the light emitting chips U1-U40 through current limiting resistances RI, respectively, from the light-on signal generating unit 140 of the signal generating circuit 110.

The reference potential Vsub and the power potential Vga are commonly supplied to all light emitting chips U1-U40 on the circuit board 62. The first transfer signal φ1 and the second transfer signal φ2 are also commonly (parallelly) transmitted to the light emitting chips U1-U40. Further, the diversion signal φD is commonly (parallelly) transmitted to the light emitting chips U1-U40.

In contrast, the light-on signals φI1-φI40 are individually transmitted to the light emitting chips U1-U40, respectively.

If the light emitting device 65 does not include the signal generating circuit 110, the power lines 200a and 200b, the first transfer signal line 201, a second transfer signal line 202, the diversion signal line 203, and the light-on signal lines 204-1 to 204-40 on the circuit board 62 are connected with connectors or other members provided instead of the signal generating circuit 110. Then, these signal lines are connected with the signal generating circuit 110 provided outside the circuit board 62 through cables connected with the connectors or other members.

Light Emitting Chip U

Figure 5:
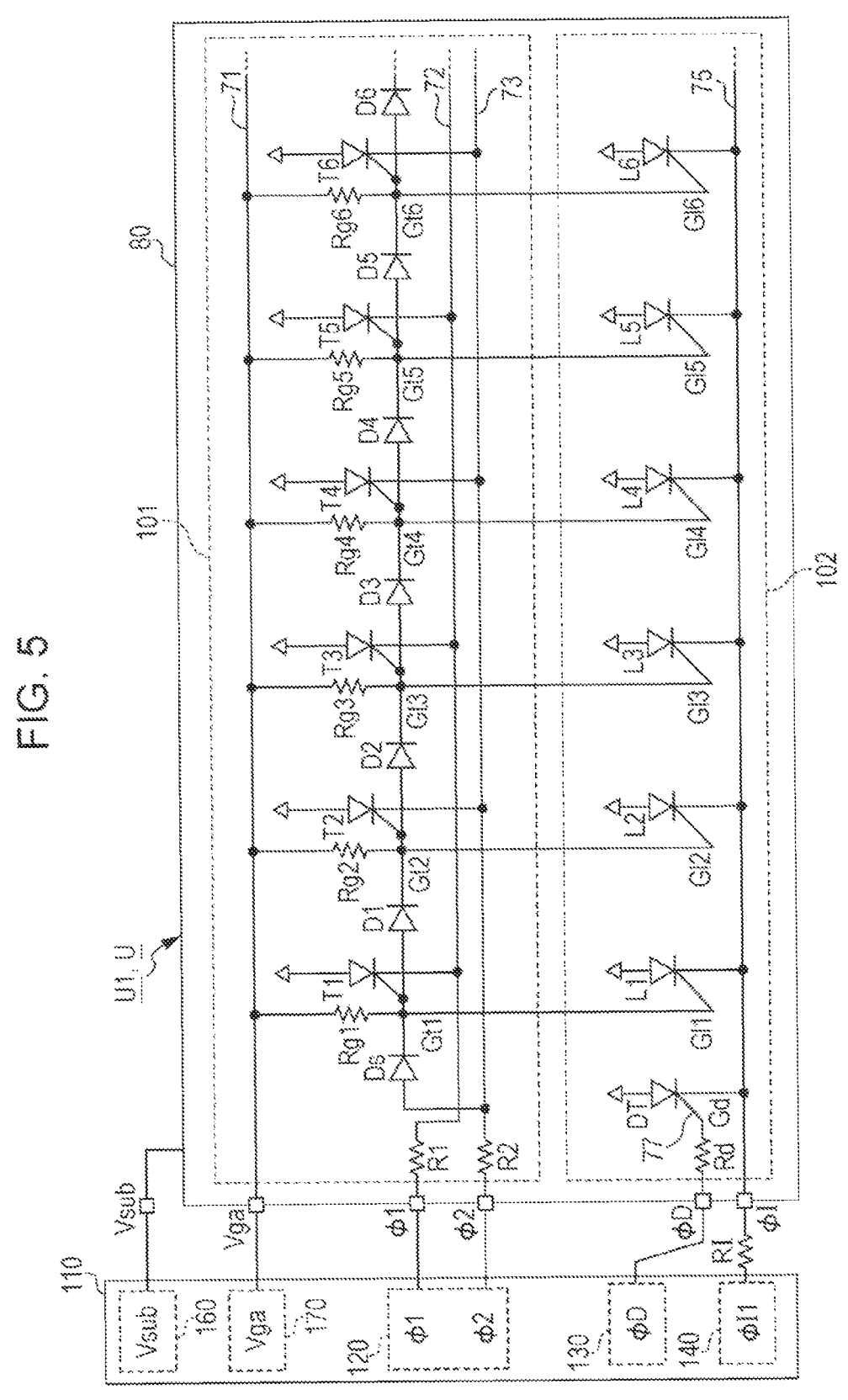

FIG. 5 is an equivalent circuit diagram explaining a circuit configuration of a light emitting chip U with a self-scanning light emitting device (SLED) array mounted to which the first exemplary embodiment is applied. The positions of the terminals (φ1 terminal, φ2 terminal, Vga terminal, φI terminal, φD terminal) are illustrated at the left end of the drawing for convenience of the description although the positions are different from those in FIG. 4A. Also, the Vsub terminal provided on the back surface of the substrate 80 is illustrated while being led outside the substrate 80.

Herein, the light emitting chip U1 is described as the light emitting chip U in relation to the signal generating circuit 110. Hence, the light emitting chip U is expressed as light emitting chip U1(U) in the following description, and illustrated as U1, U in FIG. 5. The configurations of the other light emitting chips U2-U40 are the same as the configuration of the light emitting chip U1.

The light emitting chip U1(U) has the light emitting thyristor row including light emitting thyristors L1, L2, L3, . . . arranged in a row form on the substrate 80 as described above.

The light emitting chip U1(U) has a transfer thyristor row including transfer thyristors T1, T2, T3, . . . , as an example of transfer elements, arranged in a row form similarly to the light emitting thyristor row.

The transfer thyristors T1, T2, T3, . . . form pairs each including two of the transfer thyristors T1, T2, T3, . . . in the order of the numbers. The light emitting chip U1(U) includes coupling diodes D1, D2, D3, . . . each being arranged between the corresponding pair.

The light emitting chip U1(U) includes resistances Rg1, Rg2, Rg3, . . . .

Further, the light emitting chip U1(U) includes current limiting resistances R1 and R2 that prevent excessive current from flowing to a first transfer signal line 72 to which the first transfer signal φ1 is transmitted, and a second transfer signal line 73 to which the second transfer signal φ2 is transmitted (described later).

Further, the light emitting chip U1(U) includes a start diode Ds, a diversion thyristor DT, and a current limiting resistance Rd that prevents excessive current from flowing to the diversion thyristor DT.

The light emitting thyristors L1, L2, L3, . . . in the light emitting thyristor row, and the transfer thyristors T1, T2, T3, . . . in the transfer thyristor row are arranged in the order of the numbers from the left side in FIG. 5.

Further, the coupling diodes D1, D2, D3, . . . and the resistances Rg1, Rg2, Rg3, . . . are also arranged in the order of the numbers from the left side of the drawing.

The light emitting thyristor row and the transfer thyristor row are arranged in the order of the transfer thyristor row and the light emitting thyristor row from the upper side in FIG. 5.

Herein, the light emitting thyristors L1, L2, L3, . . . , the transfer thyristors T1, T2, T3, . . . , the coupling diodes D1, D2, D3, . . . , and the resistances Rg1, Rg2, Rg3, . . . are expressed as light emitting thyristor(s) L, transfer thyristor(s) T, coupling diode(s) D, and resistance(s) Rg unless otherwise distinguished from each other.

The number of light emitting thyristors L in the light emitting thyristor row may be a predetermined number. In the first exemplary embodiment, if the number of light emitting thyristors L is, for example, 128, the number of transfer thyristors T is also 128. Similarly, the number of resistances Rg is 128. However, the number of coupling diodes D is 127, which is smaller than the number of transfer thyristors T by one.

Alternatively, the number of transfer thyristors T may be larger than the number of light emitting thyristors L.

FIG. 5 shows a portion around the light emitting thyristors L1-L6, and the transfer thyristors T1-T6.

The thyristors (light emitting thyristors L, transfer thyristors T, diversion thyristors DT) are each a semiconductor element having a gate, an anode, and a cathode.

That is, if each thyristor is formed of a laminated semiconductor in which a p-type first semiconductor layer, an n-type second semiconductor layer, a p-type third conductive layer, and an n-type fourth semiconductor layer are successively stacked on the substrate 80, the p-type first semiconductor layer forms an anode, the p-type third semiconductor layer forms a first gate, and the n-type fourth semiconductor layer forms a cathode. Alternatively, the p-type first semiconductor layer may also serve as the substrate 80.

The coupling diodes D and the start diode Ds are each a semiconductor element having an anode and a cathode. The coupling diodes D and the start diode Ds are also each formed of the above-descried laminated semiconductor. The p-type third semiconductor layer forms an anode and the n-type fourth semiconductor layer forms a cathode.

Then, it is assumed that the substrate 80 and the laminated semiconductor are each formed of GaAs, GaAlAs, or the like.

Next, electric connection of respective elements in the light emitting chip U1(U) is described.

The anodes of the transfer thyristors T, the light emitting thyristors L, and the diversion thyristor DT are the p-type first semiconductor layer, and are connected with the substrate 80 of the light emitting chip U1(U) (anode common).

The anodes are connected with the power line 200a (see FIG. 4B) through the Vsub terminal provided on the back surface of the substrate 80. The reference potential Vsub is supplied to the power line 200a from the reference potential supply unit 160.

The cathodes of the odd-numbered (odd-number-th) transfer thyristors T1, T3, . . . are connected with the first transfer signal line 72 along the transfer thyristor row. The first transfer signal line 72 is connected with the φ1 terminal through the current limiting resistance R1. The φ1 terminal is connected with the first transfer signal line 201 (see FIG. 4B), and the first transfer signal φ1 is transmitted to the φ1 terminal.

The cathodes of the even-numbered (even-number-th) transfer thyristors T2, T4, . . . are connected with the second transfer signal line 73 along the transfer thyristor row. The second transfer signal line 73 is connected with the φ2 terminal through the current limiting resistance R2. The φ2 terminal is connected with the second transfer signal line 202 (see FIG. 4B), and the second transfer signal φ2 is transmitted to the φ2 terminal.

The cathodes of the light emitting thyristors L are connected with a light-on signal line 75. The light-on signal line 75 is connected with the φI terminal. In the light emitting chip U1, the φI terminal is connected with the light-on signal line 204-1 through the current limiting resistance RI, and the light-on signal φI1 is transmitted from the light-on signal generating unit 140 to the φI terminal. The light-on signal φI1i supplies current which turns on the light emitting thyristors L1, L2, L3 . . . . The φI terminals of the other light emitting chips U2-U40 are connected with the light-on signal lines 204-2 to 204-40 through the current limiting resistances RI, respectively, and the light-on signals φI2-φI40 are transmitted to the φI terminals.

Alternatively, each current limiting resistance RI may be included in the corresponding light emitting chip U.

Gates Gt1, Gt2, Gt3, ... of the transfer thyristors T1, T2, T3 ... are connected with gates Gl1, Gl2, Gl3, ... of the corresponding-number light emitting thyristors L1, L2, L3, ... by one-to-one correspondence. Hence, the gates Gt1, Gt2, Gt3, ... have electrically the same potentials as those of the corresponding-number gates Gl1, Gl2, Gl3, .... Hence, the situation having the same potential is expressed by, for example, gate Gt1 (gate Gl1).

Herein, the gates Gt1, Gt2, Gt3 ... are expressed as gates Gt, and the gates Gl1, Gl2, Gl3 ... are expressed as gate(s) Gl, unless otherwise distinguished from each other. Also, the situation having the same potential is expressed by, for example, gate Gt (gate Gl).

The gates Gt1, Gt2, Gt3 ... of the transfer thyristors T1, T2, T3 ... form pairs each including two gates in the order of the numbers, and each of the coupling diodes D1, D2, D3 ... is connected between the corresponding pair of gates Gt. That is, the coupling diodes D1, D2, D3 ... are connected in series so that each of the coupling diodes D1, D2, D3 ... is arranged between the corresponding pair of gates Gt1, Gt2, Gt3 ... in the order of the numbers. The coupling diode D1 is connected in a direction so that current flows from the gate Gt1 to the gate Gt2. The other coupling diodes D2, D3, D4 ... are configured similarly to the coupling diode D1.

The gates Gt (gates GL) of the transfer thyristors T are connected with a power line 71 through the resistances Rg provided respectively for the transfer thyristors T. The power line 71 is connected with the Vga terminal. The Vga terminal is connected with the power line 200b (see FIG. 4B) and the power potential Vga is supplied from the power potential supply unit 170 to the Vga terminal.

The gate Gt1 of the transfer thyristor T1 at one end side of the transfer thyristor row is connected with the cathode terminal of the start diode Ds. The anode terminal of the start diode Ds is connected with the second transfer signal line 73.

The cathode of the diversion thyristor DT is connected with the light-on signal line 75. A gate Gd of the diversion thyristor DT is connected with a diversion signal line 77. The diversion signal line 77 is connected with the φD terminal through the current limiting resistance Rd. The φD terminal is connected with the diversion signal line 203 (see FIG. 4B), and the diversion signal φD is transmitted from the diversion signal generating unit 130 to the φD terminal.

In FIG. 5, a portion including the transfer thyristors T, the coupling diodes D, the resistances Rg, the start diode Ds, and the current limiting resistances R1 and R2 of the light emitting chip U1(U) is expressed as transfer section 101. Also, a portion including the light emitting thyristors L, the diversion thyristor DT, and the current limiting resistance Rd corresponds to the light emitting section 102.

Operation of Thyristor

First, basic operations of the thyristors (transfer thyristors T, light emitting thyristors L, diversion thyristor DT) are described.

The thyristors are each a semiconductor element including three terminals of an anode, a cathode, and a gate, as described above.

In the following description, the reference potential Vsub, which is supplied to the back-surface electrode serving as the Vsub terminal of the substrate 80, is expressed as 0 V as a high-level potential (hereinafter, referred to as "H" (0 V) or "H"), and the power potential Vga, which is supplied to the Vga terminal, is expressed as −3.3 V as a low-level potential (hereinafter, referred to as "L" (−3.3 V) or "L").

The light emitting device 65 (see FIG. 3) is driven by a negative potential.

The anode of each thyristor has the reference potential Vsub ("H" (0 V)) which is supplied to the Vsub terminal.

It is assumed that the laminated semiconductor forming the thyristor is formed of GaAs, GaAlAs, or the like, and a forward potential (diffusion potential) Vd of pn junction between a p-type semiconductor layer and an n-type semiconductor layer is, for example, 1.5 V.

The amount of current flowing between the anode and the cathode of the thyristor in the off state is smaller than the amount of current in the on state. If a potential lower than a threshold voltage (negative potential having a larger absolute value than the threshold voltage) is applied to the cathode of the thyristor in the off state, the thyristor is shifted to the on state (turned on). Herein, the threshold voltage of the thyristor is a value obtained by subtracting the diffusion potential Vd (1.5 V) from the potential of the gate. If the thyristor is turned on, the thyristor becomes the on state in which the amount of current flowing between the anode and the cathode is larger than the amount of current in the off state.

The thyristor is formed by combining a pnp transistor and an npn transistor. In the thyristor in the on state, both the pnp transistor and the npn transistor are in the on state. The potential of the gate of the thyristor in the on state becomes a saturation voltage obtained if the pnp transistor forming the thyristor is in the on state. Herein, it is assumed that the saturation voltage is −0.2 V.

Also, the cathode of the thyristor in the on state has a potential close to the diffusion potential Vd.

After the thyristor is turned on once, the thyristor is shifted to the off state (turned off) if the potential of the cathode becomes a higher potential (negative value having a smaller absolute value than a sustaining voltage, 0 V, or a positive value) than a potential required to hold the on state (sustaining voltage). For example, if the cathode terminal becomes "H" (0 V), "H" (0 V) has a higher potential than the sustaining voltage, and the potential of the cathode and the potential of the anode become the same. Hence, the thyristor is turned off.

In contrast, in the thyristor in the on state, the sustaining voltage is continuously applied to the cathode, and the on state is held if current (sustaining current), which may hold the on state, is supplied to the thyristor.

The light emitting thyristor L is lit (emits light) when turned on, and is unlit (does not emit light) when turned off. The light quantity per unit time of each light emitting thyristor L in the on state is determined by the area of a region emitting light, and the amount of current flowing between the cathode and the anode.

The transfer thyristor T and the diversion thyristor DT may emit light; however, the light of the transfer thyristor T and the diversion thyristor DT is blocked to prevent the photoconductor drum 12 from being exposed to light.

Herein, the potentials of the cathodes of the transfer thyristors T, the light emitting thyristors L, and the diversion thyristor DT are described.

The odd-numbered transfer thyristors T in FIG. 5 become the on state if the first transfer signal φ1 of "L" (−3.3 V) is transmitted to the φ1 terminal (described later). Hence, the potential of the cathodes of the odd-numbered transfer thyristors T in the on state is determined by the potential of the φ1 terminal ("L" (−3.3 V)), internal resistances rt of the transfer thyristors T in the on state, the diffusion potential Vd, and the current limiting resistance R1.

Similarly, the even-numbered transfer thyristors T become the on state if the second transfer signal φ2 of "L" (−3.3 V) is transmitted to the φ2 terminal (described later). Hence, the potential of the cathodes of the even-numbered transfer thyristors T in the on state is determined by the potential of the φ2 terminal ("L" (−3.3 V)), the internal resistances rt of the transfer thyristors T in the on state, the diffusion potential Vd, and the current limiting resistance R2.

Herein, for example, it is assumed that the internal resistances rt of the transfer thyristors T in the on state are each 60 Ω, and the current limiting resistances R1 and R2 are each 300 Ω. Then, the cathodes of the transfer thyristors T in the on state become −1.8 V. The cathodes of the odd-numbered transfer thyristors T are connected with the first transfer signal line 72. Hence, if the odd-numbered transfer thyristors T are in the on state, the first transfer signal line 72 becomes −1.8 V. Also, the cathodes of the even-numbered transfer thyristors T are connected with the second transfer signal line 73. Hence, if the even-numbered transfer thyristors T are in the on state, the second transfer signal line 73 becomes −1.8 V.

The light emitting thyristors L and the diversion thyristor DT in FIG. 5 become the on state if the light-on signal φI1 of "L" (−3.3 V) is transmitted to the φI terminal (described later). The potential of the cathodes of the light emitting thyristors L in the on state is determined by the potential of the φI terminal ("L" (−3.3 V)), internal resistances rl of the light emitting thyristors L in the on state, the diffusion potential Vd, and the current limiting resistance RI. The potential of the cathode of the diversion thyristor DT in the on state is determined by the potential of the φI terminal ("L" (−3.3 V)), an internal resistance rd of the diversion thyristor DT in the on state, the diffusion potential Vd, and the current limiting resistance RI.

Herein, for example, it is assumed that the internal resistances rl of the light emitting thyristors L in the on state are each 20 Ω, and the current limiting resistance RI is 80 Ω. Then, the cathodes of the light emitting thyristors L in the on state become −1.86 V. At this time, current IL flowing through the light emitting thyristors L in the on state becomes 18 mA on the absolute value basis (i2 of |IL| in FIG. 7, described later). The cathodes of the light emitting thyristors L are connected with the light-on signal line 75. Hence, if the light emitting thyristors L are in the on state, the light-on signal line 75 becomes −1.86 V.

Similarly, if the internal resistance rd of the diversion thyristor DT in the on state is 20 Ω, the cathode of the diversion thyristor DT in the on state becomes −1.86 V. At this time, current ID flowing through the diversion thyristor DT in the on state becomes 18 mA on the absolute value basis. The cathode of the diversion thyristor DT is connected with the light-on signal line 75. Hence, if the diversion thyristor DT is in the on state, the light-on signal line 75 becomes −1.86 V.

In the above description, the case in which only the light emitting thyristors L become the on state and the case in which only the diversion thyristor DT becomes the on state are described.

The cathodes of the light emitting thyristors L and the cathode of the diversion thyristor DT are connected with the light-on signal line 75. If the light emitting thyristors L and the diversion thyristor DT are simultaneously in the on state, current is divided into the light emitting thyristors L and the diversion thyristor DT. Hence, the respective cathodes (light-on signal line 75) each become −1.7 V. At this time, the current IL flowing through the light emitting thyristors L becomes 10 mA on the absolute value basis (i1 of |IL| in FIG. 7, described later), and the current ID flowing through the diversion thyristor DT is also becomes 10 mA on the absolute value basis (i3 of |ID| in FIG. 7, described later).

It is to be noted that the internal resistance rl of each light emitting thyristor L is 20 Ω, which is smaller than the internal resistance rt of 60 Ω of each transfer thyristor T. Since light is acquired from the light emitting thyristors L, the light emitting thyristors L occupy a relatively large area on the substrate 80. In contrast, the transfer thyristors T merely successively transfer the on state, and hence the area of the transfer thyristors T on the substrate 80 does not have to be large.

Owing to this, the internal resistance rt of the transfer thyristor T is larger than the internal resistance rl of the light emitting thyristor L.

Light Quantity Control

In the image forming apparatus 1, the exposure amount by which the photoconductor drum 12 is exposed to light by the light emitting thyristors L of the light emitting chip U has to be adjusted, in accordance with the temperature and humidity in the image forming apparatus 1, the speed of image formation, and the wear state of the photoconductor drum 12.

In the first exemplary embodiment, the exposure amount by which the photoconductor drum 12 is exposed to light by each of the light emitting thyristors L of the light emitting chip U is controlled by a time in which the light emitting thyristor L is in the on state and is lit (light-on period). To increase the exposure amount, the light-on period is increased, and to decrease (reduce) the exposure amount, the light-on period is decreased. The method of controlling the exposure amount using the light-on period may set the exposure amount by changing the time because the exposure amount is proportional to the time. That is, the method of controlling the exposure amount using the light-on period provides easier control as compared with a method of controlling the exposure amount using current flowing to the light emitting thyristor L.

However, in a range corresponding to a short light-on period, the accuracy of setting the light-on period may be decreased, because of a variation in characteristic of the light emitting thyristors L as a result of manufacturing the light emitting chip U, a variation in characteristic of ICs and the like used for the light-on signal generating unit 140 in the signal generating circuit 110, or a variation in impedance from the light-on signal generating unit 140 of the signal generating circuit 110 to the light emitting thyristors L. If the variations are to be controlled by an electronic circuit such as the signal generating circuit 110, the electronic circuit may become complicated and expensive.

Accordingly, it may be desirable to control the light-on period so as not to be too short.

Figure 6:
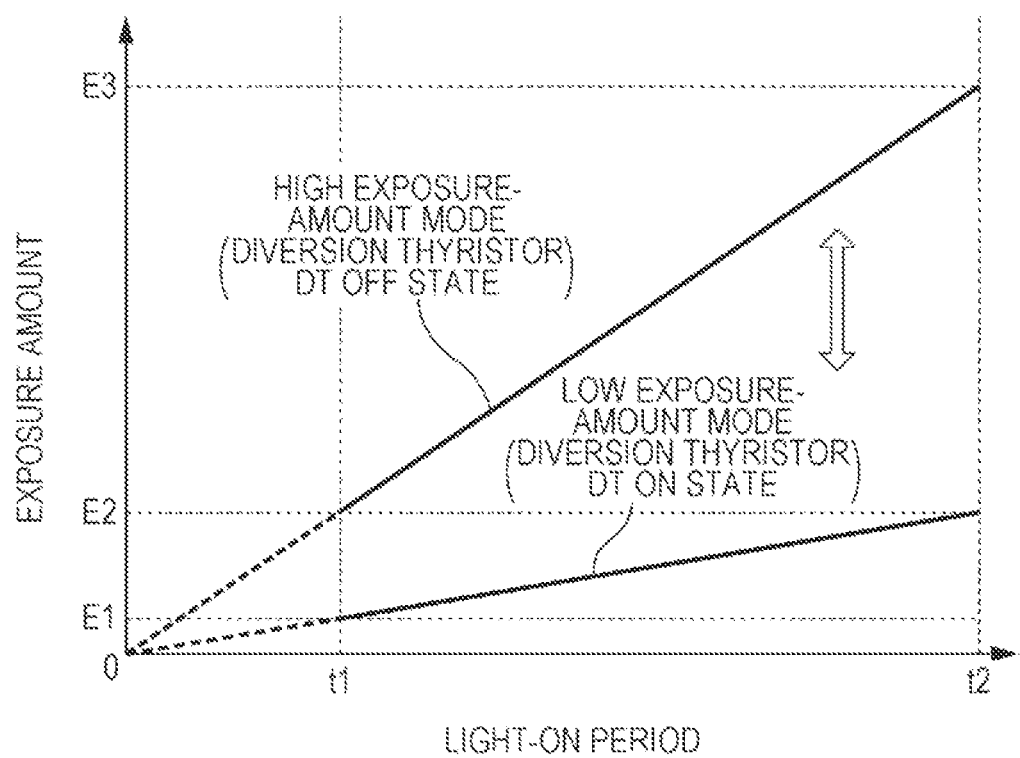
FIG. 6 is an illustration explaining a method of controlling an exposure amount to which the first exemplary embodiment is applied.

FIG. 6 is an illustration explaining the method of controlling the exposure amount to which the first exemplary embodiment is applied. The horizontal axis plots the light-on period, and the vertical axis plots the exposure amount.

This method includes a high exposure-amount mode in which a high exposure amount is obtained and a low exposure-amount mode in which a low exposure amount is obtained as compared with the high exposure-amount mode even in the same light-on period. The high exposure-amount mode and the low exposure-amount mode may be switched (changed) by changing the current flowing to the light emitting thyristor L using the on state and the off state of the diversion thyristor DT.

That is, the light quantity per unit time of the light emitting thyristor L depends on the current flowing to the light emitting thyristor L. Thus, the mode is switched between the high exposure-amount mode and the low exposure-amount mode by changing the current flowing to the light emitting thyristor L.

The exposure amount mode is not set in a light-on period from 0 to t1 because the accuracy of the exposure amount to be obtained is not good even if the mode is set. Hence, in the high exposure-amount mode, the exposure amount may be set in a range from E2 to E3 by setting a light-on period from t1 to t2. However, the exposure amount may not be set in a range from E1 to E2. Therefore, the mode is switched (changed) from the high exposure-amount mode to the low exposure-amount mode, and then the exposure amount is set in the range from E1 to E2.

Accordingly, the exposure amount in the range from E1 to E2 may be set in the light-on period from t1 to t2.

The exposure amount E1 may be set by the current IL flowing to the light emitting thyristors L (described later).

Timing Chart

Figure 7:
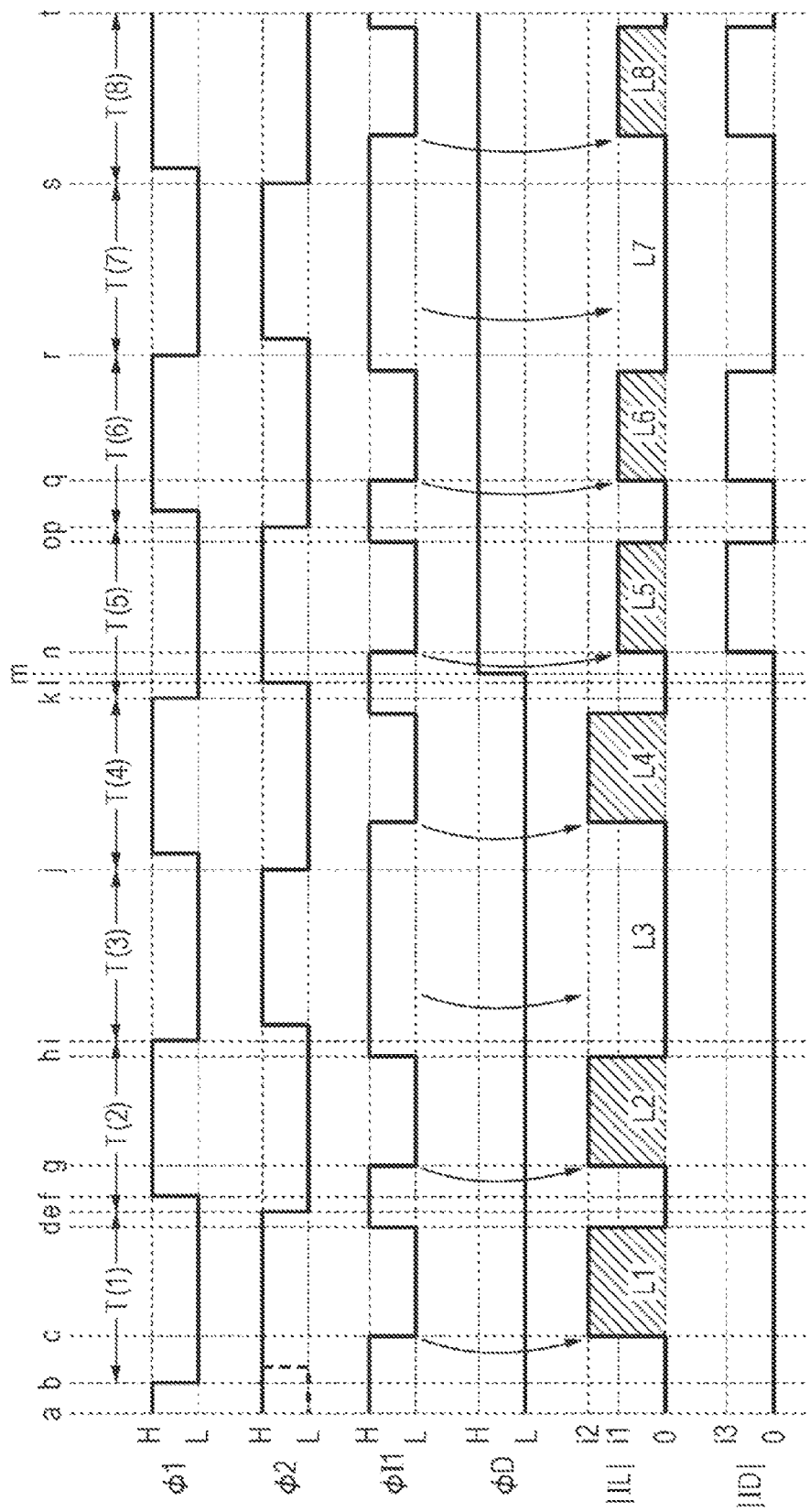
FIG. 7 is a timing chart explaining operations of the light emitting device and the light emitting chip.

FIG. 7 is a timing chart explaining operations of the light emitting device 65 and the light emitting chip U.

FIG. 7 shows a timing chart of a portion in which light-on or light-off of the eight light emitting thyristors L1 to L8 of the light emitting chip U1 is controlled (referred to as light-on control). As described above, since the other light emitting chips U2-U40 are operated in parallel to the light emitting chip U1, the description for the operation of the light emitting chip U1 may be sufficient.

In FIG. 7, the light emitting thyristors L1, L2, L4, L5, L6, and L8 of the light emitting chip U1 are lit, and the light emitting thyristors L3 and L7 are unlit. Also, the light emitting thyristors L1, L2, and L4 are lit in the high exposure-amount mode, and the light emitting thyristors L5, L6, and L8 are lit in the low exposure-amount mode.

In FIG. 7, it is assumed that the time elapses in the order of alphabets from a time a to a time t. The light-on control is made on the light emitting thyristor L1 in a period T(1) from a time b to a time e, the light emitting thyristor L2 in a period T(2) from the time e to a time i, the light emitting thyristor L3 in a period T(3) from the time i to a time j, and the light emitting thyristor L4 in a period T(4) from the time j to a time k. The light-on control is also made on the light emitting thyristor L5 in a period T(5) from the time k to a time p, the light emitting thyristor L6 in a period T(6) from the time p to a time r, the light emitting thyristor L7 in a period T(7) from the time r to a time s, and the light emitting thyristor L8 in a period T(8) from the time s to a time t. Hereinafter, the light emitting thyristors L of the number of 9 and larger are controlled to be lit similarly.

In the first exemplary embodiment, it is assumed that the periods T(1), T(2), T(3) . . . have the same length, and are called period(s) T unless otherwise distinguished from each other.

As long as the relationship among signals (described later) is held, the length of the periods T(1), T(2), T(3) . . . may be variable.

The waveforms of the first transfer signal φ1, the second transfer signal φ2, the light-on signal φI1, and the diversion signal φD are described. The period from the time a to the time b is a period in which the light emitting chip U1 (or any of light emitting chips U2-U40) starts its operation. Signals in this period are described in the description for the operation.

The first transfer signal φ1 which is transmitted to the φ1 terminal (see FIG. 5) and the second transfer signal φ2 which is transmitted to the φ2 terminal (see FIG. 5) are signals having two potentials of "H" (0 V) and "L" (−3.3 V). The first transfer signal φ1 and the second transfer signal φ2 have waveforms in which waveforms of continuous two periods T (for example, period T(1) and period T(2)) are repeated as a unit.

The first transfer signal φ1 is shifted from "H" to "L" at the start time b of the period T(1), and is shifted from "L" to "H" at a time f. Then, the first transfer signal φ1 is shifted from "H" to "L" at the end time i of the period T(2).

The second transfer signal φ2 is "H" at the start time b of the period T(1), and is shifted from "H" to "L" at the time e. Then, at the end time i of the period T(2), the second transfer signal φ2 is held at "L."

Herein, the first transfer signal φ1 is compared with the second transfer signal φ2. The second transfer signal φ2 corresponds to the first transfer signal φ1 when being shifted to the downstream side on the time axis by the period T.

In the first transfer signal φ1, the waveforms in the period T(1) and the period T(2) are repeated in the period T(3) and later. In contrast, in the second transfer signal φ2, the waveform indicated by a broken line in the period T(1) and the waveform in the period T(2) are repeated in the period T(3) and later. The waveform in the period T(1) of the second transfer signal φ2 is different from the waveform in the period T(3) and later because the period T(1) is a period in which the light emitting device 65 starts its operation.

A pair of transfer signals including the first transfer signal φ1 and the second transfer signal φ2 designates the light emitting thyristor L having the same number as the transfer thyristor T in the on state, as a subject of control for light-on or light-off (light-on control) by causing the transfer thyristors T shown in FIG. 5 to be successively in the on state in the order of the numbers.

The light-on signal φI1 that is transmitted to the φI terminal of the light emitting chip U1 is described. The light-on signal φI1 is a signal having two potentials of "H" (0 V) and "L" (−3.3 V). The light-on signals φI2-φI40 are transmitted to the other light emitting chips U2-U40, respectively.

Herein, the light-on signal φI1 in the period T(1) of light-on control for the light emitting thyristor L1 of the light emitting chip U1 is described. In this case, the light emitting thyristor L1 is lit.

The light-on signal φI1 is "H" at the start time b of the period T(1), and is shifted from "H" to "L" at a time c. Then, the light-on signal φI1 is shifted from "L" to "H" at a time d, and is held at "H" at the end time e of the period T(1).

The diversion signal φD that is transmitted to the φD terminal of the light emitting chip U1 is described. The diversion signal φD is a signal having two potentials of "H" (0 V) and "L" (−3.3 V). The diversion signal φD is not a signal that is changed on the period T basis. The diversion signal φD from the period T(1) to the period T(8) is described.

The diversion signal φD is "L" at the start time b of the period T(1), is shifted from "L" to "H" at a time m of the period T(5), and is held at "H" at the end time t of the period T(8). At the time m, the mode is switched from the high exposure-amount mode to the low exposure-amount mode.

The operations of the light emitting device 65 and the light emitting chip U1 are described according to the timing chart in FIG. 7 with reference to FIGS. 4B and 5.

(1) Time a

Light Emitting Device 65

At the time a, the reference potential supply unit 160 of the signal generating circuit 110 of the light emitting device 65 sets the reference potential Vsub at "H" (0 V). The power potential supply unit 170 sets the power potential Vga at "L" (−3.3 V). Then, the power line 200a on the circuit board 62 of the light emitting device 65 is set at "H" of the reference potential Vsub, and the Vsub terminals of the light emitting chips U1-U40 are set at "H" (see FIGS. 4B and 5). Similarly, the power line 200b is set at "L" of the power potential Vga, and the Vga terminals of the light emitting chips U1-U40 are set at "L." Accordingly, the respective power lines 71 of the light emitting chips U1-U40 are set at "L" (see FIGS. 4B and 5).

Also, the transfer signal generating unit 120 of the signal generating circuit 110 sets the first transfer signal φ1 and the second transfer signal φ2 at "H." Then, the first transfer signal line 201 and the second transfer signal line 202 become "H" (see FIG. 4B). Accordingly, the respective φ1 terminals and the respective φ2 terminals of the light emitting chips U1-U40 become "H." The potential of the first transfer signal lines 72 connected with the φ1 terminals through the current limiting resistances R1 also become "H", and the potential of the second transfer signal lines 73 connected with the φ2 terminals through the current limiting resistances R2 also become "H" (see FIG. 5).

Also, the diversion signal generating unit 130 of the signal generating circuit 110 sets the diversion signal φD at "L." Then, the diversion signal line 203 becomes "L" (see FIG. 4B). Accordingly, the respective φD terminals of the light emitting chips U1-U40 become "L." The potential of the diversion signal lines 77 connected with the φD terminals through the current limiting resistances Rd also become "L" (see FIG. 5).

Further, the light-on signal generating unit 140 of the signal generating circuit 110 sets the light-on signals φI1-φI40 at "H." Then, the light-on signal lines 204-1 to 204-40 become "H" (see FIG. 4B). Accordingly, the φI terminals of the light emitting chips U1-U40 become "H" through the current limiting resistances RI, and the light-on signal lines 75 connected with the φI terminals also become "H" (see FIG. 5).

Next, the operation of the light emitting chip U1 is described.

In the description of FIG. 7 and later, the potentials of the respective terminals are changed in a step form; however, the potentials of the respective terminals are gradually changed. Hence, even in the middle of the change in potential, as long as the following conditions are satisfied, a thyristor is turned on or turned off and a change in state is generated.

Light Emitting Chip U1

The anodes of the transfer thyristors T, the light emitting thyristors L, and the diversion thyristor DT are connected with the Vsub terminal, and hence are set at "H."

The cathode terminals of the odd-numbered transfer thyristors T1, T3, T5 . . . are connected with the first transfer signal line 72, and are set at "H." The cathode terminals of the even-numbered transfer thyristors T2, T4, T6 . . . are connected with the second transfer signal line 73, and are set at "H." Accordingly, since the anodes and the cathodes of the transfer thyristors T are "H," the transfer thyristors T are in the off state.

The cathodes of the light emitting thyristors L are connected with the light-on signal line 75 at "H." Accordingly, since the anodes and the cathodes of the light emitting thyristors L are "H," the light emitting thyristors L are in the off state.

Further, the cathode of the diversion thyristor DT is connected with the light-on signal line 75 at "H." Accordingly, since the anode and the cathode of the diversion thyristor DT are "H," the diversion thyristor DT is in the off state.

The gate Gt1 at one end of the transfer thyristor row in FIG. 5 is connected with the cathode of the start diode Ds as described above. The gate Gt1 is connected with the power line 71 of the power potential Vga ("L") through the resistance Rg1. The anode of the start diode Ds is connected with the second transfer signal line 73, and is connected with the φ2 terminal at "H" through the current limiting resistance R2. Hence, the start diode Ds is a forward bias. The potential of the cathode (gate Gt1) of the start diode Ds is set in accordance with the power potential Vga ("L" (−3.3 V)) of the power line 71 connected with the resistance Rg1, the potential of the φ2 terminal ("H" (0 V)), the diffusion potential Vd of the start diode Ds, and the current limiting resistance R2. Herein, it is assumed that the cathode (gate Gt1) of the start diode Ds is −1.7 V.

Also, if the gate Gt1 becomes −1.7 V, since the anode (gate Gt1) of the coupling diode D1 is −1.7 V and the cathode thereof is connected with the power line 71 ("L" (−3.3 V)) through the resistance Rg2, the coupling diode D1 becomes a forward bias. Hence, the potential of the gate Gt2 becomes −3.2 V obtained by subtracting the diffusion potential Vd (1.5 V) from the potential of the gate Gt1 (−1.7 V). However, the state in which the anode of the start diode Ds is connected with the φ2 terminal at "H" through the current limiting resistance R2 does not affect the gate Gt of the number of 3 or larger, and the potentials of the gates Gt are "L" (−3.3 V) of the power line 71.

The potential of the gates Gt of the transfer thyristors T are the same as the potential of the gates Gl of the light emitting thyristors L (gates Gt (gates Gl)). Accordingly, the threshold voltage of the transfer thyristors T and the light emitting thyristors L is a value obtained by subtracting the diffusion potential Vd from the potential of the gates Gt (gate Gl). That is, the threshold voltage of the transfer thyristor T1 and the light emitting thyristor L1 is −3.2 V, the threshold voltage of the transfer thyristor T2 and the light emitting thyristor L2 is −4.7 V, and the threshold voltage of the transfer thyristors T of the number of 3 or larger and the light emitting thyristors L of the number of 3 or larger is −4.8 V.

The gate Gd of the diversion thyristor DT is connected with the diversion signal line 77 of "L" (−3.3 V). Hence, the threshold voltage of the diversion thyristor DT is −4.8 V.

(2) Time b

At the time b shown in FIG. 7, the first transfer signal φ1 is shifted from "H" (0 V) to "L" (−3.3 V). Accordingly, the light emitting device 65 starts its operation.

Then, the first transfer signal line 72 is shifted from "H" to "L" (−3.3 V) through the φ1 terminal and the current limiting resistance R1. Then, the transfer thyristor T1 with the threshold voltage being −3.2 V is turned on. However, since the threshold voltage of the odd-numbered transfer thyristors T of the number of 3 or larger with the cathodes thereof connected with the first transfer signal line 72 is −4.8 V, the transfer thyristor T is not turned on. The even-numbered transfer thyristors T may not turned on because the second transfer signal φ2 is "H" and the second transfer signal line 73 is "H."

If the transfer thyristor T1 is turned on, as described above, the first transfer signal line 72 becomes −1.8 V.

If the transfer thyristor T1 is turned on, the potential of the gate Gt1 becomes −0.2 V. Then, the potential of the gate Gt2 becomes −1.7 V, and the potential of the gate Gt3 becomes −3.2 V. The potential of the gates Gt of the number of 4 or larger is held at "L" (−3.3 V).

Accordingly, the threshold voltage of the light emitting thyristor L1 becomes −1.7 V, the threshold voltage of the transfer thyristor T2 and the light emitting thyristor L2 becomes −3.2 V, and the threshold voltage of the transfer thyristor T3 and the light emitting thyristor L3 becomes −4.7 V. The threshold voltage of the transfer thyristors T and the light emitting thyristors L of the number of 4 or larger is held at −4.8 V.

However, since the first transfer signal line 72 is −1.8 V by the transfer thyristor T1 in the on state, the odd-number transfer thyristors T in the off state are not turned on. Since the second transfer signal line 73 is "H," the even-numbered transfer thyristors T are not turned on. Since the light-on signal line 75 is "H," the light emitting thyristor L or the diversion thyristor DT is not turned off.

Immediately after the time b (herein, a state in which a change in thyristor is generated because of a change in potential of a signal at the time b and then the state becomes a normal state, the same may be applied to the following description), the transfer thyristor T1 is in the on state and the other transfer thyristors T, the light emitting thyristors L, and the diversion thyristor DT are in the off state.

Hereinafter, the thyristor in the on state is described, and the thyristor in the off state is not described.

(3) Time c

At a time c, the light-on signal φI1 is shifted from "H" to "L." Then, the light-on signal line 75 is shifted from "H" to "L" (−3.3 V) through the current limiting resistance RI and the φI terminal. The light emitting thyristor L1 with the threshold voltage being −1.7 V is turned on and lit (emits light). Then, the light-on signal line 75 becomes −1.86 V. Then, the current IL flowing through the light emitting thyristor L1 becomes i2 (18 mA) on the absolute value basis.

The threshold voltage of the light emitting thyristor L2 is −3.2 V. However, since the light emitting thyristor L1 with the threshold voltage as low as −1.7 V on the absolute value basis is turned on first and the light-on signal line 75 is set at −1.86 V, the light emitting thyristor L2 is not turned on.

Since the threshold voltage of the diversion thyristor DT is −4.8 V, the diversion thyristor DT is not turned on, and the current ID flowing through the diversion thyristor DT is 0.

Immediately after the time c, the transfer thyristor T1 is in the on state and the light emitting thyristor L1 is in the on state and is lit.

(4) Time d

At the time d, the light-on signal φI1 is shifted from "L" to "H." Then, the potential of the light-on signal line 75 is shifted from "L" to "H" through the current limiting resistance RI and the φI terminal. Since the anode and the cathode of the light emitting thyristor L1 become "H," the light emitting thyristor L1 is turned off and is unlit. The light-on period of the light emitting thyristor L1 is a period form the time c at which the light-on signal φ1 is shifted from "H" to "L," to the time d at which the light-on signal φI1 is shifted from "L" to "H," i.e., in a period in which the light-on signal φI1 is "L."

Immediately after the time d, the transfer thyristor T1 is in the on state.

(5) Time e

At the time e, the second transfer signal φ2 is shifted from "H" to "L." Herein, the period T(1) for light-on control of the light emitting thyristor L1 is ended, and the period T(2) for light-on control of the light emitting thyristor L2 is started.

Then, the second transfer signal line 73 is shifted from "H" to "L" (−3.3 V) through the φ2 terminal. As described above, since the threshold voltage of the transfer thyristor T2 is −3.2 V, the transfer thyristor T2 is turned on. Accordingly, the second transfer signal line 73 becomes −1.8 V. Further, the potential of the gate Gt2 (gate Gl2) becomes −0.2 V, the potential of the gate Gt3 (gate Gl3) becomes −1.7 V, and the potential of the gate Gt4 (gate Gl4) becomes −3.2 V. The potential of the gates Gt (gates Gl) of the number of 5 or larger is held at "L."

Accordingly, the threshold voltage of the light emitting thyristor L2 becomes −1.7 V, the threshold voltage of the transfer thyristor T3 and the light emitting thyristor L3 becomes −3.2 V, and the threshold voltage of the transfer thyristor T4 and the light emitting thyristor L4 becomes −4.7 V. The threshold voltage of the transfer thyristors T and the light emitting thyristors L of the number of 5 or larger is held at −4.8 V.

Immediately after the time e, the transfer thyristors T1 and T2 are in the on state.

(6) Time f

At the time f, the first transfer signal φ1 is shifted from "L" to "H." Then, the first transfer signal line 72 is shifted from "L" to "H" through the φ1 terminal and the current limiting resistance R1. The anode and the cathode of the transfer thyristor T1 in the on state become "H," and the transfer thyristor T1 is turned off. The potential of the gate Gt1 (gate Gl1) is changed toward the power potential Vga ("L" (−3.3 V)) of the power line 71 through the resistance Rg1. Accordingly, the coupling diode D1 becomes a state in which a potential is applied in a direction in which current does not flow (reverse bias). Hence, the state in which the gate Gt2 (gate Gl2) is −0.2 V does not affect the gate Gt1 (gate Gl1).

That is, the transfer thyristor T having the gate Gt connected by the reverse-biased coupling diode D is not turned on even if the threshold voltage becomes −4.8 V and the first transfer signal φ1 or the second transfer signal φ2 becomes "L" (−3.3 V).

Immediately after the time f, the transfer thyristor T2 is in the on state.

(7) Time g

At a time g, when the light-on signal φI1 is shifted from "H" to "L," the light emitting thyristor L2 is turned on and lit, similarly to the light emitting thyristor L1 at the time c.

Immediately after the time g, the transfer thyristor T2 is in the on state and the light emitting thyristor L2 is in the on state and is lit.

(8) Time h

At a time h, when the light-on signal φI1 is shifted from "L" to "H," the light emitting thyristor L2 is turned off and unlit, similarly to the light emitting thyristor L1 at the time d.

Immediately after the time h, the transfer thyristor T2 is in the on state.

(9) Time i

At the time i, when the first transfer signal φ1 is shifted from "H" to "L," the transfer thyristor T3 with the threshold voltage being −3.2 V is turned on, similarly to the transfer thyristor T1 at the time b.

At the time i, the period T(2) for light-on control of the light emitting thyristor L2 is ended, and the period T(3) for light-on control of the light emitting thyristor L3 is started.

Immediately after the time i, the transfer thyristors T2 and T3 are in the on state.

In the period T(3), the light-on signal φI1 is held at "L." Hence, the light emitting thyristor L3 is not turned on or lit although the threshold voltage is −1.7 V.

(10) Time j

At the time j, when the second transfer signal φ2 is shifted from "H" to "L," the transfer thyristor T4 with the threshold voltage being −3.2 V is turned on, similarly to the transfer thyristor T2 at the time e.

At the time j, the period T(3) for light-on control of the light emitting thyristor L3 is ended, and the period T(4) for light-on control of the light emitting thyristor L4 is started.

Since the period T(4) is similar to the period T(2), the description is omitted.

(11) Time k

At the time k, when the first transfer signal φ1 is shifted from "H" to "L," the transfer thyristor T5 with the threshold voltage being −3.2 V is turned on, similarly to the transfer thyristor T1 at the time b. Accordingly, the threshold voltage of the light emitting thyristor L5 becomes −1.7 V. The threshold voltage of the light emitting thyristor L6 becomes −3.2 V.

At the time k, the period T(4) for light-on control of the light emitting thyristor L4 is ended, and the period T(5) for light-on control of the light emitting thyristor L5 is started.

Immediately after the time k, the transfer thyristors T4 and T5 are in the on state.

(12) Time l

At a time l, when the second transfer signal φ2 is shifted from "L" to "H," the anode and the cathode of the transfer thyristor T4 in the on state become "H" and the transfer thyristor T4 is turned off, similarly to the transfer thyristor T1 at the time f.

Immediately after the time l, the transfer thyristor T5 is in the on state.

(13) Time m

At the time m, the diversion signal φD is shifted from "L" to "H." Then, the potential of the gate Gd of the diversion thyristor DT becomes "H" (0 V) through the φD terminal and the current limiting resistance Rd. Then, the threshold voltage of the diversion thyristor DT becomes −1.5 V.

Immediately after the time m, the transfer thyristor T5 is in the on state.

(14) Time n

At a time n, the light-on signal φI1 is shifted from "H" to "L." Then, the light-on signal line 75 is shifted from "H" to "L" (−3.3 V) through the current limiting resistance RI and the φI terminal. At this time, the diversion thyristor DT with the threshold voltage being −1.5 V is turned on. Accordingly, the light-on signal line 75 becomes −1.86 V.

Then, the light emitting thyristor L5 with the threshold voltage being −1.7 V is also turned on and lit (emits light). That is, the light emitting thyristor L5 and the diversion thyristor DT simultaneously become the on state. Accordingly, the light-on signal line 75 becomes −1.7 V. Then, the current IL flowing through the light emitting thyristor L5 becomes i1 (10 mA) on the absolute value basis, and the current ID flowing through the diversion thyristor DT also becomes i3 (10 mA) on the absolute value basis.

The threshold voltage of the light emitting thyristor L6 is −3.2 V; however, the light-on signal line 75 becomes −1.7 V. Hence, the light emitting thyristor L6 is not turned on.

Immediately after the time n, the transfer thyristor T5 and the diversion thyristor DT are in the on state and the light emitting thyristor L5 is in the on state and is lit.

(15) Time o

At the time o, the light-on signal φI1 is shifted from "L" to "H." Then, the potential of the light-on signal line 75 is shifted from "L" to "H" through the current limiting resistance RI and the φI terminal. Since the anodes and the cathodes of the diversion thyristor DT and the light emitting thyristor L5 become "H," the diversion thyristor DT and the light emitting thyristor L5 are turned off. The light emitting thyristor L5 is unlit.

However, since the diversion signal φD is "H," the gate Gd of the diversion thyristor DT holds "H" and the threshold voltage of the diversion thyristor DT is −1.5 V.

(16) Time p

At the time p, when the second transfer signal φ2 is shifted from "H" to "L," the transfer thyristor T6 with the threshold voltage being −3.2 V is turned on, similarly to the transfer thyristor T2 at the time e.

At the time p, the period T(5) for light-on control of the light emitting thyristor L5 is ended, and the period T(6) for light-on control of the light emitting thyristor L6 is started.

Immediately after the time p, the transfer thyristors T5 and T6 are in the on state.

(17) Time q

At a time q, the light-on signal φI1 is shifted from "H" to "L." Then, the light-on signal line 75 is shifted from "H" to "L" (−3.3 V) through the current limiting resistance RI and the φI terminal. At this time, the diversion thyristor DT with the threshold voltage being −1.5 V and the light emitting thyristor L6 with the threshold voltage being −1.7 V are turned on and the light emitting thyristor L6 is lit, similarly to the time n.

Immediately after the time q, the transfer thyristor T6 and the diversion thyristor DT are in the on state and the light emitting thyristor L6 is in the on state and is lit.

Hereinafter, the above-described operation is repeated.

In the period T(7) for light-on control of the light emitting thyristor L7, the light-on signal φI1 is held at "H." Hence, the light emitting thyristor L7 is not turned on or lit although the threshold voltage is −1.7 V. Similarly, the diversion thyristor DT is not turned on although the threshold voltage is −1.5 V.

As described above, the gates Gt of the transfer thyristors T are connected with each other through the coupling diodes D. Hence, if the potential of a gate Gt is changed, the potential of a gate Gt, which is connected with the gate Gt with the potential changed through the corresponding coupling diode D with the forward bias, is changed. Then, the threshold voltage of a transfer thyristor T, which has a gate terminal with the potential changed, is changed. If the threshold voltage of the transfer thyristor T is −3.2 V, the transfer thyristor T is turned on at a timing at which the first transfer signal φ1 or the second transfer signal φ2 is shifted from "H" to "L" (−3.3 V).

Also, the threshold voltage of a light emitting thyristor L, the gate Gl of which is connected with the gate Gt of the transfer thyristor T in the on state becomes −1.7 V, and the light emitting thyristor L is turned on and lit (emits light) at a timing at which the light-on signal φI is shifted from "H" to "L" (−3.3 V).

That is, since the transfer thyristors T successively become the on state, a light emitting thyristor L, which is a subject of light-on control, is designated, and the light-on signal φI sets the light emitting thyristor L, which is the subject of light-on control, to be lit or unlit.

In this way, since the light-on signal φI is set in accordance with image data, light-on or light-off, and the light-on period of the light emitting thyristor L are controlled.

If the diversion thyristor DT is in the off state, the current IL flowing to the light emitting thyristor L becomes i2 (18 mA) on the absolute value basis, and if the diversion thyristor DT is in the on state, the current IL flowing to the light emitting thyristor L becomes i1 (10 mA) on the absolute value basis. That is, by setting the diversion thyristor DT in the off state, the current flowing to the light emitting thyristor L is increased, and the high exposure-amount mode is provided. Also, by setting the diversion thyristor DT in the on state, the current flowing to the light emitting thyristor L is decreased, and the low exposure-amount mode is provided.

The current IL flowing to the light emitting thyristor L may be set by the internal resistance rl of the light emitting thyristor L in the on state, and the internal resistance rd of the diversion thyristor DT in the on state.

In FIG. 7, the diversion signal φD is shifted from "L" to "H" at the time m in the period T(5). However, the timing at which the diversion signal φD is shifted from "L" to "H" may be in a period after the light-on period of an upstream light emitting thyristor L (at the time m in FIG. 7, the light emitting thyristor L4) is ended and before a downstream light emitting thyristor L (at the time m in FIG. 7, the light emitting thyristor L5) is lit.

In the light-on period of the upstream light emitting thyristor L, since the potential of the light-on signal line 75 is −1.86 V, if the diversion signal φD is shifted from "L" to "H" and the threshold voltage of the diversion thyristor DT is set at −1.5 V, the diversion thyristor DT may be turned on. Also, the current IL of the light emitting thyristor L is decreased. This is not desirable.

In contrast, the timing at which the diversion signal φD is shifted from "H" to "L" to shift the mode from the low exposure-amount mode to the high exposure-amount mode may be in the light-on period of the upstream light emitting thyristor L. This is because, even if the diversion signal φD is shifted from "H" to "L," the diversion thyristor DT holds the on state.

In FIG. 7, in the period T(5), the mode is switched from the high exposure-amount mode to the low exposure-amount mode. However, the high exposure-amount mode or the low exposure-amount mode may be selected before the period T(1) is started, that is, at the time a.

Relationship Between Threshold Voltage of Diversion Thyristor DT and Threshold Voltage of Light Emitting Thyristor L In the low exposure-amount mode, the diversion thyristor DT and the light emitting thyristor L parallely become the on state. Hence, the potential of the light-on signal line 75 when one of the diversion thyristor DT and the light emitting thyristors L becomes the on state has to be lower than the threshold voltage of the other of the diversion thyristor DT and the light emitting thyristor L.

Owing to this, the threshold voltage of the diversion thyristor DT and the threshold voltage of the light emitting thyristor L have to satisfy Expression (1) as follows:

$$\left|\text{threshold voltage of diversion thyristor } DT\right| > \left|-Vd + (Vga + Vd) \times \frac{rl}{(RI + rl)}\right| \quad (1)$$

$$\left|\text{threshold voltage of light emitting thyristor } L\right| > \left|-Vd + (Vga + Vd) \times \frac{rd}{(RI + rd)}\right|.$$

where Vd is a value of the diffusion potential Vd, Vga is a value of the power potential Vga, rd is a resistance value of the internal resistance rd of the diversion thyristor DT, rl is a resistance value of the internal resistance rl of the light emitting thyristor L, and RI is a resistance value of the current limiting resistance RI.

"H" of the diversion signal φD is 0 V in the above description; however, "H" of the diversion signal φD may be set to satisfy the above-mentioned relationship.

If the diversion signal φD becomes "H," the diversion thyristor DT is not turned on (not shifted from the off state to the on state), but the diversion thyristor DT may become the on state. That is, the diversion thyristor DT is not turned on unless the light-on signal φI is shifted from "H" to "L."

Second Exemplary Embodiment

Since an image forming apparatus 1 and a print head 14 to which the second exemplary embodiment is applied are similar to the image forming apparatus 1 and the print head 14 shown in FIGS. 1 and 2 according to the first exemplary embodiment, the description of the image forming apparatus 1 and the print head 14 is omitted, and description is started from the light emitting device 65.

Light Emitting Device 65

Figure 8:
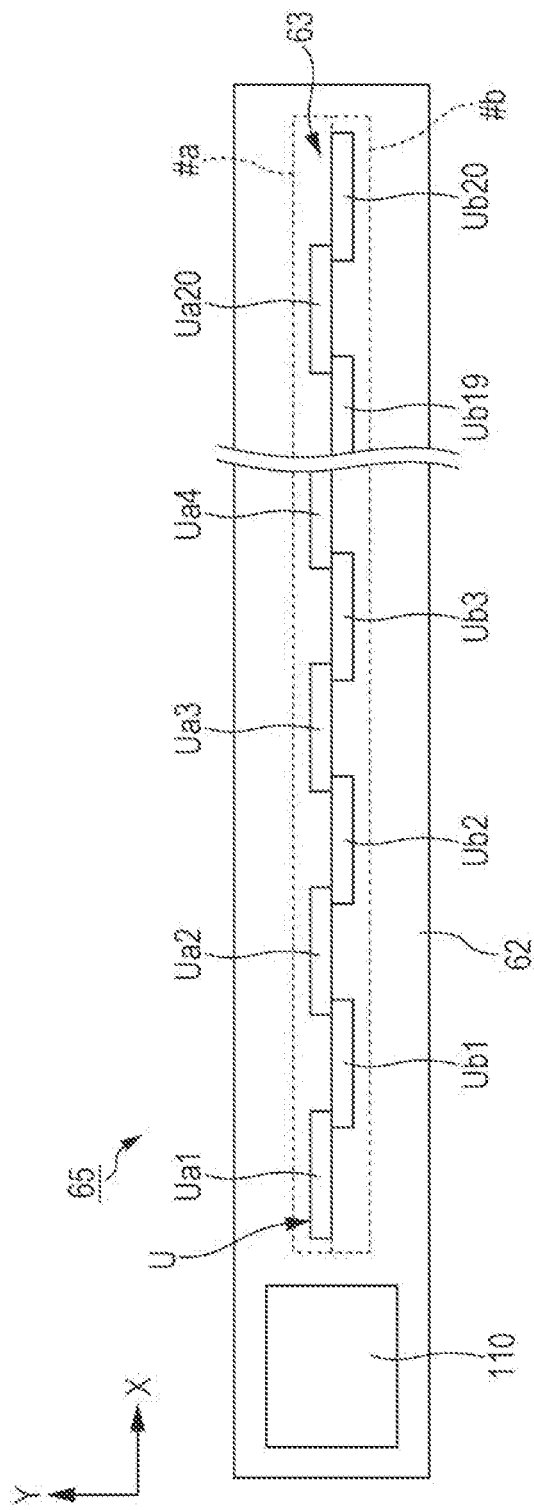
FIG. 8 is a top view of a light emitting device to which a second exemplary embodiment is applied.

FIG. 8 is a top view of the light emitting device 65 to which the second exemplary embodiment is applied.

As shown in FIG. 8, in the light emitting device 65 according to the second exemplary embodiment, the light source unit 63 includes 20 light emitting chips Ua1-Ua20 (light emitting chip group #a) and 20 light emitting chips Ub1-Ub20 (light emitting chip group #b) arranged on the circuit board 62 in a staggered manner of two rows in the main-scanning direction. That is, in the second exemplary embodiment, the 40 light emitting chips U in the first exemplary embodiment are divided into two light emitting chip groups (light emitting chip group #a and light emitting chip group #b). Herein, the light emitting chip group may be occasionally abbreviated as group. The facing arrangement of the light emitting chip group #a and the light emitting chip group #b is described later in detail.

Similarly to the first exemplary embodiment, the light emitting device 65 has mounted thereon the signal generating circuit 110 that drives the light source unit 63.

The configuration of the light emitting chips Ua1-Ua20 may be the same as the configuration of the light emitting chips Ub1-Ub20. Hence, the light emitting chips Ua1-Ua20 are expressed as light emitting chips Ua, and the light emitting chips Ub1-Ub20 are expressed as light emitting chip(s) Ub, unless otherwise distinguished from each other. Also, the light emitting chips Ua and the light emitting chips Ub are expressed as light emitting chip(s) U unless otherwise distinguished from each other.

In the second exemplary embodiment, the number of light emitting chips U is 40 in total; however, the number is not limited to 40.

Figure 9:
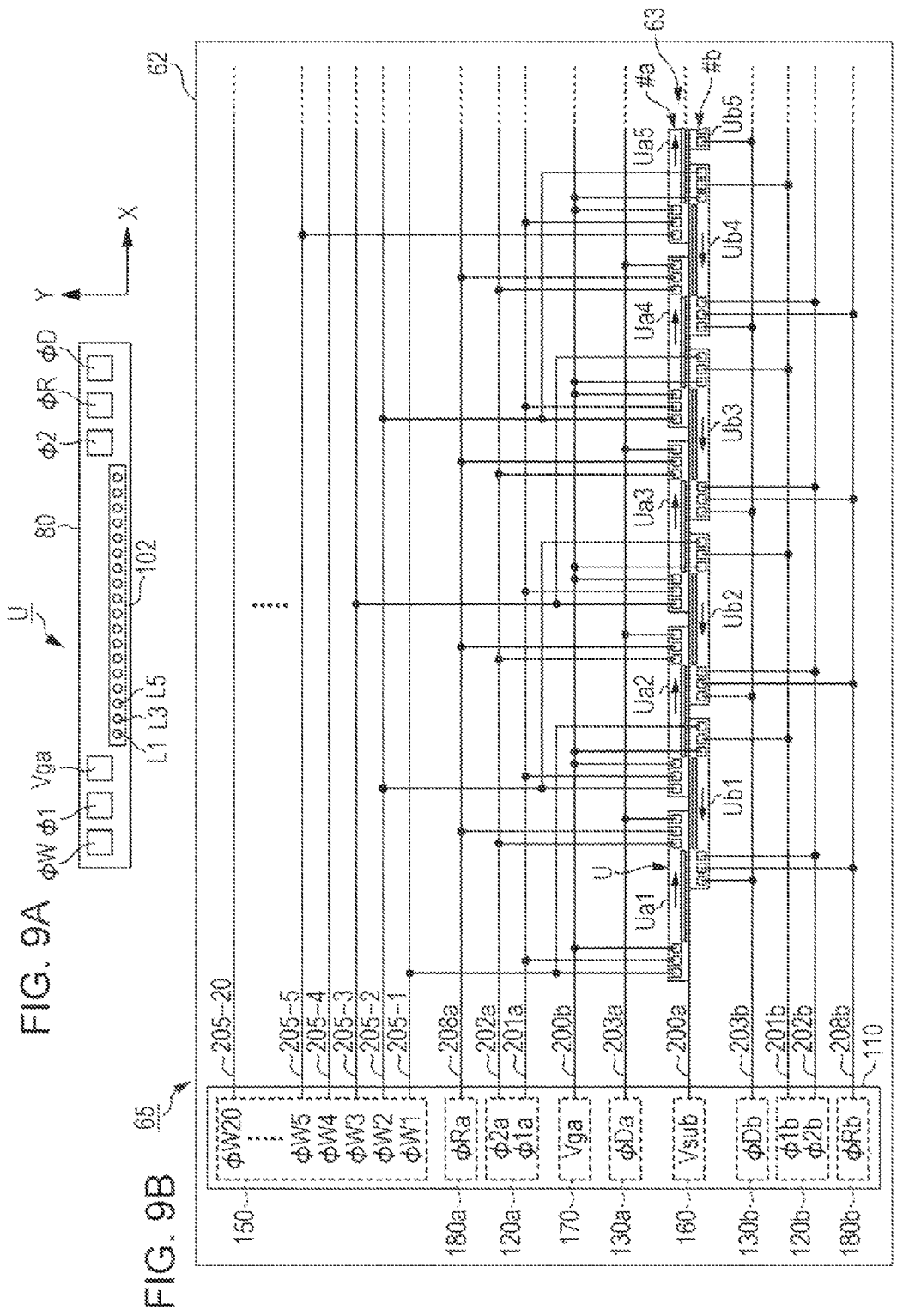
FIGS. 9A and 9B illustrate a configuration of light emitting chips, a configuration of a signal generating circuit of the light emitting device, and a configuration of wiring (lines) on a circuit board to which the second exemplary embodiment is applied.

FIGS. 9A and 9B illustrate a configuration of the light emitting chips U, a configuration of the signal generating circuit 110 of the light emitting device 65, and a wiring configuration on the circuit board 62 to which the second exemplary embodiment is applied. FIG. 9A shows the configuration of the light emitting chip U. FIG. 9B shows the configuration of the signal generating circuit 110 of the light emitting device 65, and the wiring configuration on the circuit board 62.

First, the configuration of the light emitting chip U shown in FIG. 9A is described.

The light emitting chip U includes the light emitting section 102 having plural light emitting elements (in the second exemplary embodiment, light emitting thyristors L1, L3, L5, . . . ) provided in a row form along the long side in one long-side portion on the rectangular substrate 80. Further, the light emitting chip U includes terminals (φ1 terminal, φ2 terminal, Vga terminal, φW terminal, φR terminal, φD terminal) serving as plural bonding pads that acquire various control signals and other signals, at both end portions in the long-side direction of the substrate 80. The input terminals are provided in the order of the φW terminal, φ1 terminal, and Vga terminal from one end of the substrate 80, and in the order of the φD terminal, φR terminal, and φ2 terminal from the other end of the substrate 80. The light emitting section 102 is provided between the Vga terminal and the φ2 terminal.

Next, the configuration of the signal generating circuit 110 of the light emitting device 65 and the wiring configuration on the circuit board 62 are described with reference to FIG. 9B.

The circuit board 62 of the light emitting device 65 has mounted thereon the signal generating circuit 110 and the light emitting chips U (light emitting chips Ua1-Ua20, light emitting chips Ub1-Ub20), and provided therein wiring that connects the signal generating circuit 110 with the light emitting chips U (light emitting chips Ua1-Ua20, light emitting chips Ub1-Ub20).

First, the configuration of the signal generating circuit 110 is described.

The signal generating circuit 110 receives image data after image processing and various control signals from the image output controller 30 and the image processor 40 (see FIG. 1). The signal generating circuit 110, for example, sorts the image data and corrects the light quantity, based on the image data and the various control signals.

Also, the signal generating circuit 110 includes a transfer signal generating unit 120a that transmits a first transfer signal φ1a and a second transfer signal φ2a to the light emitting chip group #a (light emitting chips Ua1-Ua20), and a transfer signal generating unit 120b that transmits a first transfer signal φ1b and a second transfer signal φ2b to the light emitting chip group #b (light emitting chips Ub1-Ub20), based on the various control signals.

The signal generating circuit 110 includes a diversion signal generating unit 130a that transmits a diversion signal φDa to the light emitting chip group #a (light emitting chips Ua1-Ua20), and a diversion signal generating unit 130b that transmits a diversion signal φDb to the light emitting chip group #b (light emitting chips Ub1-Ub20), based on the various control signals.

Also, the signal generating circuit 110 includes a light-off signal generating unit 180a that transmits a light-off signal φRa to the light emitting chip group #a (light emitting chips Ua1-Ua20), and a light-off signal generating unit 180b that transmits a light-off signal φRb to the light emitting chip group #b (light emitting chips Ub1-Ub20), based on the various control signals. The light-off signal generating unit 180a and the light-off signal generating unit 180b are expressed as light-off signal generating unit(s) 180 unless otherwise distinguished from each other.

Further, the signal generating circuit 110 includes a write signal generating unit 150 that transmits a write signal φW1 to a light emitting chip pair #1 including the light emitting chip Ua1 belonging to the light emitting chip group #a and the light emitting chip Ub1 belonging to the light emitting chip group #b; transmits a write signal φW2 to a light emitting chip pair #2 including the light emitting chip Ua2 belonging to the light emitting chip group #a and the light emitting chip Ub2 belonging to the light emitting chip group #b; respectively transmits signals φW3-φW19 to light emitting chip pairs #3-#19 similarly; and transmits a write signal φW20 to a light emitting chip pair #20 including the light emitting chip Ua20 belonging to the light emitting chip group #a and the light emitting chip Ub20 belonging to the light emitting chip group #b, based on the various control signals.

That is, the signal generating circuit 110 includes the write signal generating unit 150 that, while a light emitting chip U belonging to the light emitting chip group #a and a light emitting chip U belonging to the light emitting chip group #b form a pair (light emitting chip pair #1, #2, . . . #20), transmits a write signal φW to each light emitting chip pair. Herein, the light emitting chip pairs #1, #2, . . . #20 may be occasionally expressed as light emitting chip pair(s) and abbreviated as pair(s) unless otherwise distinguished from each other.

As described above, in FIG. 9B, while the transfer signal generating unit 120a and the transfer signal generating unit 120b are separately illustrated, the transfer signal generating units 120a and 120b may be collectively expressed as transfer signal generating unit 120. Also, while the diversion signal generating unit 130a and the diversion signal generating unit 130b are separately illustrated, the diversion signal generating units 130a and 130b may be collectively expressed as diversion signal generating unit 130. Further, while the light-off signal generating unit 180a and the light-off signal generating unit 180b are separately illustrated, the light-off signal generating units 180a and 180b may be collectively expressed as light-off signal generating unit 180.

Similarly, the first transfer signal φ1a and the first transfer signal φ1b are called first transfer signal(s) φ1 unless otherwise distinguished, and the second transfer signal φ2a and the second transfer signal φ2b are called second transfer signal(s) φ2 unless otherwise distinguished from each other. The diversion signals φDa and φDb are expressed as diversion signal(s) OD unless otherwise distinguished from each other. The light-off signals φRa and φRb are expressed as light-off signal(s) φR unless otherwise distinguished from each other. The write signals φW1-φW20 are expressed as write signal(s) φW unless otherwise distinguished from each other.

Next, the array of the light emitting chips Ua1-Ua20 and the light emitting chips Ub1-Ub20 is described.

The light emitting chips Ua1-Ua20 belonging to the light emitting chip group #a are arranged in a row at intervals in the long-side direction. The light emitting chips Ub1-Ub20 belonging to the light emitting chip group #b are also arranged in a row at intervals in the long-side direction. The light emitting chips Ua1-Ua20 belonging to the light emitting chip group #a and the light emitting chips Ub1-Ub20 belonging to the light emitting chip group #b are arranged in a staggered manner so that the light emitting chips Ua1-Ua20 face the light emitting chips Ub1-Ub20 and so that the light emitting elements are arranged at predetermined intervals in the main-scanning direction even in an area between the light emitting chips U. In each of the light emitting chips Ua1, Ua2, Ua3, . . . and the light emitting chips Ub1, Ub2, Ub3, . . . in FIG. 9B, the direction of arrangement of the light emitting elements in the light emitting section 102 (in the order of the light emitting thyristors L1, L3, L5, . . . ) shown in FIG. 9A is indicated by an arrow.

Wiring that connects the signal generating circuit 110 with the light emitting chip U (light emitting chips Ua1-Ua20, light emitting chips Ub1-Ub20) is described.

The circuit board 62 has the power line 200a that is connected with the Vsub terminal provided on the back surface of the substrate 80 of the light emitting chip U, and supplies the reference potential Vsub.

The circuit board 62 also has the power line 200b that is connected with the Vga terminal provided on the light emitting chip U and supplies the power potential Vga for driving.

Also, the circuit board 62 includes a first transfer signal line 201a that transmits the first transfer signal φ1a to φ1 terminals of the light emitting chips Ua1-Ua20 of the light emitting chip group #a, and a second transfer signal line 202a that transmits the second transfer signal φ2a to φ2 terminals of the light emitting chips Ua1-Ua20 of the light emitting chip group #a, from the transfer signal generating unit 120a of the signal generating circuit 110. The first transfer signal φ1a and the second transfer signal φ2a are transmitted commonly (parallely) to the light emitting chips Ua1-Ua20 of the light emitting chip group #a.

Similarly, the circuit board 62 includes a first transfer signal line 201b that transmits the first transfer signal φ1b to φ1 terminals of the light emitting chips Ub1-Ub20 of the light emitting chip group #b, and a second transfer signal line 202b that transmits the second transfer signal φ2b to φ2 terminals of the light emitting chips Ub1-Ub20 of the light emitting chip group #b, from the transfer signal generating unit 120b of the signal generating circuit 110. The first transfer signal φ1b and the second transfer signal φ2b are transmitted commonly (parallely) to the light emitting chips Ub1-Ub20 of the light emitting chip group #b.

Also, the circuit board 62 includes a diversion signal line 203a that transmits the diversion signal φDa from the diversion signal generating unit 130a of the signal generating circuit 110 to φD terminals of the light emitting chips Ua1-Ua20 of the light emitting chip group #a. The diversion signal φDa is transmitted commonly (parallely) to the light emitting chips Ua1-Ua20 of the light emitting chip group #a.

Similarly, the circuit board 62 includes a diversion signal line 203b that transmits the diversion signal φDb from the diversion signal generating unit 130b of the signal generating circuit 110 to φD terminals of the light emitting chips Ub1-Ub20 of the light emitting chip group #b. The diversion signal φDb is transmitted commonly (parallely) to the light emitting chips Ub1-Ub20 of the light emitting chip group #b.

Also, the circuit board 62 includes a light-off signal line 208a that transmits the light-off signal φRa from the light-off signal generating unit 180a of the signal generating circuit 110 to φR terminals of the light emitting chips Ua1-Ua20 of the light emitting chip group #a. The light-off signal φRa is transmitted commonly (parallely) to the light emitting chips Ua1-Ua20 of the light emitting chip group #a.

Similarly, the circuit board 62 includes a light-off signal line 208b that transmits the light-off signal φRb from the light-off signal generating unit 180b of the signal generating circuit 110 to φR terminals of the light emitting chips Ub1-Ub20 of the light emitting chip group #b. The light-off signal φRb is transmitted commonly (parallely) to the light emitting chips Ub1-Ub20 of the light emitting chip group #b.

Further, the circuit board 62 includes write signal lines 205-1 to 205-20 that transmit the write signals φW1, and φW2-φW20 from the write signal generating unit 150 of the signal generating circuit 110 to the respective light emitting chip pairs each including a light emitting chip Ua belonging to the light emitting chip group #a and a light emitting chip Ub belonging to the light emitting chip group #b.

That is, the write signal line 205-1 is connected with φW terminals of the light emitting chip pair #1 including the light emitting chip Ua1 belonging to the light emitting chip group #a and the light emitting chip Ub1 belonging to the light emitting chip group #b, and transmits the write signal φW1 to the φW terminals. The write signal line 205-2 is connected with φW terminals of the light emitting chip pair #2 including the light emitting chip Ua2 belonging to the light emitting chip group #a and the light emitting chip Ub2 belonging to the light emitting chip group #b, and transmits the write signal φW2 to the φW terminals. Write signal lines 205-3 to 205-19 are provided and respectively transmit the write signals φW3 to φW19, similarly. Then, the write signal line 205-20 is connected with φW terminals of the light emitting chip pair #20 including the light emitting chip Ua20 belonging to the light emitting chip group #a and the light emitting chip Ub20 belonging to the light emitting chip group #b, and transmits the write signal W20 to the φW terminals.

As described above, the reference potential Vsub and the power potential Vga are commonly supplied to all light emitting chips U on the circuit board 62.

The first transfer signal φ1a, the second transfer signal φ2a, the diversion signal φDa, and the light-off signal φRa are commonly transmitted to the light emitting chip group #a. The first transfer signal φ1b, the second transfer signal φ2b, the diversion signal φDb, and the light-off signal φRb are commonly transmitted to the light emitting chip group #b.

In contrast, the write signals φW (write signals φW1-φW20) are transmitted commonly to the respective light emitting chip pairs (light emitting chip pairs #1-#20) each including a light emitting chip Ua belonging to the light emitting chip group #a and a light emitting chip Ub belonging to the light emitting chip group #b.

If the light emitting device 65 does not include the signal generating circuit 110, the power lines 200a and 200b, the first transfer signal lines 201a and 201b, the second transfer signal lines 202a and 202b, the diversion signal lines 203a and 203b, the light-off signal lines 208a and 208b, and the write signal lines 205-1 to 205-20 on the circuit board 62 are connected with connectors or other members provided instead of the signal generating circuit 110. Then, these signal lines are connected with the signal generating circuit 110 provided outside the circuit board 62 through cables connected with the connectors or other members.

Figure 10:
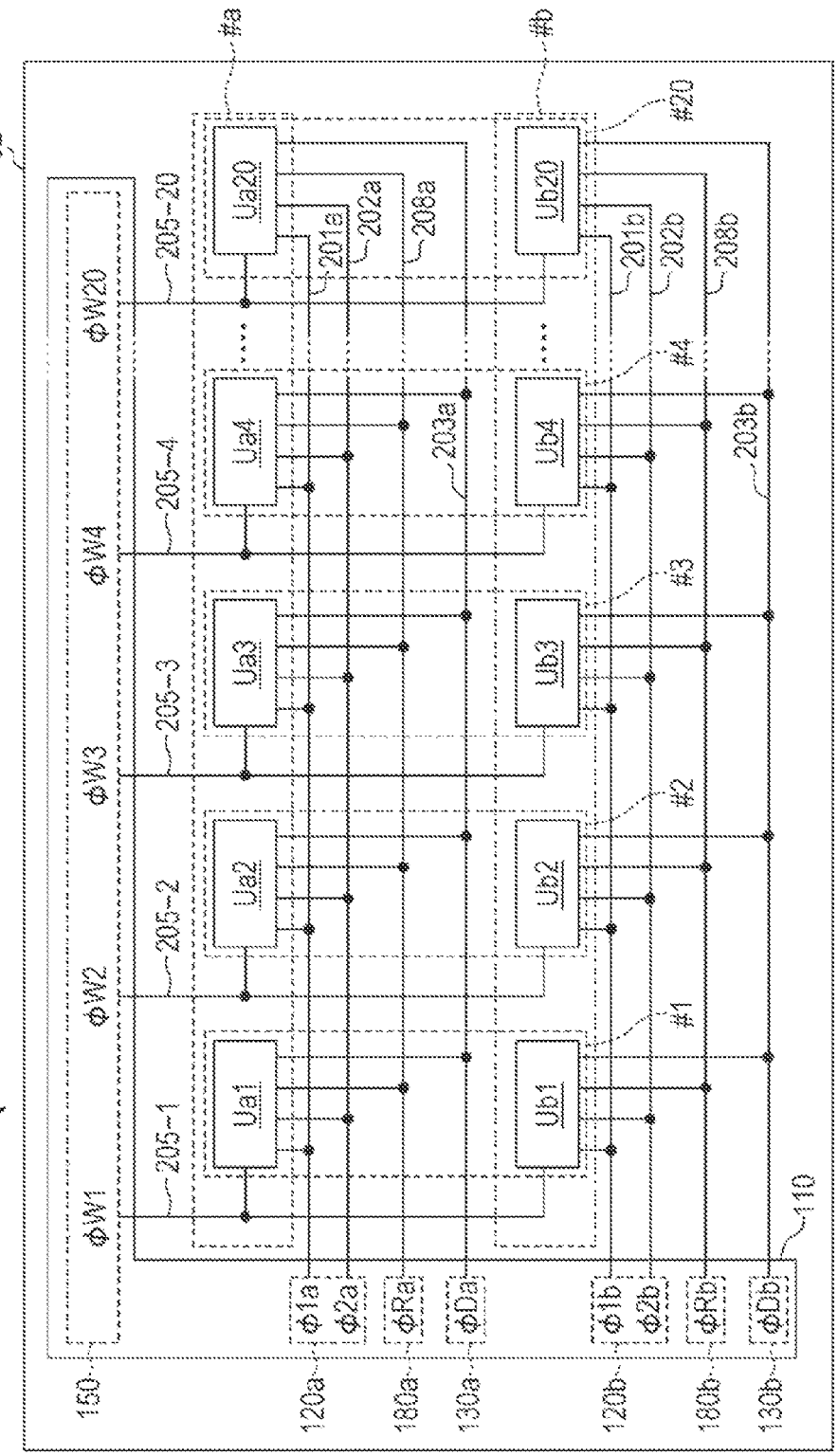
FIG. 10 is an illustration showing the light emitting chips arranged as elements of a matrix of the light emitting device to which the second exemplary embodiment is applied.

FIG. 10 is an illustration showing the light emitting chips U of the light emitting device 65 to which the second exemplary embodiment is applied, the light emitting chips U being arranged as elements of a matrix.

In FIG. 10, the light emitting chips U (light emitting chips Ua1-Ua20, light emitting chips Ub1-Ub20) are arranged as elements of 2×20 matrix. Also, FIG. 10 illustrates wiring (lines) for the signals (first transfer signals φ1a and φ1b, second transfer signals φ2a and φ2b, diversion signals φDa and φDb, light-off signals φRa and φRb, and write signals φW1-φW20) for connection between the signal generating circuit 110 and the light emitting chips U (light emitting chips Ua1-Ua20, light emitting chips Ub1-Ub20).

As described above, it may be easily understood that the first transfer signal φ1a, the second transfer signal φ2a, the diversion signal φDa, and the light-off signal φRa are commonly transmitted to the light emitting chip group #a. Also, it may be easily understood that the first transfer signal φ1b, the second transfer signal φ2b, the diversion signal φDb, and the light-off signal φRb are commonly transmitted to the light emitting chip group #b.

In contrast, it may be easily understood that the write signals φW1-φW20 are transmitted commonly to the respective light emitting chip pairs #1-#20 each including a light emitting chip Ua belonging to the light emitting chip group #a and a light emitting chip Ub belonging to the light emitting chip group #b.

Herein, the number of wiring lines (lines) provided on the circuit board 62 is described.

In the first exemplary embodiment (see FIG. 4B) in which the light emitting chips U are not divided into light emitting chip groups or light emitting chip pairs in the light emitting device 65, since the light-on signal φI is transmitted to each of the light emitting chips U, if the number of light emitting chips U is 40, the 40 light-on signal lines 204-1 to 204-40 are required. In addition, the first transfer signal line 201, the second transfer signal line 202, the diversion signal line 203, and the power lines 200a and 200b are required. Hence, the number of wiring lines (lines) provided on the circuit board 62 of the light emitting device 65 is 45.

Also, the resistance of the 40 light-on signal lines 204 is required to be small because current for lighting is applied to the light emitting thyristors L. Hence, wide wiring lines (lines) are required for the 40 light-on signals 204. Owing to this, if the light emitting chips U are not divided into light emitting chip groups or light emitting chip pairs in the first exemplary embodiment, multiple wiring lines with large widths have to be provided on the circuit board 62, and the area of the circuit board 62 may be increased.

In the second exemplary embodiment, as shown in FIGS. 9B and 10, if the number of light emitting chip groups is two, the write signal lines 205-1 to 205-20 are required in addition to the diversion signal lines 203a and 203b, the light-off signal lines 208a and 208b, the first transfer signal lines 201a and 201b, the second transfer signal lines 202a and 202b, and the power lines 200a and 200b. Hence, the number of wiring lines (lines) provided on the light emitting device 65 is 30.

In the case in which the light emitting chips U are divided into the light emitting chip groups and the light emitting chip pairs according to the second exemplary embodiment, as compared with the first exemplarily embodiment in which the light emitting chips U are not divided into the light emitting chip groups or the light emitting chip pairs, the number of wiring lines (lines) on the circuit board 62 becomes ⅔.

Alternatively, the diversion signal φDa and the diversion signal φDb may be a common diversion signal φD, and the diversion signal φD may be commonly transmitted to the light emitting chip groups #a and #b. In this case, the diversion signal lines 203a and 203b may be a single diversion signal line, and the number of wiring lines (lines) provided on the circuit board 62 of the light emitting device 65 may be 29.

Further, in the second exemplary embodiment, the light-off signal lines 208a and 208b are used instead of wiring lines (lines) with large widths through which current flows for lighting the light emitting thyristors L. The light-off signals φRa and φRb that cause light-off thyristors RT to be turned on (described later) are transmitted to the light-off signal lines 208a and 208b. Hence, large current does not flow to the light-off signal line 208a or 208b.

Also, the write signals φW for causing write thyristors S (described later) to be turned on are transmitted to the write signal lines 205-1 to 205-20. Hence, large current does not flow to the write signal lines 205-1 to 205-20.

Further, the diversion signal lines 203a and 203b are connected with the gate Gd of the diversion thyristor DT, and the diversion signals φD for controlling the threshold voltage of the diversion thyristor DT are transmitted to the diversion signal lines 203a and 203b. Hence, large current does not flow to the diversion signal lines 203a or 203b.

Light Emitting Chip U

Figure 11:
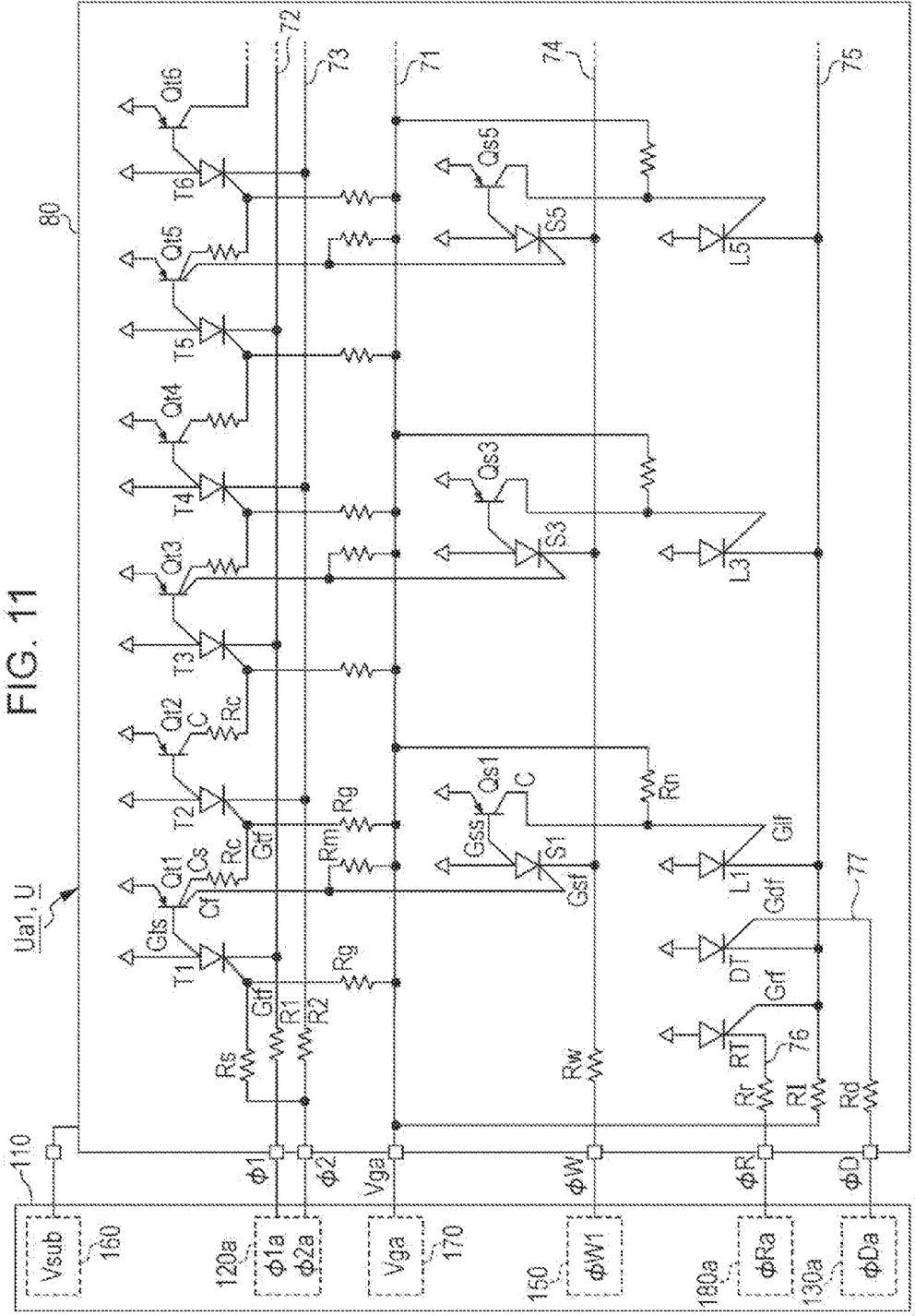
FIG. 11 is an equivalent circuit diagram explaining a circuit configuration of the light emitting chip with a self-scanning light emitting device (SLED) array mounted to which the second exemplary embodiment is applied.

FIG. 11 is an equivalent circuit diagram explaining a circuit configuration of the light emitting chip U with a self-scanning light emitting device (SLED) array mounted to which the second exemplary embodiment is applied. The positions of the terminals (φ1 terminal, φ2 terminal, Vga terminal, φW terminal, φR terminal, φD terminal) are illustrated at the left end of FIG. 11 for convenience of the description although the positions are different from those in FIG. 9A.

Herein, the light emitting chip Ua1 is described as an example of the light emitting chip U in relation to the signal generating circuit 110. Hence, the light emitting chip U is expressed as light emitting chip Ua1(U) in the following description, and illustrated as Ua1, U in FIG. 11. The other light emitting chips Ua2-Ua20 and light emitting chips Ub1-Ub20 have the same configuration as the light emitting chip Ua1.

The light emitting chip Ua1(U) has the light emitting thyristor row including the odd-numbered light emitting thyristors L1, L3, L5, . . . arranged in a row form on the substrate 80.

Also, the light emitting chip Ua1(U) has a transfer thyristor row including odd-numbered and even-numbered transfer thyristors T1, T2, T3, . . . arranged in a row form similarly to the light emitting thyristor row, and a write thyristor row including odd-numbered write thyristors S1, S3, S5, . . . arranged in a row form similarly to the transfer thyristor row.

Herein, the light emitting thyristors L1, L3, L5, . . . , the transfer thyristors T1, T2, T3, . . . , and the write thyristors S1, S3, S5, . . . , are respectively expressed as light emitting thyristor(s) L, transfer thyristor(s) T, and write thyristor(s) S unless otherwise distinguished from each other.

Further, the light emitting chip Ua1(U) includes the diversion thyristor DT and the light-off thyristor RT.

In the light emitting chip Ua1(U) to which the second exemplary embodiment is applied, the number of write thyristors S and the number of light emitting thyristors L are each the half of the number of transfer thyristors T. That is, for the odd-numbered transfer thyristors T, the write thyristors S and the light emitting thyristors L of the corresponding numbers are provided, and for the even-numbered transfer thyristors T, the write thyristors S or the light emitting thyristors L are not provided.

The light emitting chip U1(U) has pairs each including two of the transfer thyristors T1, T2, T3, . . . in the order of the numbers, and has coupling transistors Qt1, Qt2, Qt3, . . . , which are pnp bipolar transistors, each being arranged between the corresponding pair. The coupling transistors Qt1, Qt2, Qt3, . . . are an example of three-terminal active element(s).

Further, the light emitting chip Ua1(U) includes odd-numbered write transistors Qs1, Qs3, Qs5, . . . , respectively for the write thyristors S1, S3, S5, . . . .

Herein, the coupling transistors Qt1, Qt2, Qt3, . . . , and the write transistors Qs1, Qs3, Gs5, . . . are expressed as coupling transistor(s) Qt and write transistor(s) Qs unless otherwise distinguished from each other.

The light emitting chip Ua1(U) includes a start resistance Rs. Also, provided herein are the current limiting resistance R1 and the current limiting resistance R2 that prevent current from excessively flowing respectively to the first transfer signal line 72, to which the first transfer signal φ1 (in light emitting chip Ua1, first transfer signal φ1a) is transmitted, and the second transfer signal line 73, to which the second transfer signal φ2 (in light emitting chip Ua1, second transfer signal φ2a) is transmitted. Also, provided herein is the current limiting resistance Rd that prevents current from excessively flowing to the diversion signal line 77, to which the diversion signal φDa is transmitted. Also, provided is a current limiting resistance Rw that prevents current from excessively flowing to a write signal line 74 that transmits the write signal φW (in light emitting chip Ua1, write signal φW1). Further, provided is a current limiting resistance Rr that prevents current from excessively flowing to a light-off signal line 76 that transmits the light-off signal φR (in light emitting chip Ua1, light-off signal φRa). Further, provided is the current limiting resistance RI that prevents current excessively flowing to the light-on signal line 75.

Alternatively, any of or all of the current limiting resistances R1, R2, Rd, Rw, Rr, and RI may be provided outside the light emitting chip Ua1(U).

Further, the light emitting chip Ua1(U) includes resistances Rc, Rg, Rm, and Rn. These resistances will be described later.

The light emitting thyristors L1, L3, L5, . . . in the light emitting thyristor row, the transfer thyristors T1, T2, T3, . . . in the transfer thyristor row, and the write thyristors S1, S3, S5, . . . in the write thyristor row are arranged in the order of the numbers from the left side in FIG. 11. Also, the coupling transistors Qt1, Qt2, Qt3, . . . are arranged in the order of the numbers from the left side in the drawing. Further, the write transistors Qs1, Qs3, Qs5, . . . are arranged respectively in parallel to the write thyristors S1, S3, S5, . . . in the write thyristor row. The diversion thyristor DT and the light-off thyristor RT are arranged in parallel to the light emitting thyristors L1, L3, L5, . . . in the light emitting thyristor row.

The light emitting thyristor row, the transfer thyristor row, and the write thyristor row are arranged in the order of the transfer thyristor row, the write thyristor row, and the light emitting thyristor row from the upper side in FIG. 11.

Herein, the thyristors (light emitting thyristor L, transfer thyristor T, write thyristor S, diversion thyristor DT, light-off thyristor RT) are semiconductor elements each having a first gate, a second gate, an anode, and a cathode. That is, if a thyristor is formed of a laminated semiconductor in which a p-type first semiconductor layer, an n-type second semiconductor layer, a p-type third conductive layer, and an n-type fourth semiconductor layer are successively stacked on the substrate 80, the p-type first semiconductor layer forms an anode, the n-type second semiconductor layer forms a second gate, the p-type third semiconductor layer forms a first gate, and the n-type fourth semiconductor layer forms a cathode. Since the second gate is not used in the first exemplary embodiment, the first gate is expressed as gate.

In the second exemplary embodiment, the transfer thyristors T and the write thyristors S use second gates in addition to first gates. The light emitting thyristor L, the diversion thyristor DT, and the light-off thyristor RT use the first gates; however, do not use the second gates.

While the coupling transistors Qt and the write transistors Qs are semiconductor elements each having a collector, a base, and an emitter, the odd-numbered coupling transistors Qt each have two collectors (multi-connectors). The coupling transistors Qt and the write transistors Qs are also each formed of the above-descried laminated semiconductor. The p-type first semiconductor layer forms an emitter, the n-type second semiconductor layer forms a base, and the p-type third semiconductor layer forms a collector. The n-type fourth semiconductor layer is eliminated from a portion including the coupling transistors Qt and the write transistors Qs.

In the description for the second exemplary embodiment, regardless of the numbers, the gates of the transfer thyristor T are expressed as first gate Gtf and second gate Gts, the gates of the write thyristor S are expressed as first gate Gsf and second gate Gss, and the gate of the light emitting thyristor L is expressed as first gate Glf. The gate of the diversion thyristor DT is expressed as first gate Gdf, and the gate of the light-off thyristor RT is expressed as first gate Grf.

Regardless of the numbers, the collectors of the odd-numbered multi-collector coupling transistor Qt are expressed as first collector Cf and second collector Cs, and the collector of the even-numbered coupling transistor Qt is expressed as collector C. Also, the collector of the write transistor Qs is expressed as collector C.

Next, electric connection of respective elements in the light emitting chip Ua1(U) is described.

The anodes of the transfer thyristors T, the write thyristors S, the light emitting thyristors L, the diversion thyristor DT, and the light-off thyristor RT are the p-type first semiconductor layer, and are connected with the substrate 80 of the light emitting chip Ua1(U) (anode common). The emitters of the coupling transistors Qt and the write transistors Qs are also the p-type first semiconductor layer, and are connected with the substrate 80 of the light emitting chip Ua1(U).

The anodes and emitters are connected with the power line 200a (see FIG. 9B) through the Vsub terminal provided on the back surface of the substrate 80. The reference potential Vsub is supplied to the power line 200a from the reference potential supply unit 160.

The cathodes of the odd-numbered transfer thyristors T1, T3, T5, . . . are connected with the first transfer signal line 72 along the transfer thyristor row. The first transfer signal line 72 is connected with the φ1 terminal through the current limiting resistance RI. The first transfer signal line 201a (see FIG. 9B) is connected with the φ1 terminal, and the first transfer signal φ1a is transmitted to the φ1 terminal.

The cathodes of the even-numbered transfer thyristors T2, T4, T6, . . . are connected with the second transfer signal line 73 along the transfer thyristor row. The second transfer signal line 73 is connected with the φ2 terminal through the current limiting resistance R2. The second transfer signal line 202a (see FIG. 9B) is connected with the φ2 terminal, and the second transfer signal φ2a is transmitted to the φ2 terminal.

In the case of the light emitting chip Ub1, the first transfer signal line 201b (see FIG. 9B) is connected with the φ1 terminal, and the first transfer signal φ1b is transmitted to the φ1 terminal. Similarly, the second transfer signal line 202b (see FIG. 9B) is connected with the φ2 terminal, and the second transfer signal φ2b is transmitted to the φ2 terminal.

The cathodes of the write thyristors S are connected with the write signal line 74 along the write thyristor row. The write signal line 74 is connected with the φW terminal through the current limiting resistance Rw. In the case of the light emitting chip Ua1, the write signal line 205-1 (see FIG. 9B) is connected with the φW terminal, and the write signal φW1 is transmitted to the φW terminal.

Also in the case of the light emitting chip Ub1, the write signal φW1 is transmitted to the φW terminal.

The cathodes of the light emitting thyristors L are connected with the light-on signal line 75 along the light emitting thyristor row. The light-on signal line 75 is connected with the power line 71 through the current limiting resistance RI. The power line 71 is connected with the power line 200b (see FIG. 9B) and the power potential Vga is supplied to the power line 71.

The cathode of the diversion thyristor DT is connected with the light-on signal line 75.

The cathode of the light-off thyristor RT is connected with the light-off signal line 76. The light-off signal line 76 is connected with the φR terminal through the current limiting resistance Rr. In the case of the light emitting chip Ua1, the light-off signal line 208a (see FIG. 9B) is connected with the φR terminal, and the write signal φRa is transmitted to the φR terminal.

In the case of the light emitting chip Ub1, the light-off signal line 208b (see FIG. 9B) is connected with the φR terminal, and the write signal φRb is transmitted to the φR terminal.

The first gate Gtf of the odd-numbered transfer thyristor T is connected with the power line 71 through a resistance Rg along the transfer thyristor row. The second gate Gts is connected with the base of the coupling transistor Qt of the same number.

The first collector Cf of the odd-numbered coupling transistor Qt is connected with the power line 71 through a resistance Rm, and is connected with the first gate Gsf of the write thyristor S of the same number. The second collector Cs is connected with the first gate Gtf of the even-numbered (downstream) transfer thyristor T with the number larger by one than the coupling transistor Qt through a resistance Rc.

Also, the first gate Gtf of the even-numbered transfer thyristor T is connected with the power line 71 through a resistance Rg. The second gate Gts is connected with the base of the coupling transistor Qt of the same number.

The collector C of the even-numbered coupling transistor Qt is connected with the first gate Gtf of the odd-numbered (downstream) transfer thyristor T with the number larger by one than the coupling transistor Qt through a resistance Rc.

The second gate Gss of the write thyristor S is connected with the base of the write transistor Qs of the same number. The collector C of the write transistor Qs is connected with the power line 71 through the resistance Rn, and is connected with the first gate Glf of the light emitting thyristor L of the same number.

The first gate Gdf of the diversion thyristor DT is connected with the diversion signal line 77. The diversion signal line 77 is connected with the φD terminal through the current limiting resistance Rd. In the case of the light emitting chip Ua1, the diversion signal line 203a (see FIG. 9B) is connected with the φD terminal, and the diversion signal φDa is transmitted to the φD terminal.

In the case of the light emitting chip Ub1, the diversion signal line 203b (see FIG. 9B) is connected with the φD terminal, and the diversion signal φDb is transmitted to the φD terminal.

The first gate Grf of the light-off thyristor RT is connected with the light-on signal line 75.

As described above, in the light emitting chip Ua1(U) of the second exemplary embodiment, the odd-numbered transfer thyristor T is connected with the write thyristor S of the same number, and the write thyristor S is connected with the light emitting thyristor L of the same number. That is, the odd-numbered transfer thyristor T executes light-on control of the light emitting thyristor L.

The odd-numbered coupling transistor Qt has the multi-connector (first collector Cf, second collector Cs); however, the first gate Gsf of the write thyristor S and the first gate Gtf of the transfer thyristor T may be connected with the collector C through the resistance Rc, as a single collector C.

In the following description, the odd-numbered coupling transistor Qt is described as having the multi-connector (first collector Cf, second collector Cs) as shown in FIG. 11.

Operation of Thyristor and Transistor

Operations of thyristors (transfer thyristor T, write thyristor S, light emitting thyristor L, diversion thyristor DT, light-off thyristor RT) and transistors (coupling transistor Qt, write transistor Qs) are described.

Also in the second exemplary embodiment, it is assumed that the reference potential Vsub is "H" (0 V) and the power potential Vga is "L" (−3.3 V). Also, it is assumed that signals (first transfer signals φ1a and φ1b, second transfer signal φ2a and φ2b, diversion signals φDa and φDb, light-off signals φRa and φRb, write signals φW1-φW20) each have potentials of "H" (0 V) and "L" (−3.3 V). In the following description, expressions of "H" (0 V) or "H," and "L" (−3.3 V) or "L" are used.

In the second exemplary embodiment, for example, the current limiting resistances R1 and R2, and the resistance Rg are 300 Ω, 300 Ω, and 10 kΩ, respectively, similarly to the first exemplary embodiment. The internal resistance rt of the transfer thyristor T in the on state is 60 Ω similarly to the first exemplary embodiment. Hence, the first transfer signal line 72 and the second transfer signal line 73 become −1.8 V if a single transfer thyristor T connected with each of the first transfer signal line 72 and the second transfer signal line 73 is in the on state.

Also, it is assumed that the current limiting resistance Rw, and an internal resistance rs of the write thyristor S in the on state are 300 Ω and 60 Ω, respectively. Accordingly, if a single write thyristor S is in the on state, the write signal line 74 becomes −1.8 V.

Also, it is assumed that the current limiting resistance Rr, and an internal resistance rr of the light-off thyristor RT in the on state are 300 Ω and 60 Ω, respectively. Hence, if the light-off thyristors RT is in the on state, the light-off signal line 76 becomes −1.8 V.

Further, it is assumed that the internal resistance rl of the light emitting thyristor L in the on state, the internal resistance rd of the diversion thyristor DT in the on state, and the current limiting resistance Rl are 12 Ω, 12 Ω, and 80 Ω, respectively. Accordingly, if a single light emitting thyristor L or the diversion thyristor DT is in the on state, the light-on signal line 75 becomes −1.73 V, and if both the single light emitting thyristor L and the diversion thyristor DT are in the on state, the light-on signal line 75 becomes −1.63 V. Also, if the single light emitting thyristor L is in the on state and if the diversion thyristor DT is in the off state, the current IL flowing to the light emitting thyristor L in the on state becomes 19 mA on the absolute value basis (i2 of |ILa| and i2 of |ILb| in FIG. 12, described later). Similarly, if the diversion thyristor DT is in the on state and all light emitting thyristors L are in the off state, the current ID flowing to the diversion thyristor DT in the on state also becomes 19 mA (i4 of |IDa| and i4 of |IDb| in FIG. 12).

Figure 12:
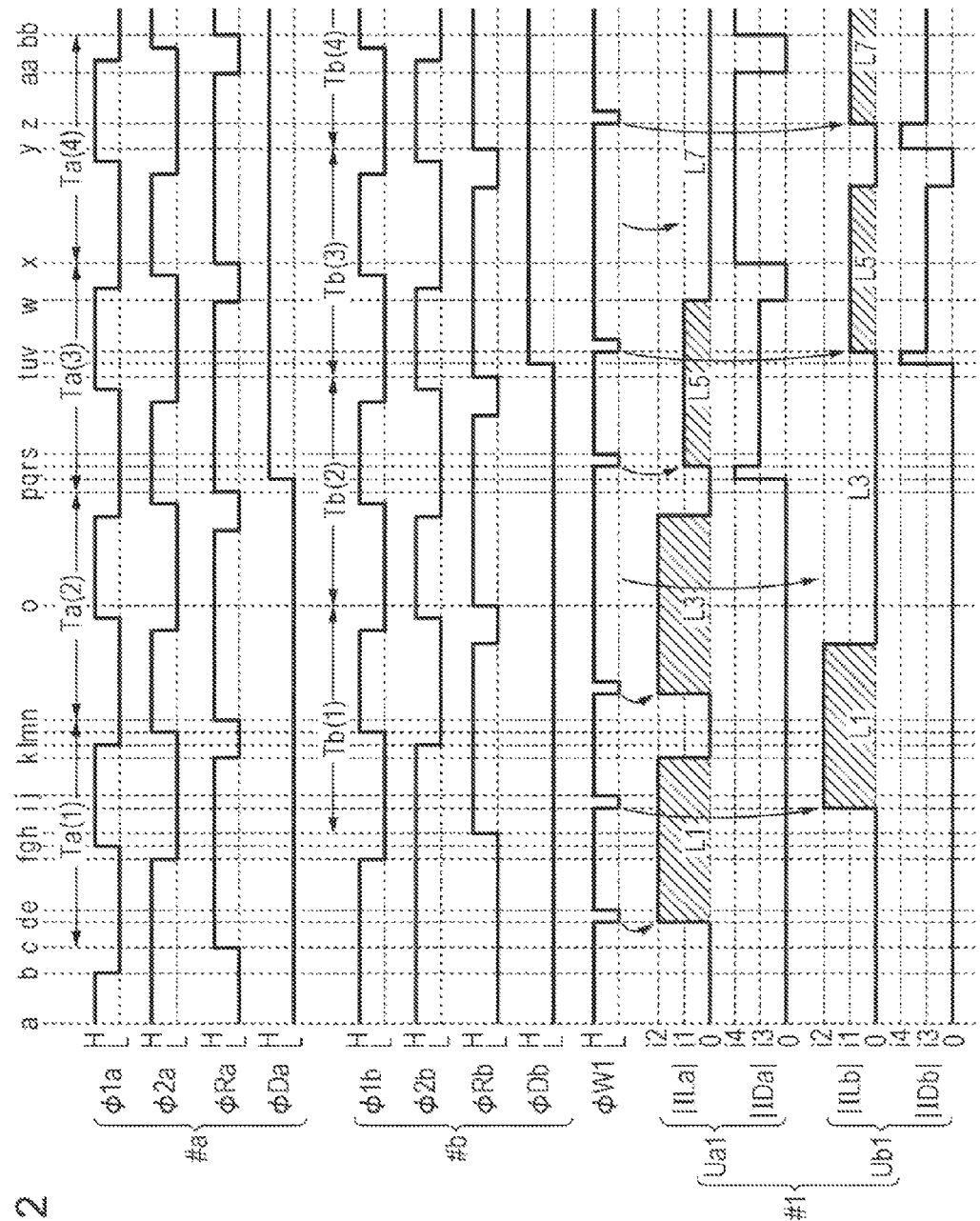
FIG. 12 is a timing chart explaining operations of the light emitting chips to which the second exemplary embodiment is applied.

If both the single light emitting thyristor L and the diversion thyristor DT are in the on state, the current IL flowing to the light emitting thyristor L in the on state and the current ID flowing to the diversion thyristor DT in the on state each become 11 mA (i1 of |ILa|, i1 of |ILb|, i3 of |IDa|, i3 of |IDb| in FIG. 12).

It is assumed that the start resistance Rs and the resistance Rc are 2 kΩ and 2 kΩ, respectively. Further, it is assumed that the current limiting resistance Rd, the resistance Rm, and the resistance Rn are 300 Ω, 10 kΩ, and 10 kΩ, respectively.

Next, the basic operations of the transfer thyristor T, the coupling transistor Qt, the write thyristor S, the write transistor Qs, and the light emitting thyristor L are described by using the transfer thyristor T1, the coupling transistor Qt1, the write thyristor S1, the write transistor Qs1, and the light emitting thyristor L1 in FIG. 11.

As described above, if the transfer thyristor T1 is turned on, the potential of the first gate Gtf becomes −0.2 V, which is the saturation voltage of the pnp bipolar transistor forming the thyristor. The second gate Gts becomes −1.5 V, which is obtained by subtracting the diffusion potential Vd (1.5 V) from the reference potential Vsub ("H" (0 V)). Then, since the base of the coupling transistor Qt1 is connected with the second gate Gts of the transfer thyristor T1, the base becomes −1.5 V. Accordingly, the coupling transistor Qt1 has a forward bias between the emitter and the base, and the coupling transistor Qt1 is shifted form the off state to the on state. Then, the first collector Cf and the second collector Cs of the coupling transistor Qt1 become −0.2 V which is the saturation potential.

Herein, the first gate Gtf of the transfer thyristor T2 is connected with the second collector Cs (−0.2 V) of the coupling transistor Qt1 through the resistance Rc, and is connected with the power line 71 ("L" (−3.3 V)) through the resistance Rg. Hence, if the resistance Rc and the resistance Rg are respectively 2 kΩ and 10 kΩ, the first gate Gtf of the transfer thyristor T2 becomes −0.72 V and the threshold voltage thereof becomes −2.22 V.

Since the first gate Gsf of the write thyristor S1 is connected with the first collector Cf (−0.2 V) of the coupling transistor Qt1 in the on state, the threshold voltage of the write thyristor S1 becomes −1.7 V.

Also, if the write thyristor S1 is turned on, similarly to the above-described coupling transistor Qt1, the write transistor Qs1 is shifted from the off state to the on state, and the collector C becomes −0.2 V which is the saturation voltage. Since the first gate Glf of the light emitting thyristor L1 is connected with the collector C (−0.2 V) of the write transistor Qs1, the threshold voltage thereof becomes −1.7 V.

Timing Chart

Next, the operation of the light emitting device 65, to which the second exemplary embodiment is applied, is described.

As shown in FIGS. 9B and 10, the light emitting device 65 includes the light emitting chips Ua1-Ua20 belonging to the light emitting chip group #a and the light emitting chips Ub1-Ub20 belonging to the light emitting chip group #b.

As shown in FIG. 9B, the reference potential Vsub and the power potential Vga are commonly supplied to all the light emitting chips U (light emitting chips Ua1-Ua20, light emitting chips Ub1-Ub20) on the circuit board 62.

Also, as described above, the first transfer signal φ1a, the second transfer signal φ2a, the diversion signal φDa, and the light-off signal φRa are commonly transmitted to the light emitting chips Ua1-Ua20 belonging to the light emitting chip group #a. Hence, the light emitting chips Ua1-Ua20 belonging to the light emitting chip group #a are driven in parallel.

Similarly, as described above, the first transfer signal φ1b, the second transfer signal φ2b, the diversion signal φDb, and the light-off signal φRb are commonly transmitted to the light emitting chips Ub1-Ub20 belonging to the light emitting chip group #b. Hence, the light emitting chips Ub1-Ub20 belonging to the light emitting chip group #b are driven in parallel.

In contrast, the write signals φW1-φW20 are respectively transmitted commonly to the light emitting chip pairs #1-#20 each including a light emitting chip Ua belonging to the light emitting chip group #a and a light emitting chip Ub belonging to the light emitting chip group #b. For example, the light emitting chip Ua1 of the light emitting chip group #a and the light emitting chip Ub1 of the light emitting chip group #b form the light emitting chip pair #1, and the write signal φW1 is commonly transmitted to the light emitting chip pair #1. Also, the write signals φW1-φW20 are transmitted in parallel at the same timing. Hence, the light emitting chip pairs #1-#20 are driven in parallel.

Alternatively, the timings of the write signals φW1-φW20 may be shifted, for example, to adjust the light quantities of the light emitting thyristors L.

Since the light emitting chips Ua2-Ua20 belonging to the light emitting chip group #a are driven in parallel to the light emitting chip Ua1, and the light emitting chips Ub2-Ub20 belonging to the light emitting chip group #b are driven in parallel to the light emitting chip Ub1, the description for the operations of the light emitting chip Ua1 and the light emitting chip Ub1 in the light emitting chip pair #1 may be enough. Similarly, since the light emitting chip pairs φ2-φ20 are driven in parallel to the light emitting chip pair #1, the description for the light emitting chip pair #1 including the light emitting chip Ua1 and the light emitting chip Ub1 may be enough.

The operations of the light emitting chip Ua1 and the light emitting chip Ub1 belonging to the light emitting chip pair #1 are described below.

FIG. 12 is a timing chart explaining the operations of light emitting chips U, to which the second exemplary embodiment is applied. The operations of the light emitting chip Ua1 and the light emitting chip Ub1 belonging to the light emitting chip pair #1 are described below with reference to FIG. 12.

FIG. 12 shows that, in each light emitting chip U, light-on control is executed on four light emitting thyristors L including light emitting thyristors L1, L3, L5, and L7.

In the light emitting chip Ua1 of the light emitting chip pair #1, the light emitting thyristors L1, L3, and L5 are lit and the light emitting thyristor L7 is unlit among the light emitting thyristors L1, L3, L5, and L7. The light emitting thyristors L1 and L3 are in the high exposure-amount mode, and the light emitting thyristor L5 is in the low exposure-amount mode.

In contrast, in the light emitting chip Ub1, the light emitting thyristors L1, L5, and L7 are lit and the light emitting thyristor L3 is unlit among the light emitting thyristors L1, L3, L5, and L7. The light emitting thyristor L1 is in the high exposure-amount mode, and the light emitting thyristors L5 and L7 are in the low exposure-amount mode.

In FIG. 12, it is assumed that the time elapses in the order of alphabets from a time a to a time bb. A time aa and a time bb come after the time a to a time z. A period from the time a to the time bb is different from a period from the time a to the time t in FIG. 7.

In the light emitting chip Ua1 belonging to the light emitting chip group #a, light-on control is executed on the light emitting thyristor L1 in a period Ta(1) from a time c to a time n, light-on control is executed on the light emitting thyristor L3 in a period Ta(2) from the time n to a time p, light-on control is executed on the light emitting thyristor L5 in a period Ta(3) from the time p to a time x, and light-on control is executed on the light emitting thyristor L7 in a period Ta(4) from the time x to the time bb.

In the light emitting chip Ub1 belonging to the light emitting chip group #b, light-on control is executed on the light emitting thyristor L1 in a period Tb(1) from a time h to a time o, light-on control is executed on the light emitting thyristor L3 in a period Tb(2) from the time o to a time t, light-on control is executed on the light emitting thyristor L5 in a period Tb(3) from the time t to a time y, and light-on control is executed on the light emitting thyristor L7 in a period Tb(4) from the time y.

Hereinafter, light-on control is executed on the odd-numbered light emitting thyristors L of the number of 9 or larger similarly.

In the second exemplary embodiment, it is assumed that the periods Ta(1), Ta(2), Ta(3), . . . and the periods Tb(1), Tb(2), Tb(3), . . . have the same length, and are called period(s) T unless otherwise distinguished from each other.

Also, it is assumed that the periods Ta(1), Ta(2), Ta(3), . . . for control of the light emitting chips Ua1, Ua2, Ua3, . . . of the light emitting chip group #a, are shifted from the periods Tb(1), Tb(2), Tb(3), . . . for control of the light emitting chips Ub1, Ub2, Ub3, . . . of the light emitting chip group #b, by the ½ (half) length of the period T (in terms of phase, 180°). That is, the period Tb(1) is started from a timing at which the ½ period of the period T elapses since the period Ta(1) is started.

Therefore, the following description is focused on the periods Ta(1), Ta(2), Ta(3), . . . for control of the light emitting chips Ua1, Ua2, Ua3 of the light emitting chip group #a.

Alternatively, as long as the relationship among signals (described later) are held, the length of the period T may be variable.

Signal waveforms in the periods Ta(1), Ta(2), Ta(3), . . . are repetition of the same waveforms except for the write signal φW1 and the diversion signal φD, which are changed in accordance with image data.

In the following description, the period Ta(1) from the time c to the time n is described. In a period from the time a to time c, the light emitting chip Ua1(C) starts its operation. Signals in this period are described in the description for the operation.

The signal waveforms of the first transfer signal φ1a, the second transfer signal φ2a, and the light-off signal φRa in the period Ta(1) are described.

The first transfer signal φ1a is "L" at the time c, and is shifted from "L" to "H" at a time g. Then, the first transfer signal φ1a is shifted from "H" to "L" at a time l, and is held at "L" at the time n.

The second transfer signal φ2a is "H" at the time c, and is shifted from "H" to "L" at a time f. Then, the second transfer signal φ2a is shifted from "L" to "H" at a time m, and is held at "H" at the time n.

Herein, when the first transfer signal φ1a is compared with the second transfer signal φ2a, the waveform of the first transfer signal φ1a in the period Ta(1) is shifted to the downstream side by ½ of the period Ta(1) (the time c is shifted to the time g) and becomes the waveform of the second transfer signal φ2a.

The first transfer signal φ1a and the second transfer signal φ2a each have a repetitive signal waveform in which the waveform for the period T is repeated. Also, "H" and "L" are alternately repeated with a period, in which both the signals become "L," like a period from the time f to the time g interposed. Also, a period, in which both the first transfer signal φ1a and the second transfer signal φ2a are simultaneously at "H" is not provided, except for a period from the time a to a time b.

A pair of signals of the first transfer signal φ1a and the second transfer signal φ2a cause the transfer thyristors T shown in FIG. 11 to become the on state in the order of the numbers.

The light-off signal φRa is shifted from "L" to "H" at the time c, and is shifted from "H" to "L" at a time k. Then, the light-off signal φRa is shifted from "L" to "H" at the time n.

The light-off signal φRa is a signal that causes the lit light emitting thyristor L to be unlit, as described later.

Next, the write signal φW1 in the period Ta(1) is described.

The write signal φW1 is "H" at the time c, is shifted from "H" to "L" at a time d, and is shifted from "L" to "H" at a time e. Further, the write signal φW1 is shifted from "H" to "L" at a time i, and is shifted from "L" to "H" at a time j. That is, the write signal φW1 has two periods of "L" in the period Ta(1). The later period of "L" (from time i to time j) is shifted from the former period of "L" (from time d to time e) to the downstream side by ½ of the period T.

The former period in which the write signal φW1 is "L" (from time d to time e) corresponds to a period in which the first transfer signal φ1a is "L," and a period in which the transfer thyristor T1 of the light emitting chip Ua1 is in the on state. The light emitting thyristor L1 of the light emitting chip Ua1 is turned on and lit.

The later period in which the write signal φW1 is "L" (from time i to time j) corresponds to a period in which the first transfer signal φ1b is "L," being later by ½ of the period T, and a period in which the transfer thyristor T1 of the light emitting chip Ub1 is in the on state. The light emitting thyristor L1 of the light emitting chip Ub1 is turned on and lit.

The diversion signal φDa from the period Ta(1) to the period Ta(4) is described. The diversion signal φDa is "L" at the start time c of the period Ta(1), and is shifted from "L" to "H" at a time q in the period Ta(3). Then, at the end time bb of the period Ta(4), the diversion signal φDa is held at "H."

Similarly, the diversion signal φDb from the period Tb(1) to the period Tb(4) is described. The diversion signal φDb is "L" at the start time h of the period Tb(l), and is shifted from "L" to "H" at a time u in the period Tb(3). Then, at the end time bb of the period Tb(4), the diversion signal φDb is held at "H." Alternatively, the diversion signal φDa and the diversion signal φDb may be individually set.

The operations of the light emitting device 65 and the light emitting chips Ua1 and Ub1 are described according to the timing chart in FIG. 12 with reference to FIGS. 9B and 11.

(1) Time a

A state (initial state) at the time a, at which supply of the reference potential Vsub and the power potential Vga to the light emitting device 65 is started, is described.

Light Emitting Device 65

At the time a in the timing chart shown in FIG. 12, the power line 200a is set at the reference potential Vsub of "H" (0 V), and the reference power line 200b is set at the power potential Vga of "L" (−3.3 V) (see FIG. 9B). Hence, the Vsub terminals of all the light emitting chips U (light emitting chips Ua1-Ua20, light emitting chips Ub1-Ub20) are set at "H" and the Vga terminals thereof are set at "L" (see FIG. 11). Accordingly, the Vsub terminals provided on the back surfaces of the substrates 80 of the light emitting chips U (light emitting chips Ua1-Ua20, light emitting chips Ub1-Ub20) become the reference potential Vsub ("H"), and the power lines 71 become the power potential Vga ("L"). Since the light-on signal lines 75 are connected with the power lines 71 through the current limiting resistances RI, the light-on signal lines 75 become "L."

Also, in the signal generating circuit 110, the transfer signal generating unit 120a sets the first transfer signal φ1a and the second transfer signal φ2a at "H," and the transfer signal generating unit 120b sets the first transfer signal φ1b and the second transfer signal φ2b at "H." Then, the first transfer signal lines 201a and 201b, and the second transfer signals 202a and 202b become "H" (see FIG. 9B). Accordingly, the φ1 terminals and the φ2 terminals of the light emitting chips U (light emitting chips Ua1-Ua20, light emitting chips Ub1-Ub20) become "H." The first transfer signal lines 72 connected with the φ1 terminals through the current limiting resistances R1 also become "H", and the second transfer signal lines 73 connected with the φ2 terminals through the current limiting resistances R2 also become "H" (see FIG. 11).

In the signal generating circuit 110, the diversion signal generating unit 130a sets the diversion signal φDa at "L," and the diversion signal generating unit 130b sets the diversion signal φDb at "L." Then, the diversion signal lines 203a and 203b become "L" (see FIG. 9B). Accordingly, the φD terminals of the light emitting chips U (light emitting chips Ua1-Ua20, light emitting chips Ub1-Ub20) become "L." The diversion signal lines 77 connected with the φD terminals through the current limiting resistances Rd also become "L" (see FIG. 11).

Further, in the signal generating circuit 110, the light-off signal generating unit 180a sets the light-off signal φRa at "L," and the light-off signal generating unit 180b sets the light-off signal φRb at "L." Then, the light-off signal lines 208a and 208b become "L" (see FIG. 9B). Accordingly, the φR terminals of the light emitting chips U (light emitting chips Ua1-Ua20, light emitting chips Ub1-Ub20) become "L." The light-off signal lines 76 connected with the φR terminals through the current limiting resistances Rr also become "L" (see FIG. 11).

In the signal generating circuit 110, the write signal generating unit 150 sets the write signals φW1-φW20 at "H." Then, the write signal lines 205-1 to 205-20 become "H" (see FIG. 9B). Accordingly, the φW terminals of the light emitting chips U (light emitting chips Ua1-Ua20, light emitting chips Ub1-Ub20) become "H" (see FIG. 11). The write signal lines 74 connected with the φW terminals through the current limiting resistances Rw also become "H" (see FIG. 11).

Next, the operations of the light emitting chips U (light emitting chips Ua1-Ua20, light emitting chips Ub1-Ub20) are described by using the light emitting chip Ua1 and the light emitting chip Ub1 belonging to the light emitting chip pair #1, with reference to FIG. 11, according the timing chart shown in FIG. 12.

Light Emitting Chip Ua1

The anodes of the transfer thyristors T, the write thyristors S, the light emitting thyristors L, the diversion thyristor DT, and the light-off thyristor RT are connected with the Vsub terminal, and hence are set at "H."

The cathodes of the odd-numbered transfer thyristors T1, T3, T5, . . . are connected with the first transfer signal line 72 of "H," and the cathodes of the even-numbered transfer thyristors T2, T4, T6, . . . are connected with the second transfer signal line 73 of "H." Hence, the anodes and cathodes of the transfer thyristors T become "H" and the transfer thyristors T are in the off state.

The bases of the coupling transistors Qt are connected with the second gates Gts of the transfer thyristors T. Since the transfer thyristors T are in the off state, the second gates Gts are "H." Hence, since the emitters and the bases of the coupling transistors Qt are "H," the coupling transistors Qt are in the off state.

The first gates Gtf of the transfer thyristors T are connected with the power line 71 with the power potential Vga ("L" (−3.3 V)) through the resistances Rg. Hence, the first gates Gtf of the transfer thyristors T are "L" (−3.3 V) and the threshold voltage thereof is −4.8 V except for the first gate Gtf of the transfer thyristor T1 (described later).

Similarly, the cathodes of the write thyristors S are connected with the write signal line 74 of "H." Hence, the anodes and cathodes of the write thyristors S become "H" and the write thyristors S are in the off state.

The bases of the write transistors Qs are connected with the second gates Gss of the write thyristors S. Since the write thyristors S are in the off state, the second gates Gss are "H." Hence, since the emitters and the bases of the write transistors Qs are "H," the write transistors Qs are in the off state.

Also, since the first gates Gsf of the write thyristors S are connected with the power line 71 ("L" (−3.3 V)) through the resistance Rm, the threshold voltage is −4.8 V.

In contrast, the cathodes of the light emitting thyristors L are connected with the light-on signal line 75 of "L" (−3.3 V) through the current limiting resistance RI. However, since the write transistors Qs are in the off state, the first gates Glf of the light emitting thyristors L are connected with the power line 71 ("L" (−3.3 V)) through the resistances Rn. Hence, the first gates Glf of the light emitting thyristors L are "L" (−3.3 V), and the threshold voltage thereof is −4.8 V. Hence, the light emitting thyristors L are not turned on even if the light-on signal line 75 is "L" (−3.3 V), and is in the off state.

The first gate Gdf of the diversion thyristor DT is connected with the diversion signal line 77, and is connected with the ϕD terminal of "L" (−3.3 V) through the current limiting resistance Rd. Hence, the first gate Gdf of the diversion thyristor DT is "L" (−3.3 V), and the threshold voltage thereof is −4.8 V. Hence, the diversion thyristor DT is not turned on even if the light-on signal line 75 is "L" (−3.3 V), and is in the off state.

Further, the first gate Grf of the light-off thyristor RT is connected with the light-on signal line 75 of "L" (−3.3 V), and the threshold voltage thereof is −4.8 V. The light-off thyristor RT is not turned on even if the light-off signal line 76 connected with the cathode of the light-off thyristor RT is "L" (−3.3 V), and is in the off state.

Alternatively, when the signal generating circuit 110 is started at the time a, the light-off thyristor RT may be turned on. In this case, the first gate Grf of the light-off thyristor RT becomes −0.2 V. Hence, the light-on signal line 75, which is connected with the first gate Grf of the light-off thyristor RT, also becomes −0.2 V.

At the time a, since the light emitting thyristor L is not lit, the light-on signal line 75 may be −0.2 V.

The first gate Gtf of the transfer thyristor T1 at one end of the transfer thyristor row in FIG. 11 is connected with the ϕ2 terminal of "H" (0 V) through the start resistance Rs, and is connected with the power line 71 of "L" (−3.3 V) through the resistance Rg. Hence, the potential of the first gate Gtf is determined by the potential difference between the ϕ2 terminal ("H" (0 V)) and the power line 71 ("L" (−3.3 V)), and the series-connected start resistance Rs and resistance Rg.

With regard to the start resistance Rs (2 kΩ) and the resistance Rg (10 kΩ) described above, the first gate Gtf is −0.55 V. Hence, the threshold voltage of the transfer thyristor T1 is −2.05 V.

As described above, when the first gate Gtf of the transfer thyristor T is connected with the second collector Cs or the collector C of the (upstream) coupling transistor Qt, the number of which is smaller than the number of the transfer thyristor T by one, through the resistance Rc, if the coupling transistor Qt is in the on state, the first gate Gtf of the transfer thyristor T becomes −1.72 V. Hence, the resistance value of the start resistance Rs may be adjusted so that the first gate Gtf of the transfer thyristor T1 becomes −1.72 V.

Light Emitting Chip Ub1

The initial state of the light emitting chip Ub1 is similar to the initial state of the light emitting chip Ua1, and hence the description is omitted.

(2) Time b

At the time b, the first transfer signal ϕ1a, which is transmitted to the light emitting chip group #a, is shifted from "H" (0 V) to "L" (−3.3 V). Accordingly, the light emitting device 65 is brought into operating state.

Light Emitting Chip Ua1

Then, the first transfer signal line 72 is shifted from "H" to "L" through the current limiting resistance R1. Then, the transfer thyristor T1 with the threshold voltage being −2.05 V is turned on. Since the threshold voltage of the odd-numbered transfer thyristors T with the number of 3 or larger is −4.8 V, the transfer thyristors T are not turned on.

In contrast, since the second transfer signal ϕ2a of the even-numbered transfer thyristors T is "H" (0 V), the transfer thyristors T are not turned on.

If the transfer thyristor T1 is turned on, the first gate Gtf becomes −0.2 V, and the second gate Gts becomes −1.5 V. Further, the cathode (first transfer signal line 72 in FIG. 11) becomes −1.8 V. Then, since the base of the coupling transistor Qt1 is connected with the second gate Gts (−1.5 V), the coupling transistor Qt1 has a forward bias between the emitter and the base, and the coupling transistor Qt1 is shifted from the off state to the on state. Then, the first collector Cf and the second collector Cs of the coupling transistor Qt1 become −0.2 V.

Since the first gate Gtf of the transfer thyristor T2 is connected with the second collector Cs of the coupling transistor Qt1 through the resistance Rc, the first gate Gtf becomes −0.72 V, and the threshold voltage becomes −2.22 V.

In contrast, if the first collector Cf of the coupling transistor Qt1 becomes −0.2 V, the first gate Gsf of the write thyristor S1 connected with the first collector Cf becomes −0.2 V, and the threshold voltage thereof becomes −1.7 V.

However, since the write signal line 74 is "H," the write thyristor S1 is not turned on.

The other write thyristors S hold the threshold voltage of −4.8 V.

That is, at the time b, the transfer thyristor T1 is turned on. Then, immediately after the time b, the transfer thyristor T1 and the coupling transistor Qt1 are in the on state. The other transfer thyristors T, the write thyristors S, the light emitting thyristors L, the coupling transistors Qt, the write transistors Qs, the diversion thyristor DT, and the light-off thyristor RT are in the off state. In the following description, description of thyristors in the off state (transfer thyristor T, write thyristor S, light emitting thyristor L, diversion thyristor DT, light-off thyristor RT) and transistors (coupling transistor Qt, write transistor Qs) are omitted.

Light Emitting Chip Ub1

Since the signal transmitted to the light emitting chip group #b including the light emitting chip Ub1 is not changed, the light emitting chip Ub1 holds the initial state.

(3) Time c

At the time c, the light-off signal φRa, which is transmitted to the light emitting chip group #a, is shifted from "L" (−3.3 V) to "H" (0 V).

Light Emitting Chip Ua1

Then, the light-off signal line 76 is shifted from "L" to "H" through the current limiting resistance Rr. Then, both the anode and cathode of the light-off thyristor RT become "H," and the light-off thyristor RT is turned off even if the light-off thyristor RT is in the on state. Also, even if the light-off thyristor RT is in the on state and the light-on signal line 75 is −0.2 V, the light-on signal line 75 is shifted to the power potential Vga ("L" (−3.3 V)) of the power line 71.

Even if the light-on signal line 75 is shifted to "L" (−3.3 V), the light emitting thyristor L and the diversion thyristor DT are not turned on because the threshold voltage thereof is −4.8 V.

Immediately after the time c, the transfer thyristor T1 and the coupling transistor Qt1 are in the on state.

Light Emitting Chip Ub1

Since the signal transmitted to the light emitting chip group #b including the light emitting chip Ub1 is not changed, the light emitting chip Ub1 holds the initial state.

(4) Time d

At the time d, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

Light Emitting Chip Ua1

Then, the write signal line 74 is shifted from "H" to "L" through the current limiting resistance Rw. The write thyristor S1 with the threshold voltage being −1.7 V is turned on. Since the threshold voltage of the write thyristors S with the number of 3 or larger is −4.8 V, the write thyristors S are not turned on.

Then, if the write thyristor S1 is turned on, the second gate Gss becomes −1.5 V. Then, the write transistor Qs1 is shifted from the off state to the on state. Then, the collector C of the write transistor Qs1 becomes −0.2 V. Further, the cathode (write signal line 74) of the write transistor Qs1 becomes −1.8 V.

Since the first gate Glf of the light emitting thyristor L1 is connected with the collector C of the write transistor Qs1, the first gate Glf becomes −0.2 V, and the threshold voltage thereof becomes −1.7 V.

The light-on signal line 75 connected with the cathode of the light emitting thyristor L1 is "L" (−3.3 V) at the time c. Hence, the light emitting thyristor L1 is turned on and lit.

Then, the first gate Glf of the light emitting thyristor L1 becomes −0.2 V, and the cathode (light-on signal line 75) thereof becomes −1.73 V as described above. The current IL1 (19 mA) flows to the light emitting thyristor L1 (i2 of |ILa| in FIG. 12).

At this time, since the threshold voltage of the diversion thyristor DT and the light emitting thyristors L of the number of 3 or larger is −4.8 V, the light emitting thyristors L are not turned on.

Since the first gate Grf of the light-off thyristor RT is connected with the light-on signal line 75 of −1.73 V, the threshold voltage thereof becomes −3.23 V.

Immediately after the time d, the transfer thyristor T1, the coupling transistor Qt1, the write thyristor S1, and the write transistor Qs1 are in the on state, and the light emitting thyristor L1 is in the on state and is lit.

Light Emitting Chip Ub1

When the write signal φW1 is shifted from "H" to "L," the write signal line 74 is shifted from "H" to "L." However, the threshold voltage of the write thyristors S is −4.8 V. Hence, the write thyristors S are not turned on.

(5) Time e

At the time e, the write signal φW1, which is transmitted to the light emitting chip pair #1 including the light emitting chip Ua1 of the light emitting chip group #a and the light emitting chip Ub1 of the light emitting chip group #b, is shifted from "L" (−3.3 V) to "H" (0 V).

Light Emitting Chip Ua1

Then, the write signal line 74 is shifted from −1.8 V to "H" (0 V). Since both the cathode and anode of the write thyristor S1 in the on state become "H," the write thyristor S1 is turned off. Then, the second gate Gss of the write thyristor S1 becomes "H." Since the base of the write transistor Qs1 is connected with the second gate Gss, the write transistor Qs1 is shifted from the on state to the off state.

Since the light-on signal line 75 holds −1.73 V (sustaining voltage), the light emitting thyristor L1 in the on state holds the on state.

Immediately after the time e, the transfer thyristor T1 and the coupling transistor Qt1 are in the on state, and the light emitting thyristor L1 is in the on state and is lit.

Light Emitting Chip Ub1

When the write signal φW1 is shifted from "L" to "H," the write signal line 74 in "L" is shifted to "H."

(6) Time f

At the time f, the second transfer signal φ2a, which is transmitted to the light emitting chip group #a, is shifted from "H" (0 V) to "L" (−3.3 V). Also, the first transfer signal φ1b, which is transmitted to the light emitting chip group #b, is shifted from "H" (0 V) to "L" (−3.3 V).

Light Emitting Chip Ua1

Then, the second transfer signal line 73 is shifted from "H" to "L" (−3.3 V), and the transfer thyristor T2 with the threshold voltage being −2.22 V is turned on. However, since the threshold voltage of the even-numbered transfer thyristors T with the number of 4 or larger is −4.8 V, the transfer thyristors T are not turned on.

If the transfer thyristor T2 is turned on, the cathode of the transfer thyristor T2 (second transfer signal line 73 in FIG. 11) becomes −1.8 V similarly to the situation when the transfer thyristor T1 is turned on at the time b.

If the transfer thyristor T2 becomes the on state, the coupling transistor Qt2 is shifted from the off state to the on state, and the collector C of the coupling transistor Qt2 becomes −0.2 V.

Then, the first gate Gtf of the transfer thyristor T3 connected with the collector C becomes −0.72 V, and the threshold voltage thereof becomes −2.22 V.

Since the light-on signal line 75 holds −1.73 V (sustaining voltage), the light emitting thyristor L1 in the on state holds the on state.

Immediately after the time f, the transfer thyristors T1 and T2, and the coupling transistors Qt1 and Qt2 are in the on state, and the light emitting thyristor L1 is in the on state and is lit.

Light Emitting Chip Ub1

The operation is similar to the operation of the light emitting chip Ua1 at the time b, and hence the description is omitted.

The light emitting chip Ub1 is operated similarly to the operation of the light emitting chip Ua1 at a timing shifted to the downstream side by ½ of the period T (relationship in which the phase is shifted by 180°).

(7) Time g

At the time g, the first transfer signal φ1a, which is transmitted to the light emitting chip group #a, is shifted from "L" (−3.3 V) to "H" (0 V).

Light Emitting Chip Ua1

Then, the first transfer signal line 72 is shifted from −1.8 V to "H" (0 V). Since both the cathode and anode of the transfer thyristor T1 in the on state become "H," the transfer thyristor T1 is turned off. Accordingly, the coupling transistor Qt1 is shifted from the on state to the off state. Hence, the first gate Gsf of the write thyristor S1 becomes "L" (−3.3 V) of the power line 71 connected with the first gate Gsf through the resistance Rm, and the threshold voltage thereof becomes −4.8 V. That is, the threshold voltage of all the write thyristors S becomes −4.8 V.

Further, the first gate Glf of the light emitting thyristor L1 becomes "L" (−3.3 V) of the power line 71 connected with the first gate Glf through the resistance Rn, and the threshold voltage thereof becomes −4.8 V.

However, since the light-on signal line 75 holds −1.73 V (sustaining voltage), the light emitting thyristor L1 in the on state holds the on state.

Immediately after the time g, the transfer thyristor T2 and the coupling transistor Qt2 are in the on state, and the light emitting thyristor L1 is in the on state and is lit.

Light Emitting Chip Ub1

Since the signal transmitted to the light emitting chip group #b including the light emitting chip Ub1 is not changed, the light emitting chip Ub1 holds the state at the time f.

(8) Time h

At the time h, the light-off signal φRb which is transmitted to the light emitting chip group #b is shifted from "L" (−3.3 V) to "H" (0 V).

Light Emitting Chip Ua1

Since the signal transmitted to the light emitting chip group #a including the light emitting chip Ua1 is not changed, the light emitting chip Ua1 holds the state at the time g.

Light Emitting Chip Ub1

The operation is similar to the operation of the light emitting chip Ua1 at the time c, and hence the description is omitted.

(9) Time i

At the time i, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

Light Emitting Chip Ua1

Then, the write signal line 74 is shifted from "H" to "L." However, since the threshold voltage of the write thyristors S is −4.8 V, the write thyristors S are not turned on.

This is because the write thyristors S are not connected with the transfer thyristor T2 in the on state.

Immediately after the time i, the transfer thyristor T2 and the coupling transistor Qt2 are in the on state, and the light emitting thyristor L1 is in the on state and is lit.

Light Emitting Chip Ub1

The operation is similar to the operation of the light emitting chip Ua1 at the time d, and hence the description is omitted.

(10) Time j

At the time j, the write signal φW1, which is transmitted to the light emitting chip pair #1 including the light emitting chip Ua1 of the light emitting chip group #a and the light emitting chip Ub1 of the light emitting chip group #b, is shifted from "L" (−3.3 V) to "H" (0 V).

Light Emitting Chip Ua1

Then, the write signal line 74 is shifted from "L" to "H."

Immediately after the time j, the transfer thyristor T2 and the coupling transistor Qt2 are in the on state, and the light emitting thyristor L1 is in the on state and is lit.

Light Emitting Chip Ub1

The operation is similar to the operation of the light emitting chip Ua1 at the time e, and hence the description is omitted.

(11) Time k

At the time k, the light-off signal φRa, which is transmitted to the light emitting chip group #a, is shifted from "H" (0 V) to "L" (−3.3 V).

Light Emitting Chip Ua1

Then, the light-off signal line 76 is shifted from "H" (0 V) to "L" (−3.3 V) through the current limiting resistance Rr. Since the threshold voltage of the light-off thyristor RT is −3.23 V, the light-off thyristor RT is turned on. The first gate Grf of the light-off thyristor RT becomes −0.2 V, and hence causes the light-on signal line 75 connected with the first gate Grf to be −0.2 V.

Then, since the potential between the anode and cathode of the light emitting thyristor L1 in the on state becomes −0.2 V, which is smaller than the sustaining voltage (−1.73 V) on the absolute value basis, the light emitting thyristor L1 is turned off and unlit (light-off).

That is, the light emitting thyristor L1 of the light emitting chip Ua1 is lit (turned on) at the timing at which the write signal φW1 at the time d is shifted from "H" to "L" at the time d, and is unlit (turned off) at the timing at which the light-off signal φRa is shifted from "H" to "L" at the time k. The period from the time d to the time k corresponds to the light-on (light emitting) period of the light emitting thyristor L1 of the light emitting chip Ua1.

In the light-on period of the light emitting thyristor L1 from the time d to the time k, the current ILa flowing to the light emitting thyristor L1 is i2 (19 mA) on the absolute value basis, and is the high exposure-amount mode.

Immediately after the time k, the transfer thyristor T2, the coupling transistor Qt2, and the light-off thyristor RT are in the on state.

Light Emitting Chip Ub1

Since the signal transmitted to the light emitting chip group #b including the light emitting chip Ub1 is not changed, the light emitting chip Ub1 holds the state at the time j.

(12) Time l

At the time l, the first transfer signal φ1a, which is transmitted to the light emitting chip group #a, is shifted from "H" (0 V) to "L" (−3.3 V). Also, the second transfer signal φ2b, which is transmitted to the light emitting chip group #b, is shifted from "H" (0 V) to "L" (−3.3 V).

Light Emitting Chip Ua1

Then, the first transfer signal line 72 is shifted from "H" to "L." Then, the transfer thyristor T3 with the threshold voltage being −2.22 V, is turned on. However, since the threshold voltage of the odd-numbered transfer thyristors T with the number of 5 or larger is −4.8 V, the transfer thyristors T are not shifted to the on state. Also, the transfer thyristor T1 is in the off state, the first gate Gtf of the transfer thyristor T1 is connected with the φ2 terminal of "L" (−3.3 V) through the start resistance Rs, and the first gate Gtf is connected with the power line 71 of "L" (−3.3 V) through the resistance Rg. Hence, the threshold voltage of the transfer thyristor T1 is −4.8 V and is not turned on.

Then, the coupling transistor Qt3 is shifted from the off state to the on state. Accordingly, the first collector Cf and the second collector Cs of the coupling transistor Qt3 become −0.2 V.

Then, the first gate Gtf of the transfer thyristor T4 becomes −0.72 V, and the threshold voltage thereof becomes −2.22 V similarly to the transfer thyristor T2 at the time b.

In contrast, the first gate Gsf of the write thyristor S3 connected with the first collector Cf becomes −0.2 V, and the threshold voltage thereof becomes −1.7 V.

Immediately after the time l, the transfer thyristors T2 and T3, the coupling transistors Qt2 and Qt3, and the light-off thyristor RT are in the on state.

Light Emitting Chip Ub1

The operation is similar to the operation of the light emitting chip Ua1 at the time f, and hence the description is omitted.

(13) Time m

At the time m, the second transfer signal φ2a, which is transmitted to the light emitting chip group #a, is shifted from "L" (−3.3 V) to "H" (0 V). Also, the first transfer signal φ1b, which is transmitted to the light emitting chip group #b, is shifted from "L" (−3.3 V) to "H" (0 V).

Light Emitting Chip Ua1

Then, the second transfer signal line 73 is shifted from "L" to "H." Since both the cathode and anode of the transfer thyristor T2 in the on state become "H," the transfer thyristor T2 is turned off. Accordingly, the coupling transistor Qt2 is shifted from the on state to the off state.

Immediately after the time m, the transfer thyristor T3, the coupling transistor Qt3, and the light-off thyristor RT are in the on state.

Light Emitting Chip Ub1

The operation is similar to the operation of the light emitting chip Ua1 at the time g, and hence the description is omitted.

(14) Time n

At the time n, the light-off signal φRa, which is transmitted to the light emitting chip group #a, is shifted from "L" (−3.3 V) to "H" (0 V).

Light Emitting Chip Ua1

Then, the light-off signal line 76 is shifted from the potential of the cathode of the light-off thyristor RT in the on state to "H" (0 V). Since both the cathode and anode of the light-off thyristor RT are "H," the light-off thyristor RT is turned off. The light-on signal line 75 is shifted from −0.2 V of the first gate Grf of the light-off thyristor RT in the on state to "L" (−3.3 V) of the power line 71.

Immediately after the time n, the transfer thyristor T3 and the coupling transistor Qt3 are in the on state.

Light Emitting Chip Ub1

Since the signal transmitted to the light emitting chip group #b including the light emitting chip Ub1 is not changed, the light emitting chip Ub1 holds the state at the time m.

In the above description, the period Ta(1) for control of the light emitting thyristor L1 in the light emitting chip Ua1 of the light emitting chip group #a is described.

In this period, the diversion thyristor DT is set in the high exposure-amount mode in the off state. Hence, the current ILa flowing to the light emitting thyristor L1 in the on state is i2 (19 mA) on the absolute value basis.

In the period Ta(2) from the time n to the time p, the period Ta(1) is repeated.

Also, the light emitting chip Ub1 is operated similarly to the operation of the light emitting chip Ua1 at a timing shifted by ½ of the period T.

Hence, the description for the period from the time n to the time p is omitted, and the time p and later is described.

(15) Time p

At the time p, the light-off signal φRa, which is transmitted to the light emitting chip group #a, is shifted from "L" (−3.3 V) to "H" (0 V).

Light Emitting Chip Ua1

The operation is similar to the operation at the time c, and hence the description is omitted. The light-off signal φRa is "H" and the light-off thyristor RT is in the off state. Accordingly, the light-on signal line 75 is "L" (−3.3 V).

Immediately after the time p, the transfer thyristor T5 and the coupling transistor Qt5 are in the on state.

Light Emitting Chip Ub1

The operation is similar to the operation at the time n, and hence the description is omitted. In the immediately earlier period from the time o to the time p, since the write signal φW1 is not "L," the light emitting thyristor L3 is not turned on.

(16) Time q

At the time q, the diversion signal φDa, which is transmitted to the light emitting chip group #a, is shifted from "L" (−3.3 V) to "H" (0 V).

Light Emitting Chip Ua1

Then, the diversion signal line 77 is shifted from "L" to "H" through the current limiting resistance Rd. Since the first gate Gdf of the diversion thyristor DT is connected with the diversion signal line 77, the first gate Gdf is changed from "L" (−3.3 V) to "H" (0 V), and the threshold voltage is changed from −4.8 V to −1.5 V. Then, since the light-on signal line 75 connected with the cathode of the diversion thyristor DT is "L" (−3.3 V), the diversion thyristor DT is turned on. Then, the cathode (light-on signal line 75) of the diversion thyristor DT becomes −1.73 V.

Then, the current IDa flowing through the diversion thyristor DT becomes i4 (19 mA) on the absolute value basis.

Since the first gate Grf of the light-off thyristor RT becomes −1.73 V, the threshold voltage thereof becomes −3.23 V.

Immediately after the time q, the transfer thyristor T5, the coupling transistor Qt5, and the diversion thyristor DT are in the on state.

Light Emitting Chip Ub1

Since the signal transmitted to the light emitting chip group #b including the light emitting chip Ub1 is not changed, the light emitting chip Ub1 holds the state at the time p.

(17) Time r

At a time r, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

Light Emitting Chip Ua1

The operation is similar to the operation at the time d. That is, the write thyristor S5 is turned on, and the write transistor Qs5 is shifted from the off state to the on state. Accordingly, the threshold voltage of the light emitting thyristor L5 becomes −1.7 V.

At this time, since the diversion thyristor DT is in the on state, the light-on signal line 75 becomes −1.73 V. However, the potential of the light-on signal line 75 (−1.73 V) is lower than the threshold voltage of the light emitting thyristor L5 (−1.7 V). Thus, the light emitting thyristor L5 is turned on.

That is, the diversion thyristor DT and the light emitting thyristor L5 become the on state in parallel.

Then, since the light-on signal line 75 is in the on state while the diversion thyristor DT and the light emitting thyristor L5 are in the on state in parallel, the light-on signal line 75 becomes −1.63 V.

With the potential of the light-on signal line 75 of −1.63 V, the other light emitting thyristor L are not turned on even if the threshold voltage of the other light emitting thyristor L becomes −1.7 V. By setting the threshold voltage in this way, the diversion thyristor DT and a single light emitting thyristor L are allowed to be simultaneously in the on state, and the other light emitting thyristor L is inhibited from becoming the on state in parallel.

Then, the current ILa flowing through the light emitting thyristor L5 becomes i1 (11 mA) on the absolute value basis. Similarly, the current IDa flowing through the diversion thyristor DT becomes i3 (11 mA) on the absolute value basis. That is, the light emitting thyristor L5 is lit in the low exposure-amount mode.

Since the first gate Grf of the light-off thyristor RT becomes −1.63 V, the threshold voltage thereof becomes −3.13 V.

Immediately after the time r, the transfer thyristor T5, the coupling transistor Qt5, the write thyristor S5, the write transistor Qs5, and the diversion thyristor DT are in the on state, and the light emitting thyristor L5 is in the on state and is lit.

Light Emitting Chip Ub1

The operation is similar to the operation of the light emitting chip Ua1 at the time d, and hence the description is omitted.

(18) Time s

At a time s, the write signal φW1, which is transmitted to the light emitting chip pair #1 including the light emitting chip Ua1 of the light emitting chip group #a and the light emitting chip Ub1 of the light emitting chip group #b, is shifted from "L" (−3.3 V) to "H" (0 V).

Light Emitting Chip Ua1

The operation is similar to the operation at the time d except that the diversion thyristor DT is in the on state, and hence the description is omitted.

Immediately after the time s, the transfer thyristor T5, the coupling transistor Qt5, and the diversion thyristor DT are in the on state and the light emitting thyristor L5 is in the on state and is lit.

Light Emitting Chip Ub1

The operation is similar to the operation at the time e, and hence the description is omitted.

(19) Time t

At the time t, the light-off signal φRb, which is transmitted to the light emitting chip group #b, is shifted from "L" (−3.3 V) to "H" (0 V).

Light Emitting Chip Ua1

Since the signal, which is transmitted to the light emitting chip group #a including the light emitting chip Ua1, is not changed, the light emitting chip Ua1 holds the state at the time s.

Light Emitting Chip Ub1

The operation is similar to the operation of the light emitting chip Ua1 at the time n, and hence the description is omitted.

(20) Time u

At the time u, the diversion signal φDb transmitted to the light emitting chip group #b is shifted from "L" (−3.3 V) to "H" (0 V).

Light Emitting Chip Ua1

Since the signal, which is transmitted to the light emitting chip group #a including the light emitting chip Ua1, is not changed, the light emitting chip Ua1 holds the state at the time s.

Light Emitting Chip Ub1

The operation is similar to the operation of the light emitting chip Ua1 at the time q, and hence the description is omitted.

(21) Time v

At a time v, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

Light Emitting Chip Ua1

The operation is similar to the operation at the time i except that the diversion thyristor DT is in the on state.

Immediately after the time v, the transfer thyristor T5, the coupling transistor Qt5, the write thyristor S5, the write transistor Qs5, and the diversion thyristor DT are in the on state, and the light emitting thyristor L5 is in the on state and is lit.

Light Emitting Chip Ub1

The operation is similar to the operation of the light emitting chip Ua1 at the time r, and hence the description is omitted.

(22) Time w

At a time w, the light-off signal φRa, which is transmitted to the light emitting chip group #a, is shifted from "H" (0 V) to "L" (−3.3 V).

Light Emitting Chip Ua1

The operation is similar to the operation at the time k except that the diversion thyristor DT is in the on state.

That is, the light-off signal line 76 is shifted from "H" (0 V) to "L" (−3.3 V). Since the threshold voltage of the light-off thyristor RT is −3.13 V, the light-off thyristor RT is turned on. The first gate Grf of the light-off thyristor RT becomes −0.2 V, and hence causes the light-on signal line 75 connected with the first gate Grf to be −0.2 V.

Then, since the potentials between the anodes and cathodes of the light emitting thyristor L1 and the diversion thyristor DT in the on state become −0.2 V, which is smaller than the sustaining voltage (−1.63 V) on the absolute value basis, the light emitting thyristor L5 and the diversion thyristor DT are turned off. The light emitting thyristor L5 is unlit (light-off).

That is, both the current ILa flowing through the light emitting thyristor L5 and the current IDa flowing through the diversion thyristor DT become 0.

Since the diversion signal φDa is "H", the threshold voltage of the diversion thyristor DT is −1.5 V.

In the light-on period of the light emitting thyristor L5 from the time r to the time w, the current ILa flowing to the light emitting thyristor L1 is i1 (11 mA) on the absolute value basis, and is the low exposure-amount mode.

Immediately after the time w, the transfer thyristor T6, the coupling transistor Qt6, and the light-off thyristor RT are in the on state.

Light Emitting Chip Ub1

The signal, which is transmitted to the light emitting chip group #b including the light emitting chip Ub1, is not changed.

(23) Time x

At the time x, the light-off signal φRa, which is transmitted to the light emitting chip group #a, is shifted from "L" (−3.3 V) to "H" (0 V).

Light Emitting Chip Ua1

The operation is similar to the operation at the time c or the time n except that the threshold voltage of the diversion thyristor DT is −1.5 V. That is, the light-off thyristor RT is turned off. Then, the light-on signal line 75 attempts to make shift to the power potential Vga of the power line 71 ("L" (−3.3 V)).

Then, since the threshold voltage of the diversion thyristor DT, the cathode of which is connected with the light-on signal line 75, is −1.5 V, the diversion thyristor DT is turned on. The light-on signal line 75 becomes −1.73 V. Then, the current IDa flowing through the diversion thyristor DT becomes i4 (19 mA) on the absolute value basis.

Immediately after the time w, the transfer thyristor T7, the coupling transistor Qt7, and the diversion thyristor DT are in the on state.

Light Emitting Chip Ub1

The signal, which is transmitted to the light emitting chip group #b including the light emitting chip Ub1, is not changed.

(24) Time y

At the time y, the light-off signal φRb transmitted to the light emitting chip group #b is shifted from "L" (−3.3 V) to "H" (0 V).

Light Emitting Chip Ua1

The signal, which is transmitted to the light emitting chip group #a including the light emitting chip Ua1, is not changed.

Immediately after the time y, the transfer thyristor T8, the coupling transistor Qt8, and the diversion thyristor DT are in the on state.

Light Emitting Chip Ub1

The operation is similar to the operation of the light emitting chip Ua1 at the time x, and hence the description is omitted.

(25) Time z

At the time z, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

Light Emitting Chip Ua1

The operation is similar to the operation at the time i except for that the diversion thyristor DT is in the on state. That is, since the threshold voltage of the write thyristor S is −4.8 V, the write thyristor S is not turned on even if the write signal φW1 becomes "L" (−3.3 V).

Immediately after the time z, the transfer thyristor T8, the coupling transistor Qt8, and the diversion thyristor DT are in the on state.

Light Emitting Chip Ub1

The operation is similar to the operation of the light emitting chip Ua1 at the time v, and hence the description is omitted.

(26) Time aa

At the time aa, the light-off signal φRa, which is transmitted to the light emitting chip group #a, is shifted from "H" (0 V) to "L" (−3.3 V).

Light Emitting Chip Ua1

The operation is similar to the operation at the time v except that the light emitting thyristor L7 is in the off state.

That is, the light-off signal line 76 is shifted from "H" (0 V) to "L" (−3.3 V). In this case, the light-off thyristor RT is turned on, and the first gate Grf becomes −0.2 V. Then, the light-on signal line 75 connected with the first gate Grf becomes −0.2 V.

Then, since the potential between the anode and cathode of the diversion thyristor DT in the on state becomes −0.2 V, which is smaller than the sustaining voltage (−1.73 V) on the absolute value basis, the diversion thyristor DT is turned off.

That is, the current IDa flowing through the diversion thyristor DT becomes 0.

In a period between the time x and the time aa, the current IDa flowing through the diversion thyristor DT becomes i4 (19 mA) on the absolute value basis.

Since the diversion signal φDa is "H", the threshold voltage of the diversion thyristor DT holds −1.5 V.

Immediately after the time aa, the transfer thyristor T8, the coupling transistor Qt8, and the light-off thyristor RT are in the on state.

Light Emitting Chip Ub1

The signal, which is transmitted to the light emitting chip group #b including the light emitting chip Ub1, is not changed.

(27) Time bb

The light-off signal φRa, which is transmitted to the light emitting chip group #a, is shifted from "L" (−3.3 V) to "H" (0 V).

Light Emitting Chip Ua1

Thereafter, the period Ta is repeated.

Light Emitting Chip Ua1

Also, the period Tb is shifted from the period Ta by ½ of the period T. Hence, the period Tb is repeated even for the light emitting chip group #b.

While the above description is focused on the light emitting chip group #a, the light emitting chip group #b is operated similarly to the light emitting chip group #a.

By switching the diversion thyristor DT between the on state and the off state by using the diversion signals φDa and φDb, the current ILa and the current ILb flowing to the light emitting thyristors L are controlled, and hence the mode is switched between the high exposure-amount mode and the low exposure-amount mode.

The situation in which the diversion signals φDa and φDb are "H" allows the diversion thyristor DT to be in the on state.

Further, as described above, the threshold voltage of the transfer thyristor T, the first gate Gtf of which is connected with the collector C or the second collector Cs of the coupling transistor Qt in the on state, becomes −2.22 V. That is, there is a margin of 1.08 V on the absolute value basis with respect to the first transfer signal φ1 and the second transfer signal φ2 being "L" (−3.3 V).

In contrast, in the first exemplary embodiment, the transfer thyristor T connected with the gate Gt of the transfer thyristor T in the on state through a diode has a threshold voltage of −3.2 V. That is, there is a margin of only 0.1 V on the absolute value basis with respect to the first transfer signal φ1 and the second transfer signal φ2 being "L" (−3.3 V).

Third Exemplary Embodiment

In the second exemplary embodiment, the current IDa of i4 (19 mA) on the absolute value basis flows to the diversion thyristor DT because the diversion thyristor DT becomes the on state in the period from the time q to the time r and in the period from the time x to the time aa in FIG. 12. In the periods, the light emitting thyristor L is not in the on state.

The diversion thyristor DT diverts the current flowing to the light emitting thyristor L, and controls the light quantity of the light emitting thyristor L. Hence, the current IDa and IDb may desirably flow to the diversion thyristor DT if the light emitting thyristor L is in the on state.

Owing to this, in the third exemplary embodiment, a diversion control thyristor ET and a diversion control transistor Qe are provided at the light emitting chip U.

An image forming apparatus 1 and a print head 14 to which the third exemplary embodiment is applied are similar to the image forming apparatus 1 and the print head 14 shown in FIGS. 1 and 2 according to the first exemplary embodiment. Also, configurations of a light emitting device 65 and a light emitting chip U, a configuration of a signal generating circuit 110 of the light emitting device 65, and a wiring configuration on a circuit board 62 to which the third exemplary embodiment is applied are similar to the configurations of the light emitting device 65 and the light emitting chip U, the configuration of the signal generating circuit 110 of the light emitting device 65, and the wiring configuration on the circuit board 62 shown in FIGS. 8, 9A, 9B, and 10 in the second exemplary embodiment. Hereinafter, description is started from the light emitting chip U.

Light Emitting Chip U

Figure 13:
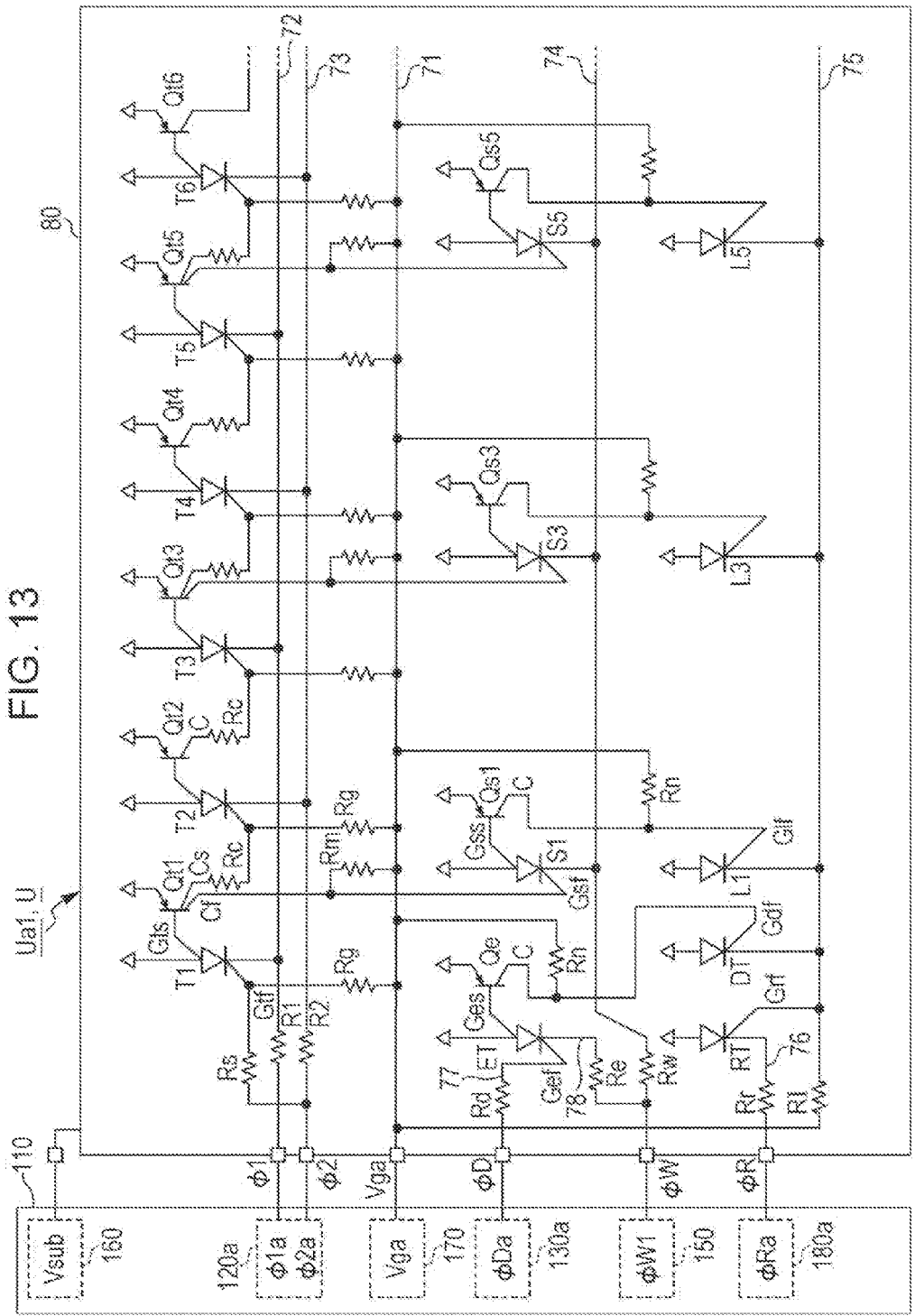
FIG. 13 is an equivalent circuit diagram explaining a circuit configuration of a light emitting chip with a self-scanning light emitting device (SLED) array mounted to which a third exemplary embodiment is applied.

FIG. 13 is an equivalent circuit diagram explaining the circuit configuration of the light emitting chip U with a self-scanning light emitting device (SLED) array mounted to which the third exemplary embodiment is applied.

A diversion control thyristor ET, a diversion control transistor Qe, and a current limiting resistance Re are provided additionally to the equivalent circuit of the light emitting chip U in FIG. 11 to which the second exemplary embodiment is applied. Also, part of wiring is changed.

The diversion control thyristor ET is a semiconductor element having an anode, a first gate, a second gate, and a cathode, similarly to the light emitting thyristor L, and has a structure similar to the light emitting thyristor L. The diversion control transistor Qe is a semiconductor element having an emitter, a base, and a collector, similarly to the coupling transistor Qt, and has a structure similar to the coupling transistor Qt.

In the following description, different part is described, the same reference sign is applied to similar part, and the description is omitted.

The connection relationship between the diversion control thyristor ET and the diversion control transistor Qe is described.

The reference potential Vsub ("H" (0 V)) is supplied to the anode of the diversion control thyristor ET and the emitter of the diversion control transistor Qe through the Vsub terminal provided on the back surface of the substrate 80.

The cathode of the diversion control thyristor ET is connected with a diversion control signal line 78. The diversion control signal line 78 is connected with the φW terminal through the current limiting resistance Re.

A first gate Gef of the diversion control thyristor ET is connected with the diversion signal line 77. The diversion signal line 77 is connected with the φD terminal through the current limiting resistance Rd. A second gate Ges of the diversion control thyristor ET is connected with the base of the diversion control transistor Qe.

A collector C of the diversion control transistor Qe is connected with the first gate Gdf of the diversion thyristor DT, and is connected with the power line 71 with the power potential Vga ("L" (−3.3 V)) through a resistance Rn.

Also in the third exemplary embodiment, it is assumed that the reference potential Vsub is "H" (0 V) and the power potential Vga is "L" (−3.3 V). Also, it is assumed that signals (first transfer signals φ1a and φ1b, second transfer signals φ2a and φ2b, diversion signals φDa and φDb, light-off signals φRa and φRb, write signals φW1-φW20) each have potentials of "H" (0 V) and "L" (−3.3 V). In the following description, expressions of "H" (0 V) or "H," and "L" (−3.3 V) or "L" are used.

Also in the third exemplary embodiment, for example, the current limiting resistances R1 and R2, and the resistance Rg are 300 Ω, 300 Ω, and 10 kΩ, respectively, similarly to the first exemplary embodiment. The internal resistance rt of the transfer thyristor T in the on state is 60Ω similarly to the first exemplary embodiment. Hence, the first transfer signal line 72 and the second transfer signal line 73 become −1.8 V if a single transfer thyristor T connected with each of the first transfer signal line 72 and the second transfer signal line 73 is in the on state.

Also, it is assumed that the current limiting resistance Rw, and the internal resistance rs of the write thyristor S in the on state are 300 Ω and 60 Ω, respectively. Accordingly, if a single write thyristor S is in the on state, the write signal line 74 becomes −1.8 V.

Also, it is assumed that the current limiting resistance Rr, and the internal resistance rr of the light-off thyristor RT in the on state are 300 Ω and 60 Ω, respectively. Hence, if the light-off thyristor RT is in the on state, the light-off signal line 76 becomes −1.8 V.

Further, it is assumed that the current limiting resistance Re, and an internal resistance re of the diversion control thyristor ET in the on state are 300 Ω and 60 Ω, respectively. Hence, if the diversion control thyristor ET is in the on state, the diversion control signal line 78 becomes −1.8 V.

Further, it is assumed that the internal resistance rl of the light emitting thyristor L in the on state, the internal resistance rd of the diversion thyristor DT in the on state, and the current limiting resistance Rl are 12 Ω, 12 Ω, and 80 Ω, respectively. Accordingly, if a single light emitting thyristor L or the diversion thyristor DT is in the on state, the light-on signal line 75 becomes −1.73 V, and if both the single light emitting thyristor L and the diversion thyristor DT are in the on state, the light-on signal line 75 becomes −1.63 V. Also, if the single light emitting thyristor L is in the on state and if the diversion thyristor DT is in the off state, the current IL flowing to the light emitting thyristor L in the on state becomes 19 mA on the absolute value basis (i2 of |ILa| and i2 of |ILb| in FIG. 14, described later). Similarly, if the diversion thyristor DT is in the on state and all light emitting thyristors L are in the off state, the current ID flowing to the diversion thyristor DT in the on state becomes 19 mA (i4 of |IDa| and i4 of |IDb| in FIG. 14).

Figure 14:
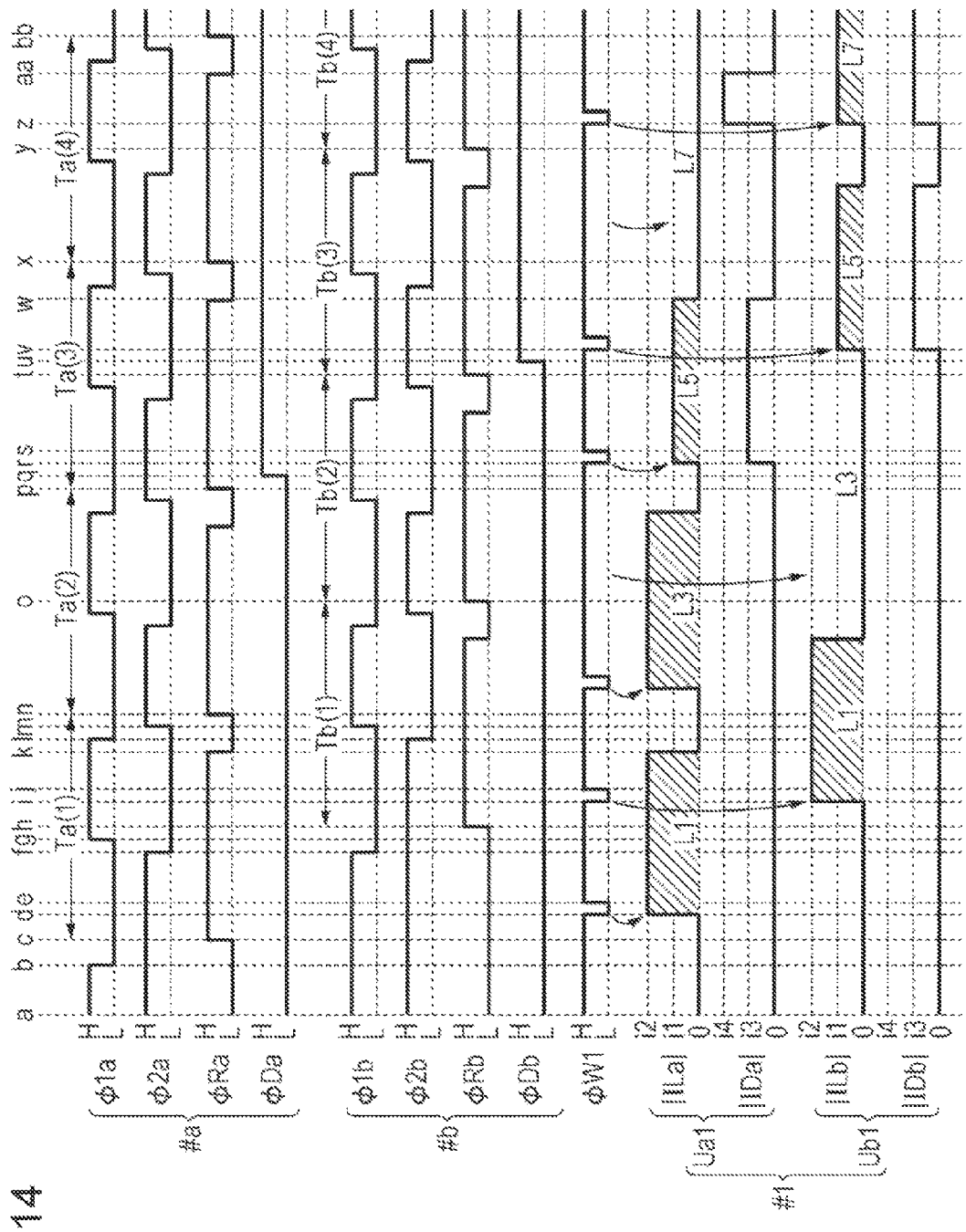
FIG. 14 is a timing chart explaining operations of light emitting chips to which the third exemplary embodiment is applied.

If both the single light emitting thyristor L and the diversion thyristor DT are in the on state, the current ID flowing to the light emitting thyristor L in the on state the current ID flowing to the diversion thyristor DT in the on state each become 11 mA (i1 of |ILa|, i1 of |ILb|, i3 of |IDa|, i3 of |IDb| in FIG. 14).

It is assumed that the start resistance Rs and the resistance Rc are 2 kΩ and 2 kΩ, respectively. Further, it is assumed that the current limiting resistance Rd, the resistance Rm, and the resistance Rn are 300 Ω, 10 kΩ, and 10 kΩ respectively.

Timing Chart

Next, operations of the diversion control thyristor ET, the diversion control transistor Qe, and the diversion thyristor DT are described with reference to a timing chart.

FIG. 14 is a timing chart explaining operations of light emitting chips U to which the third exemplary embodiment is applied. FIG. 14 explains the operations of the light emitting chip Ua1 and the light emitting chip Ub1 in the light emitting chip pair #1, similarly to FIG. 12 provided in the second exemplary embodiment.

The time axis and the light emitting thyristor L to be lit are set similarly to the second exemplary embodiment. Hence, part different from the second exemplary embodiment is described.

Also in the third exemplary embodiment, similarly to the second exemplary embodiment, the diversion signal φDa is "L" in a period from the time a to the time q, is shifted from "L" to "H" at the time q, and is held at "H" to the time z.

If the diversion signal φDa is "L," the diversion signal line 77 becomes "L" (−3.3 V) through the current limiting resistance Rd. Since the first gate Gef of the diversion control thyristor ET is connected with the diversion signal line 77, the threshold voltage becomes −4.8 V.

Hence, at the time d, the time i, etc., in FIG. 14, even if the write signal φW1 is shifted from "H" to "L" and the cathode of the diversion control thyristor ET becomes "L" (−3.3 V), the diversion control thyristor ET is not turned on.

If the diversion control thyristor ET is not turned on, the diversion control transistor Qe is not shifted from the off state to the on state. That is, if the diversion control thyristor ET is in the off state, the diversion control transistor Qe is also in the off state. Then, the first gate Gdf of the diversion thyristor DT becomes "L" (−3.3 V) of the power line 71 connected with the first gate Gdf through the resistance Rn, and the threshold voltage thereof becomes −4.8 V.

Hence, if the diversion signal φDa is "L," the state becomes the same as the period from the time a to the time p described in the second exemplary embodiment.

In contrast, if the diversion signal φDa is "H," the diversion signal line 77 becomes "H" (0 V) through the current limiting resistance Rd. Since the first gate Gef of the diversion control thyristor ET is connected with the diversion signal line 77, the threshold voltage becomes −1.5 V.

Then, at the time r in FIG. 14, if the write signal φW1 is shifted from "H" to "L," the diversion control signal line 78 becomes "L" (−3.3 V) through the φW terminal and the current limiting resistance Re. Then, since the threshold voltage of the diversion control thyristor ET is −1.5 V, the diversion control thyristor ET is turned on. Accordingly, the diversion control transistor Qe is shifted from the off state to the on state, and the collector C becomes −0.2 V.

Since the first gate Gdf of the diversion thyristor DT is connected with the collector C of the diversion control transistor Qe, the first gate Gdf becomes −0.2 V, and the threshold voltage thereof becomes −1.7 V.

At the time r, the light-off signal φRa is "H" and the light-off thyristor RT is in the off state. That is, the light-on signal line 75 is connected with the power line 71 of "L" (−3.3 V) through the current limiting resistance Rl. Hence, the diversion thyristor DT is turned on, and the light-on signal line 75 is set at −1.73 V.

At this time, as described according to the second exemplary embodiment, the threshold voltage of the light emitting thyristor L5 is −1.7 V. Thus, the light emitting thyristor L is also turned on.

That is, at the time r, the diversion thyristor DT and the light emitting thyristor L become the on state in parallel, similarly to the second exemplary embodiment.

As described above, in the third exemplary embodiment, the diversion control thyristor ET is not turned on or the diversion thyristor DT is not turned on unless both the write signal φW1 and the diversion signal φDa become "L."

That is, the situation, in which the diversion thyristor DT becomes the on state and the current ID flowing through the diversion thyristor DT becomes i4 (19 mA) on the absolute value basis in the period from the time q to the time r in FIG. 12 according to the second exemplary embodiment, may be prevented. Further, the situation, in which the diversion thyristor DT becomes the on state and the current ID flowing through the diversion thyristor DT becomes i4 (19 mA) on the absolute value basis in the period from the time w to the time z in FIG. 12 according to the second exemplary embodiment, may be prevented.

Since the diversion control thyristor ET is in the on state in the period in which the write signal φW1 is "L" (for example, in the period from the time r to the time s in FIG. 14), the period of the on state is shorter than that of the diversion thyristor DT.

Described next is a case in which, at the time z, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

At the time z, in the light emitting chip Ua1, the first transfer signal φ1a is "H," the second transfer signal φ2a is "L," and the transfer thyristor T8 is in the on state. However, the transfer thyristor T8 is an even-numbered transfer thyristor T, and is not connected with the write thyristor S or the light emitting thyristor L.

In contrast, at the time y, in the light emitting chip Ub1, the first transfer signal φ1b is "L," the second transfer signal φ2b is "H," and the transfer thyristor T7 is in the on state. The transfer thyristor T7 is an odd-numbered transfer thyristor T, and is connected with the write thyristor S and the light emitting thyristor L.

That is, at the time z, the write signal φW1 is shifted from "H" to "L" to light the light emitting thyristor L7 of the light emitting chip Ub1 belonging to the light emitting chip group #b.

At the time z, the light emitting thyristor L7 of the light emitting chip Ua1 is in the off state, and is unlit. Hence, the diversion thyristor DT of the light emitting chip Ua1 may be desirably in the off state.

However, at the time z, since both the diversion signal φDa and the write signal φW1 are "L," in the light emitting chip Ua1, the diversion control thyristor ET is turned on and the diversion thyristor DT is turned on. Then, once the diversion thyristor DT becomes the on state, the diversion thyristor DT holds the on state until the time aa at which the light-off signal φRa is shifted from "H" to "L." In the period from the time z to the time aa, the current ID flowing through the diversion thyristor DT becomes i4 (19 mA) on the absolute value basis.

The diversion control thyristor ET of the light emitting chip Ua1 is in the on state in the period in which the write signal φW1 is "L."

Even at the time v in the period Ta(3), the write signal φW1 is shifted from "H" to "L" to light the light emitting thyristor L5 of the light emitting chip Ub1 belonging to the light emitting chip group #b. However, the diversion thyristor DT of the light emitting chip Ua1 already becomes the on state at the time r. Hence, even if the diversion control thyristor ET of the light emitting chip Ua1 is turned on at the time v, the state does not relate to the diversion thyristor DT.

The situation in which the diversion signals φDa and φDb are "H" does not cause the diversion thyristor DT to become the on state, but allows the diversion thyristor DT to become the on state.

Fourth Exemplary Embodiment

In the third exemplary embodiment, as described above, in the case in which the light emitting chips U are divided into the light emitting chip group #a and the light emitting chip group #b, for example, when the light emitting chip Ua of the light emitting chip group #a is unlit, if the write signal φW is set at "L" to light the light emitting chip Ub of the light emitting chip group #b, the diversion thyristor DT of the light emitting chip Ua of the light emitting chip group #a may become the on state. The current ID flowing to the diversion thyristor DT is not current, which flows for diversion of current flowing to the light emitting thyristor L.

This situation occurs because the diversion signal φDa is "L" when the write signal φW is shifted from "H" to "L" to light the light emitting chip Ub of the light emitting chip group #b.

Hence, in the fourth exemplary embodiment, the diversion signal φDa is set at "H" when the write signal φW is shifted from "H" to "L" to light the light emitting chip Ub of the light emitting chip group #b. Accordingly, the diversion thyristor DT is prevented from becoming the on state when the current flowing to the light emitting thyristor L is not diverted.

An image forming apparatus 1 and a print head 14 to which the fourth exemplary embodiment is applied are similar to the image forming apparatus 1 and the print head 14 shown in FIGS. 1 and 2 according to the first exemplary embodiment. Also, configurations of a light emitting device 65 and a light emitting chip U, a configuration of a signal generating circuit 110 of the light emitting device 65, and a wiring configuration on a circuit board 62 to which the fourth exemplary embodiment is applied are similar to the configurations of the light emitting device 65 and the light emitting chip U, the configuration of the signal generating circuit 110 of the light emitting device 65, and the wiring configuration on the circuit board 62 shown in FIGS. 8, 9A, 9B, and 10 in the second exemplary embodiment. Further, the light emitting chip U to which the forth exemplary embodiment is applied is the light emitting chip U shown in FIG. 13 according to the third exemplary embodiment. Therefore, in the following description, signals and a timing chart are described.

Timing Chart

Figure 15:
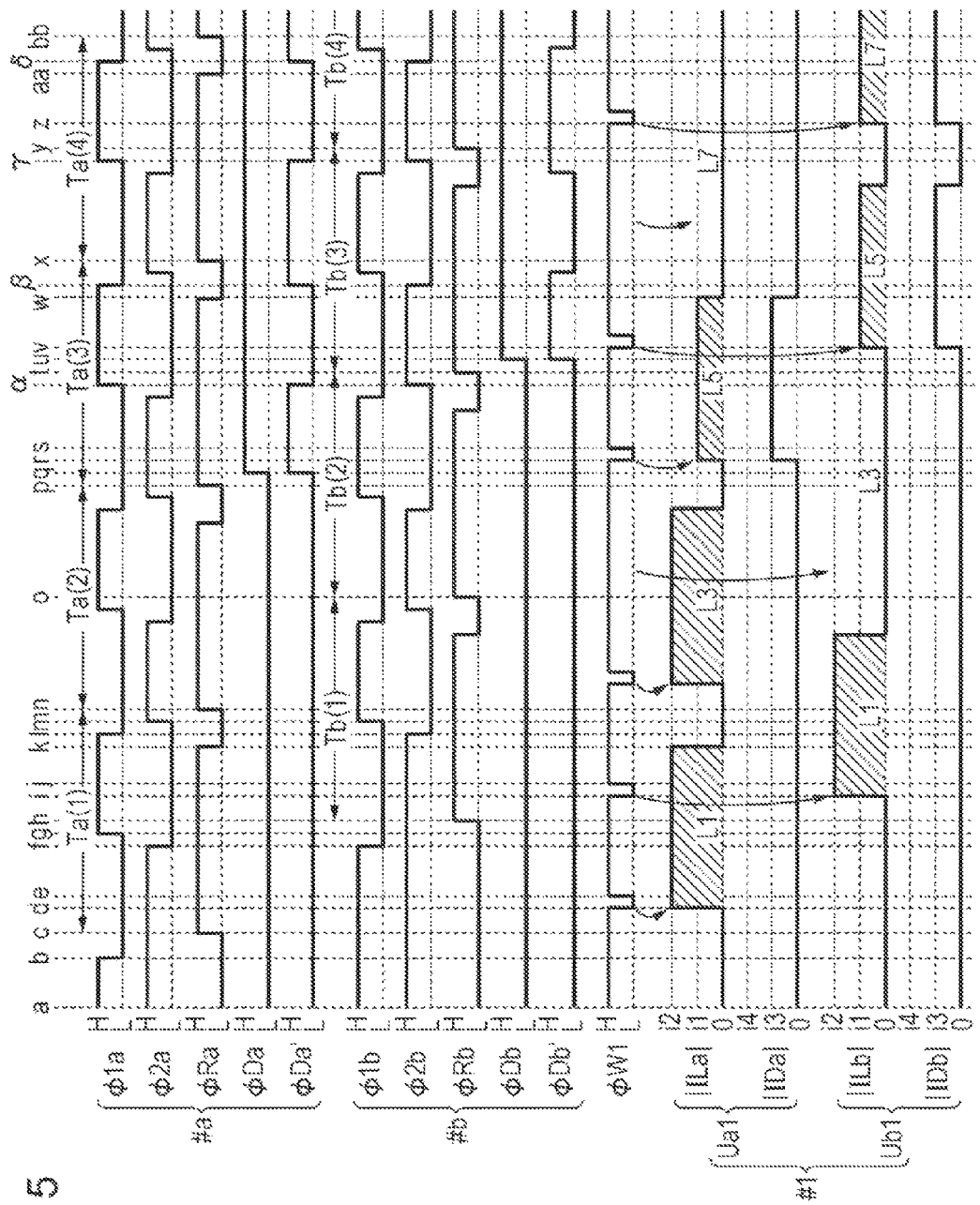
FIG. 15 is a timing chart explaining operations of light emitting chips to which a fourth exemplary embodiment is applied.

FIG. 15 is a timing chart explaining operations of light emitting chips U to which the fourth exemplary embodiment is applied. FIG. 15 explains the operations of the light emitting chip Ua1 and the light emitting chip Ub1 in the light emitting chip pair #1, similarly to FIG. 14 provided in the third exemplary embodiment.

The time axis and the light emitting thyristor L to be lit are set similarly to the third exemplary embodiment. Hence, part different from the second exemplary embodiment is described. A time α is provided between the time s and the time t, a time β is provided between the time w and the time x, a time γ is provided between the time x and the time y, and a time δ is provided between the time aa and the time bb.

In the fourth exemplary embodiment, the diversion signal generating unit 130a transmits a diversion signal φDa' to the light emitting chip group #a instead of the diversion signal φDa of the third exemplary embodiment, and the diversion signal generating unit 130b transmits a diversion signal φDb' to the light emitting chip group #b instead of the diversion signal φDb.

When "H" is assumed as "1" and "L" is assumed as "0," the diversion signal φDa' is a logical product (AND) of a signal, in which "H" and "L" of the first transfer signal φ1a is switched (negation of the first transfer signal φ1a, i.e., NOT (first transfer signal φ1a)) and the diversion signal φDa. Hence, at the time q at which the first transfer signal φ1a is "L," if the diversion signal φDa is shifted from "L" to "H," the diversion signal φDa' is shifted from "L" to "H." At the time α at which the diversion signal φDa is "H," if the first transfer signal φ1a is shifted from "L" to "H," the transfer signal φDa' is shifted from "H" to "L." At the time β at which the diversion signal φDa is "H," if the first transfer signal φ1a is shifted from "H" to "L," the transfer signal φDa' is shifted from "L" to "H." At the time γ at which the diversion signal φDa is "H," if the first transfer signal φ1a is shifted from "L" to "H," the transfer signal φDa' is shifted from "H" to "L." At the time δ at which the diversion signal φDa is "H," if the first transfer signal φ1a is shifted from "H" to "L," the transfer signal φDa' is shifted from "L" to "H."

Hence, at the time r at which the write signal φW1 is shifted from "H" to "L," since the diversion signal φDa' is "H," the diversion thyristor DT is turned on. However, at the time z at which the write signal φW1 is shifted from "H" to "L," since the diversion signal φDa' is "L," the diversion thyristor DT is not turned on. Hence, the situation, in which the diversion thyristor DT becomes the on state and the current ID of the diversion thyristor DT (i4 (19 mA) on the absolute value basis) flows in the period from the time z to the time aa in FIG. 14 according to the third exemplary embodiment, is prevented.

Similarly, the diversion signal φDb' is a logical product (AND) of a signal, in which "H" and "L" of the first transfer signal φ1b is switched (negation of the first transfer signal φ1b, i.e., NOT (first transfer signal φ1b)) and the diversion signal φDb.

The diversion signal φDb' operates similarly to the diversion signal φDa'.

The situation in which the diversion signals φDa' and φDb' are "H" do not cause the diversion thyristor DT to become the on state, but allows the diversion thyristor DT to become the on state.

In any of the first to fourth exemplary embodiments, the description is given such that the thyristors (transfer thyristor T, light emitting thyristor L, diversion thyristor DT, write thyristor S (second to fourth exemplary embodiments), light-off thyristor RT (second to fourth exemplary embodiments)) are anode-common in which the anodes are connected with the substrate 80, and the transistors (coupling transistor Qt (second to fourth exemplary embodiments), write transistor Qs (second to fourth exemplary embodiments)) are pnp bipolar transistors.

Alternatively, by changing the polarity of the circuit, the thyristors (transfer thyristor T, light emitting thyristor L, diversion thyristor DT, write thyristor S (second to fourth exemplary embodiments), light-off thyristor RT (second to fourth exemplary embodiments)) may be cathode-common in which the cathodes are connected with the substrate 80, and the transistors (coupling transistor Qt (second to fourth exemplary embodiments), write transistor Qs (second to fourth exemplary embodiments)) may be npn bipolar transistors.

Further, a three-terminal active element, such as a field-effect transistor (FET) may be used for a pnp bipolar transistor or an npn bipolar transistor.

Also, in any of the first to fourth exemplary embodiments, the transfer thyristor T is driven by the two-phase transfer signals of the first transfer signal φ1 and the second transfer signal φ2. However, transfer signals with three or more phases may be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting part comprising:
   a plurality of light emitting thyristors that each have an anode and a cathode and that are lit in the on state;
   a light-on signal line that is connected with the cathodes or the anodes of the plurality of light emitting thyristors and that supplies current, the current which causes the plurality of light emitting thyristors to be lit; and
   a diversion thyristor that has an anode and a cathode, the anode or the cathode which is connected with the light-on signal line, and that diverts current, the current which flows to a light emitting thyristor to be lit among the plurality of light emitting thyristors in the on state,
   wherein a potential of the light-on signal line may be set so that the diversion thyristor and at least one light emitting thyristor among the plurality of light emitting thyristors become the on state in parallel.

2. The light emitting part according to claim 1, wherein the potential of the light-on signal line is set by an internal resistance of each of the plurality of light emitting thyristors in the on state, an internal resistance of the diversion thyristor in the on state, and a current limiting resistance, the current limiting resistance which is connected in series with the light-on signal line, so that the potential of the light-on signal line when at least one light emitting thyristor among the plurality of light emitting thyristors is in the on state may cause the diversion thyristor to be shifted from the off state to the on state, and the potential of the light-on signal line when the diversion thyristor is in the on state may cause at least one light emitting thyristor among the plurality of thyristors to be shifted from the off state to the on state.

3. The light emitting part according to claim 1, further comprising a plurality of transfer thyristors that each designate a light emitting thyristor to be lit among the plurality of light emitting thyristors in the on state and that successively become the on state.

4. The light emitting part according to claim 3, further comprising a plurality of three-terminal active elements that are each provided to connect adjacent upstream and downstream transfer thyristors among the plurality of transfer thyristors, that each become the on state when the upstream transfer thyristor becomes the on state, and that each set a threshold voltage used when the downstream transfer thyristor is shifted from the off state to the on state.

5. The light emitting part according to claim 3, further comprising a plurality of write thyristors that are each provided between a transfer thyristor among the plurality of transfer thyristors and a light emitting thyristor among the plurality of light emitting thyristors designated by the transfer thyristor, that each become the on state in response to reception of a write signal, and that each allow the designated light emitting thyristor to be lit.

6. The light emitting part according to claim 5, further comprising a diversion control thyristor that has an anode, a cathode, and a gate, that is shifted from the off state to the one state when the gate receives a diversion signal, the diversion signal which allows the diversion thyristor to become the on state and when the cathode or the anode receives the write signal, and hence that controls the diversion thyristor to be shifted from the off state to the on state.

7. The light emitting part according to claim 1, further comprising a light-off thyristor that has an anode, a cathode, and a gate, the gate which is connected with the light-on signal line, that is shifted from the off state to the on state when the anode or the cathode receives a light-off signal, and that sets the potential of the light-on signal line so that the plurality of light emitting thyristors and the diversion thyristor become the off state.

8. A print head comprising:
   a light emitting unit including
      a plurality of light emitting thyristors that each have an anode and a cathode and that are lit in the on state,
      a light-on signal line that is connected with the cathodes or the anodes of the plurality of light emitting thyristors and that supplies current, the current which causes the plurality of light emitting thyristors to be lit, and
      a diversion thyristor that has an anode and a cathode, the anode or the cathode which is connected with the light-on signal line, and that diverts current, the current which flows to a light emitting thyristor to be lit among the plurality of light emitting thyristors in the on state,
      wherein a potential of the light-on signal line may be set so that the diversion thyristor and at least one light emitting thyristor among the plurality of light emitting thyristors become the on state in parallel; and
   an optical unit that forms an image of light emitted from the light emitting unit.

9. An image forming apparatus comprising:
   an image holding member;
   a charging unit that electrically charges the image holding member;
   an exposure unit that exposes the image holding member electrically charged by the charging unit, to light through an optical unit, the exposure unit including
      a light emitting unit having
         a plurality of light emitting thyristors that each have an anode and a cathode and that are lit in the on state,
         a light-on signal line that is connected with the cathodes or the anodes of the plurality of light emitting thyristors and that supplies current, the current which causes the plurality of light emitting thyristors to be lit, and
         a diversion thyristor that has an anode and a cathode, the anode or the cathode which is connected with the light-on signal line, and that diverts current, the current which flows to a light emitting thyristor to be lit among the plurality of light emitting thyristors in the on state,
         wherein a potential of the light-on signal line may be set so that the diversion thyristor and at least one light emitting thyristor among the plurality of light emitting thyristors become the on state in parallel;
   a developing unit that develops an electrostatic latent image formed on the image holding member exposed to the light by the exposure unit; and
   a transfer unit that transfers an image developed by the image holding member, on a transfer-target material.

10. The image forming apparatus according to claim 9, wherein the light emitting unit further includes a plurality of transfer thyristors that each designate a light emitting thyristor to be lit among the plurality of light emitting thyristors in the on state and that successively become the on state, and
   wherein the image forming apparatus further comprises a signal generating section that generates a transfer signal, the transfer signal which causes the plurality of transfer thyristors to successively become the on state, and that generates a diversion signal, the diversion signal which allows the diversion thyristor to become the on state in response to the transfer signal.

* * * * *